(12) United States Patent
Tanaka et al.

(10) Patent No.: US 8,398,725 B2
(45) Date of Patent: Mar. 19, 2013

(54) LIGHT EXPOSURE APPARATUS AND MANUFACTURING METHOD OF SEMICONDUCTOR DEVICE USING THE SAME

(75) Inventors: Koichiro Tanaka, Isehara (JP); Yoshiaki Yamamoto, Hadano (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/757,063

(22) Filed: Apr. 9, 2010

(65) Prior Publication Data
US 2010/0207040 A1 Aug. 19, 2010

Related U.S. Application Data

(62) Division of application No. 10/582,616, filed as application No. PCT/JP2005/024018 on Dec. 21, 2005, now Pat. No. 7,695,985.

(30) Foreign Application Priority Data

Dec. 24, 2004 (JP) .................................. 2004-375080

(51) Int. Cl.
*H01L 21/027* (2006.01)
*H01L 21/66* (2006.01)
(52) U.S. Cl. .......................................... 29/25.01; 438/7
(58) Field of Classification Search .................. 43/7, 16, 43/166, FOR. 201, FOR. 242; 257/E21.53; 438/7, 16, 166, FOR. 201, FOR. 242; 29/25.01
See application file for complete search history.

(56) References Cited

U.S. PATENT DOCUMENTS

| | | | |
|---|---|---|---|
| 5,314,831 A * | 5/1994 | Hirae et al. ...................... 356/30 |
| 5,413,958 A | 5/1995 | Imahashi et al. |
| RE36,371 E | 11/1999 | Imahashi et al. |
| 5,991,038 A | 11/1999 | Yamamoto |
| 5,994,164 A * | 11/1999 | Fonash et al. .................... 438/97 |
| 6,218,198 B1 | 4/2001 | Imao et al. |
| 6,281,470 B1 * | 8/2001 | Adachi ..................... 219/121.62 |
| 6,673,639 B2 * | 1/2004 | Wada et al. ...................... 438/14 |
| 6,806,099 B2 * | 10/2004 | Takeda et al. ..................... 438/7 |

(Continued)

FOREIGN PATENT DOCUMENTS

JP 06-291035 10/1994
JP 10-284418 10/1998

(Continued)

OTHER PUBLICATIONS

International Search Report (Application No. PCT/JP2005/024018) dated Apr. 18, 2006.

(Continued)

*Primary Examiner* — George Fourson, III
(74) *Attorney, Agent, or Firm* — Eric J. Robinson; Robinson Intellectual Property Law Office, P.C.

(57) ABSTRACT

When annealing of a semiconductor film is conducted using a plurality of lasers, each of the distances between laser irradiation regions is different. When a lithography step is conducted in accordance with a marker which is formed over a substrate in advance after the step, light-exposure is not correctly conducted to a portion crystallized by laser. By using a laser irradiation region obtained on a laser irradiation step as a marker, light-exposure is conducted by making a light-exposure position of a stepper coincide with a large grain size region in the laser irradiation region. A large grain size region and a poorly crystalline region are detected by utilizing a thing that scattering intensity of light is different between the large grain size region and the poorly crystalline region, thereby determining a light-exposure position.

10 Claims, 38 Drawing Sheets

U.S. PATENT DOCUMENTS

| | | |
|---|---|---|
| 6,943,086 B2 | 9/2005 | Hongo et al. |
| 6,989,300 B1 | 1/2006 | Tanabe |
| 7,314,766 B2 * | 1/2008 | Sugamoto et al. ......... 438/8 |
| 7,326,623 B2 | 2/2008 | Hongo et al. |
| 7,405,141 B2 | 7/2008 | Jyumonji et al. |
| 7,473,657 B2 | 1/2009 | Okumura |
| 7,834,353 B2 | 11/2010 | Hongo et al. |

FOREIGN PATENT DOCUMENTS

| | | |
|---|---|---|
| JP | 10-300447 | 11/1998 |
| JP | 2000-114174 | 4/2000 |
| JP | 2000-277450 | 10/2000 |
| JP | 2001-028440 A | 1/2001 |
| JP | 2003-124136 A | 4/2003 |
| JP | 2004-153150 A | 5/2004 |
| JP | 2005-108919 A | 4/2005 |

OTHER PUBLICATIONS

Written Opinion (Application No. PCT/JP2004/024018) dated Apr. 18, 2006.

Written Opinion (Application No. PCT/JP2005/024018) dated Apr. 18, 2006.

* cited by examiner scanning direction (1)、(3): large grain size region
(2)     : poorly crystalline region poorly crystalline region in opposite ends wholly large grain size crystal poorly crystalline region in opposite ends wholly large grain size crystal

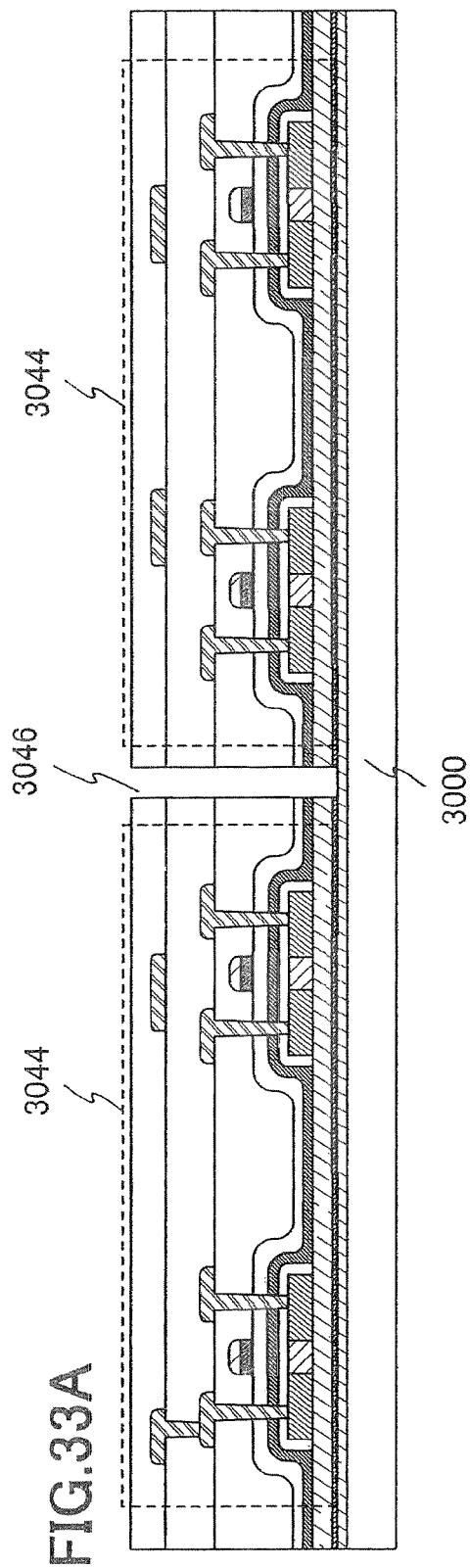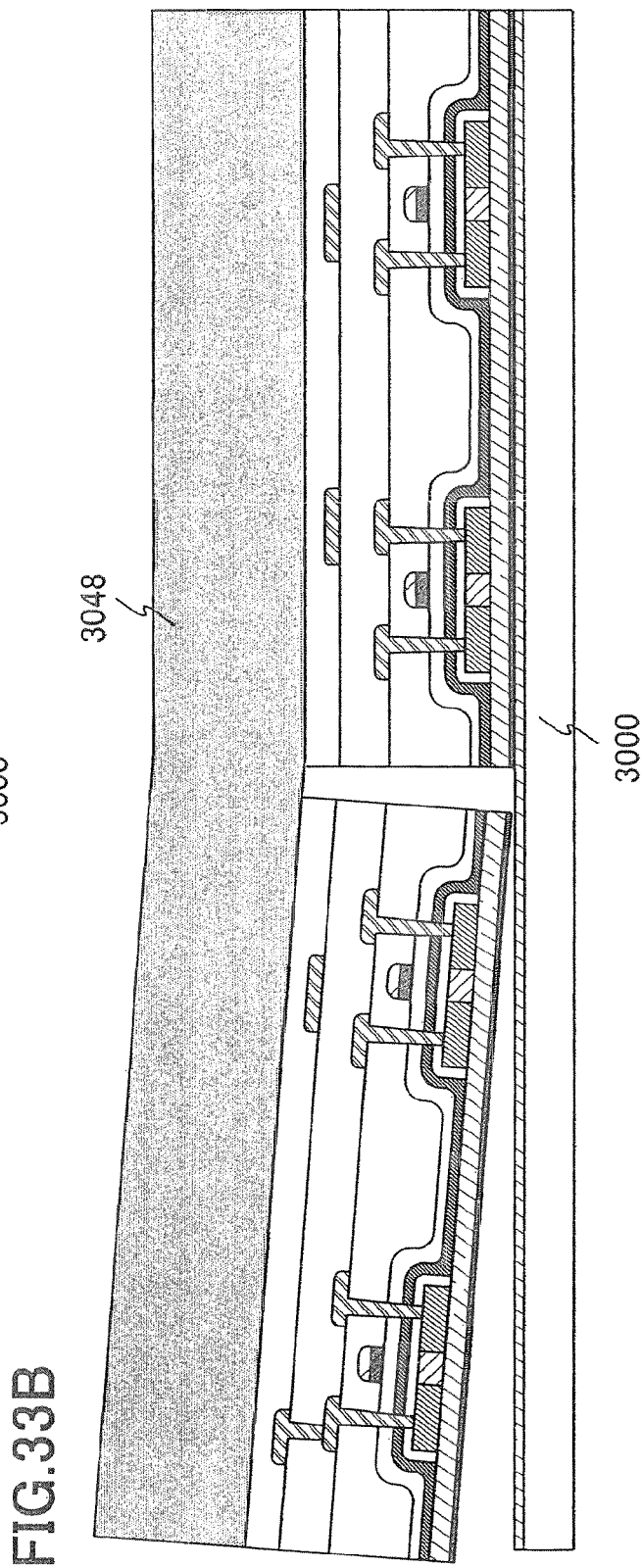
FIG.33A
FIG.33B

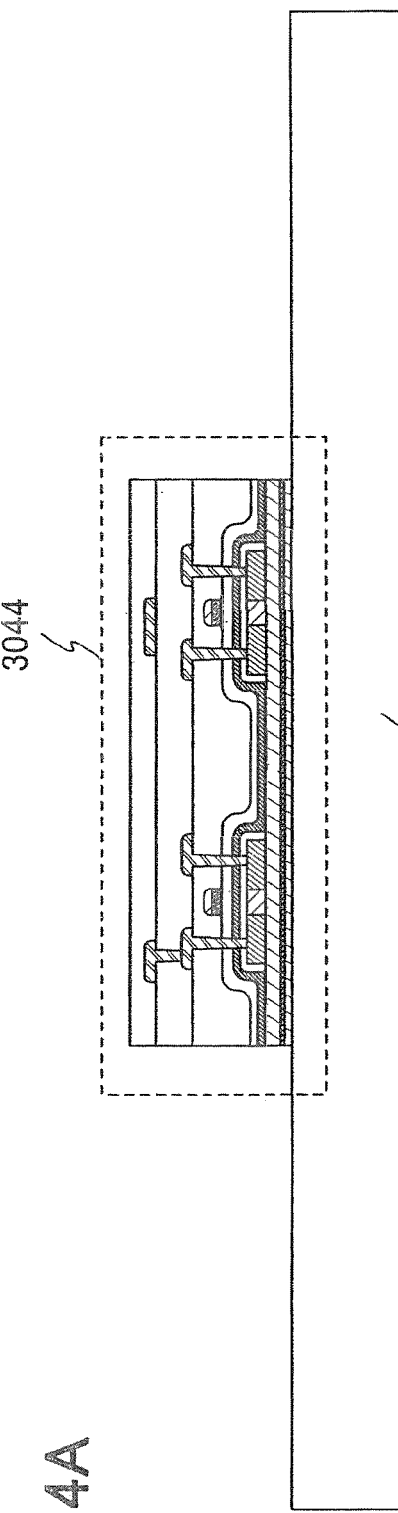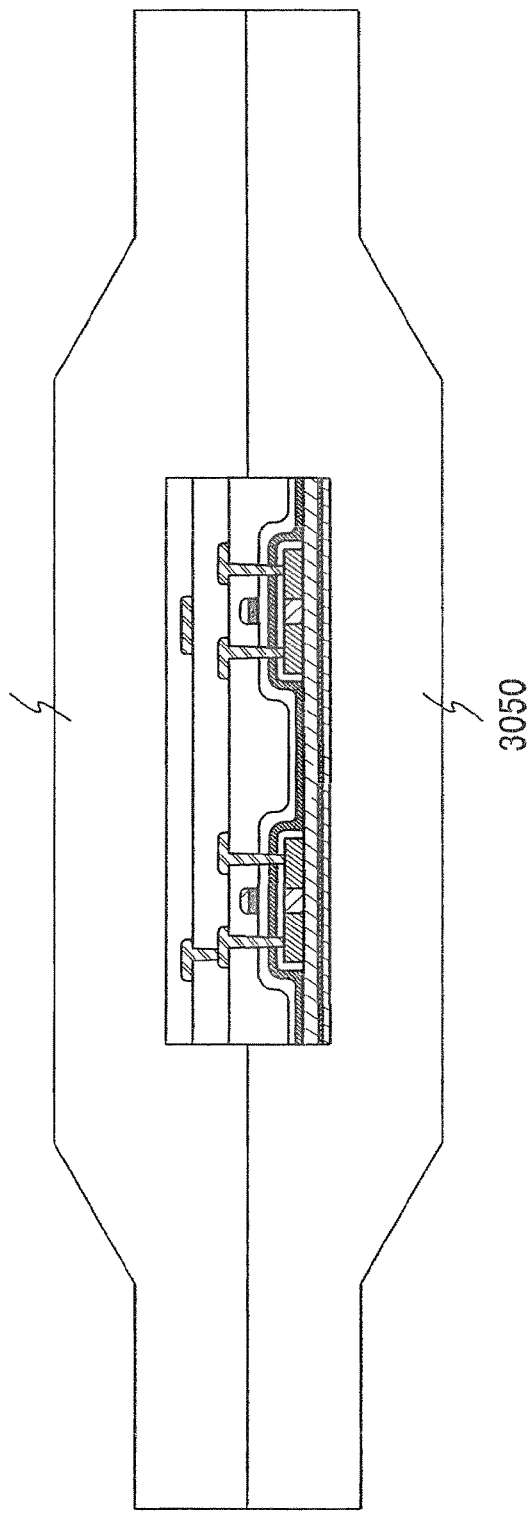
FIG.34A
FIG.34B

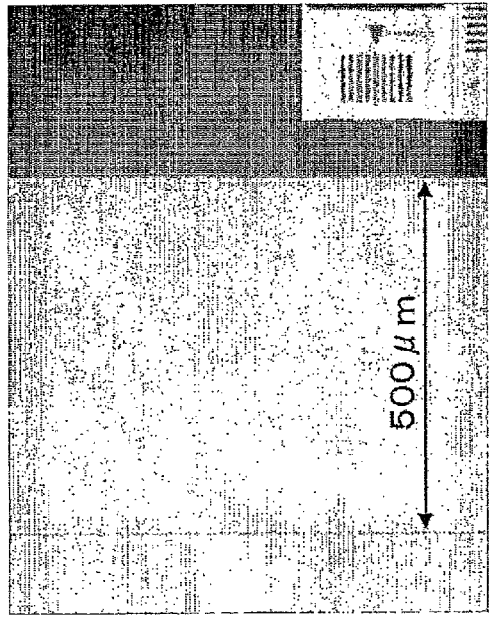
FIG.36A original pixel
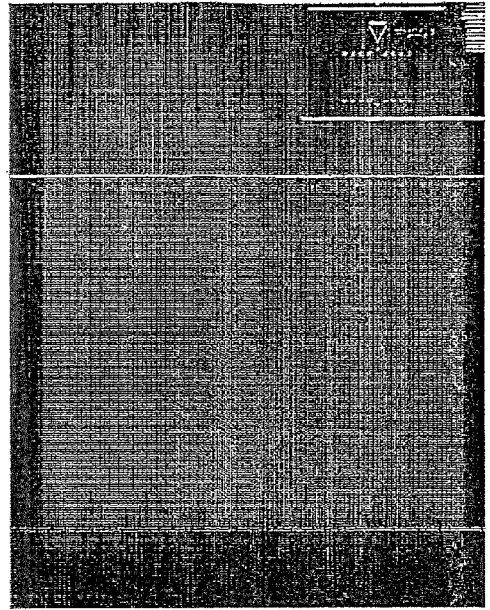
FIG.36C sobel longitudinal direction processing
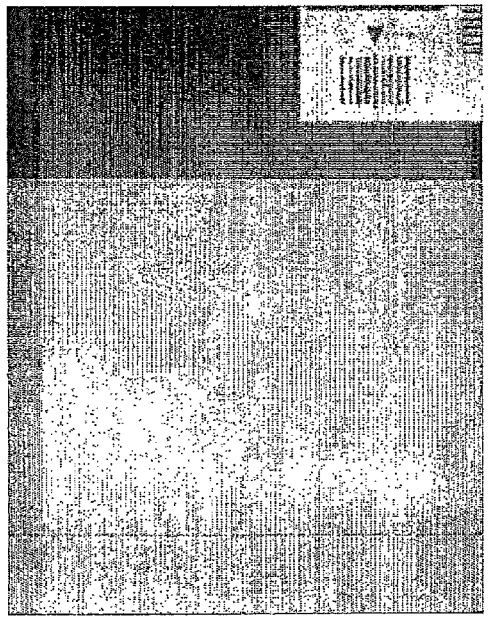
FIG.36B gray-scale
FIG.36D averaging+median + sobel longitudinal direction processing +binarizing

LIGHT EXPOSURE APPARATUS AND MANUFACTURING METHOD OF SEMICONDUCTOR DEVICE USING THE SAME

TECHNICAL FIELD

The present invention relates to a method for conducting light-exposure treatment precisely to a region in which a crystal with a large grain size is formed by a laser crystallization step in a photolithography step after the laser crystallization step and a light-exposure apparatus of conducting a step of this treatment. Moreover, the invention relates to a semiconductor device manufactured by conducting this treatment and a manufacturing method thereof.

BACKGROUND ART

Nowadays, technique for manufacturing a thin film transistor (hereinafter, referred to as a TFT) over a substrate is drastically progressing, and the application and development thereof to an active matrix display device are being advanced. In particular, a TFT using a polycrystalline semiconductor film has higher electron field-effect mobility (also referred to as mobility) than that of a TFT using a conventional non-single crystal semiconductor film; therefore, high speed operation can be conducted. Hence, the control of a pixel which is conventionally conducted in a driver circuit provided outside a substrate has been tried to conduct in a driver circuit formed over the same substrate as a pixel.

Meanwhile, as for a substrate used for a semiconductor device, a glass substrate is considered to be more promising substrate than a single crystal semiconductor substrate in terms of cost. The glass substrate is inferior in heat resistance and easy to be deformed by heat; therefore, in the case of forming a TFT using a polycrystalline semiconductor film over the glass substrate, laser annealing is employed for crystallizing the semiconductor film to avoid heat deformation of the glass substrate.

Laser annealing has a feature of being able to reduce treatment time drastically compared with an annealing method utilizing radiation heating and conduction heating, giving little heat damage to a substrate by heating a semiconductor substrate or a semiconductor film selectively or locally, and the like.

The term "laser annealing" herein used indicates technique for recrystallizing an amorphous layer or a damaged layer formed over a semiconductor substrate or a semiconductor film and technique for crystallizing an amorphous semiconductor film formed over a substrate. In addition, technique which is applied to surface modification or planarization of a semiconductor substrate or a semiconductor film is also included.

A laser oscillator used for laser annealing is classified broadly into two kinds of pulsed oscillation and continuous oscillation by the oscillation method. In recent years, it has been found that a grain size of a crystal formed in a semiconductor film is large in crystallization of a semiconductor film in the case of using a continuous wave laser oscillator (also referred to as a CW laser) such as Ar laser or $YVO_4$ laser compared with a plused laser oscillator such as excimer laser. In the case of laser beam irradiation, the laser beam is transformed using an optical system so as to have a linear shape in an irradiated surface, and emitted by moving the emitting position of the laser beam comparatively with respect to the irradiated surface. This method is industrially superior because of having high productivity.

The term "linear shape" herein used does not mean "line" in the strict sense but means a rectangle or an ellipse with high aspect ratio (for example, with aspect ratio of 10 or more (preferably 100 to 10000)).

Thus, when the grain size of a crystal in a semiconductor film becomes large, the number of grain boundaries which go into a TFT channel region formed using this semiconductor film is decreased and mobility is increased, and accordingly, it can be utilized for the development of a device with higher performance. Therefore, a continuous wave laser oscillator attracts attention.

In this specification, a region in which a large grain size crystal is formed in a semiconductor film is referred to as a large grain size region, and a region in which a small grain size crystal is formed in a semiconductor film is referred to as a poorly crystalline region.

Laser beam with a wavelength of from a visible region to an ultraviolet region is frequently used for laser annealing of a semiconductor film. This is because absorption efficiency of energy to a semiconductor film is favorable. However, the wavelength of a fundamental wave oscillated by solid CW (continuous wave) laser which is generally used is a wavelength region in the range of from red to near infrared. Therefore, a method for being converted into harmonic wave with a wavelength of a visible region or less using a nonlinear optical element is employed. In general, a visible light is generated by converting a fundamental wave into a harmonic wave using a nonlinear optical element, and the light is used for annealing of a semiconductor film.

For example, a laser beam oscillated from a CW laser which provides 10 W at 532 nm is transformed into a linear beam of 30 μm in a major axis direction and approximately 10 μm in a minor axis direction. In the case where this linear beam is made to scan in a minor axis direction and a semiconductor film is crystallized, the width of a large grain size region obtained at one time scanning is approximately 200 μm. Therefore, in order to conduct laser crystallization to the whole surface of the substrate, it is necessary to conduct laser annealing by shifting a position scanned by linear beam to a long side by the width of the large grain size region obtained at one time scanning of linear beam. Further, if annealing is conducted by emitting a laser light of a plurality of lasers to different regions simultaneously over a substrate, efficiency can be more enhanced.

By a crystallization step of a semiconductor film by a CW laser, a poorly crystalline region is formed separately from a large grain size region. The poorly crystalline region is formed in a portion where energy is lowered in both edges of a linear beam. Therefore, the poorly crystalline region is formed in both edges interposing the large grain size region. When a semiconductor element is formed in a portion including a poorly crystalline region, an object which is inferior in characteristics to a semiconductor element formed in a large grain size region is formed. A general manufacturing method of a TFT is as follows: a semiconductor film formed over a substrate is set to be an irradiated surface, and a marker or the like is formed on this semiconductor film, and then laser irradiation is conducted so that a poorly crystalline region is not formed in a portion where a semiconductor element of the semiconductor film is formed to form a large grain size region. Therefore, the position which is to be irradiated with laser is required to be precisely determined. To accomplish this, a method for controlling an irradiated position by providing a marker for an irradiated surface, which is to be a standard, detecting this marker by a CCD camera or the like, and conducting image processing using a computer is employed. This marker is used for determining a light-exposure position in a photolithography step after a laser crystallization step.

DISCLOSURE OF INVENTION

In case of using laser annealing for industry, throughput is enhanced by conducting annealing with simultaneous irradiation of different regions over a substrate using a plurality of lasers.

However, in a step of conducting laser annealing using a semiconductor film formed over a substrate as an irradiated region using a plurality of lasers, it is difficult to make distances between laser irradiation regions obtained by the plurality of lasers exactly same.

FIG. 3A shows an example of conducting laser annealing to an amorphous semiconductor film 305 over a substrate 304 using three solid state lasers 301, 302, and 303. It is difficult to make A and B same completely, which are a distance between the solid state lasers 301 and 302 and a distance between the solid state laser 302 and 303, respectively. Normally, the distances are slightly different. When annealing is conducted by emitting a laser beam from the solid state lasers 301 to 303 in this state and making a beam spot 306 formed on an amorphous film 305 scan comparatively, C and D each of which is a distance between two laser irradiation regions 309 adjacent to each other are also different.

Next, a photolithography step of forming a semiconductor film in a desired shape is conducted. In the photolithography step, light-exposure is conducted based on a marker 307 formed over the substrate. In other words, light-exposure is conducted by a light source for light-exposure 308 on condition that C and D each of which is the distance between two laser irradiation regions 309 adjacent to each other are the same. In FIG. 3B, a dotted line denotes a region corresponding to the laser irradiation region 309 and reference numeral 310 denotes an exposed region. In this step, light-exposure may be conducted to a region without being crystallized, or a region without light-exposure in spite of being crystallized may exist. In other words, a semiconductor element may be formed in a poorly crystallize region since a crystallized region is formed in a portion which is misaligned from a desired region. For example, in the case of forming a TFT in a poorly crystalline region, the characteristics of the TFT are inferior to those of a TFT formed in a large grain size region. As a result, it is not preferable since variation among TFTs is generated in characteristics.

It is an object of the present invention to provide a light-exposure apparatus which can eliminate misalignment between a poorly crystalline region and an exposed region and can conduct light-exposure certainly to a crystallized region, namely a large grain size region in a crystallized region, and a manufacturing method of a semiconductor device using this light-exposure apparatus.

One feature of the invention is that light-exposure is conducted by using a laser irradiation region obtained in a laser crystallization step as a marker and making a light-exposure position of a light source for light-exposure coincide with a large grain size region in this laser irradiation region in a photolithography step which is conducted after the laser crystallization step. By adjusting a position of the light source for light-exposure in accordance with the large grain size region, light-exposure can be certainly conducted wherever the large grain size region exists.

In order to determine a position of starting light-exposure by a light source for light-exposure, it is necessary to detect the position of a large grain size region (hereinafter, referred to as a laser irradiation region) included in a region crystallized by a laser oscillator. As for this detection, the difference of characteristics between two regions included in the laser irradiation region, namely a large grain size region and a poorly crystalline region is utilized.

The intensity distribution of a CW laser in a single mode ($TEM_{00}$) is a Gaussian type, in which the intensity of the laser beam tends to be attenuated from the center toward the edge portion of laser beam. Therefore, the edge portion of the beam spot is weak in energy, and it is insufficient to obtain a large grain size crystal. Hence, by crystallizing a semiconductor film using the CW laser, a large grain size region and a poorly crystalline region are formed in a laser irradiation region formed by irradiation with CW laser light.

FIG. 4 is an enlarged view of a laser irradiation region shown in FIGS. 3A and 3B, which shows a condition after conducting laser irradiation to a semiconductor film 401 over a substrate 400. The surface of a large grain size region 402 is comparatively plain. On the other hand, a depression/projection having the height which is equivalent to the thickness of a semiconductor film 400 in the surface of a poorly crystalline region 403 is formed. Light is scattered on a surface having a depression/projection by the depression/projection as shown in FIG. 4; therefore, when light is emitted to the large grain size region 402 and the poorly crystalline region 403, the intensity of the scattered light is different. By utilizing this characteristic, the edge portion of the laser irradiation region is detected. In addition, when a light-exposure position of a light source for light-exposure is determined by using the edge portion of the laser irradiation region as a marker, it is unnecessary to form a marker separately; therefore, a step of forming a marker can be omitted.

For example, the following equation is used to correlate a depression/projection in a substrate surface to the loss of light.

$$\text{Loss} = 1 - \exp[-(4\pi\sigma\cos(\theta)/\lambda)^2] \qquad \text{[Numeral 1]}$$

In fact, a depression/projection portion and a plain portion are detected using a light with a wavelength which can distinguish a depression/projection from a plain portion, namely light with a wavelength which can reveal that there is an obvious difference in the loss of light between the depression/projection portion and the plain portion.

The invention includes the following embodiment.

One aspect of the invention includes a light source for emitting light to an irradiated surface having a plurality of regions each of which is different in scattering intensity of light, a sensor which receives reflected light from the irradiated surface, a means for obtaining scattering intensity by the received light, a means for detecting the plurality of regions from the scattering intensity, and a light source for light-exposure which conducts light-exposure by making the light source for light-exposure coincide with a position of an arbitrary region among the plurality of regions.

Another aspect of the invention includes a light source for emitting light to an irradiated surface having a plurality of regions each of which is different in reflection intensity of light, a sensor which receives reflected light from the irradiated surface, a means for obtaining scattering intensity by received light, a means for detecting a plurality of the regions from the reflection intensity, and a light source for light-exposure which conducts light-exposure by making the light source for light-exposure coincide with a position of an arbitrary region among the plurality of regions.

The above structure of the invention has a feature that light emitted from the light source is blue light or light with a wavelength which is shorter than blue light. It is to be noted that laser or an LED can be formed as the light source.

The above structure of the invention has a feature that the light source, the sensor, and the light source for light-exposure are integrated with each other.

The above structure of the invention has a feature that the sensor includes any of photo detectors of a CCD, a photodiode, a phototransistor, a photo IC, a photomultiplier, or a CMOS sensor. The photo detector included in the sensor may be one, or may be a plurality of photo detectors arranged in a linear shape or a plain shape.

The above structure of the invention has a feature of including a means for emitting light in a predetermined period and a means which can detect the reflected light which is synchronized with the period.

The above structure of the invention has a feature of including a means for conducting binarization processing, detection processing of edge with concentration difference, sobel processing, averaging processing, or median processing to data of the reflected light which is received.

Another aspect of the invention has a feature that a plurality of regions each of which is different in scattering intensity of light are formed by emitting laser to a semiconductor film over a substrate, and reflected light obtained when light is emitted to the substrate is received, then, scattering intensity is obtained by the reflected light which is received, and then, this plurality of regions is detected by obtained scattering intensity, further, light-exposure is conducted by making a light source for light-exposure coincide with an arbitrary region among this plurality of regions.

According to the above structure of the invention, when blue light or light with a shorter wavelength than blue light is emitted, the difference in scattering intensity which is obtained is generated; therefore, the position can be specified more precisely.

Another aspect of the invention has a feature that a plurality of regions each of which is different in scattering intensity of light is formed by emitting laser to a semiconductor film over a substrate, and reflected light obtained when light is emitted to the substrate is received to measure reflection intensity, then, this plurality of regions is detected by obtained reflection intensity, and then, light-exposure is conducted by making a light source for light-exposure coincide with an arbitrary region among this plurality of regions.

According to the above structure of the invention, when blue light or light with a shorter wavelength than blue light is emitted, the difference in reflection intensity which is obtained is generated; therefore, the position can be specified more precisely.

According to the above structure of the invention, a blue light, a laser with a shorter wavelength than the blue light, or an LED may be used.

According to the above structure of the invention, the position of the light source for light-exposure may be controlled while a plurality of regions each of which is different in scattering intensity of light is detected by emitting blue light or light with a shorter wavelength than blue light. By simultaneously conducting the control of the position of the light source for light-exposure and the detection of the plurality of regions which is different in scattering intensity of light, light-exposure can be conducted with favorable throughput.

According to the above structure of the invention, a photo detector such as a CCD, a photodiode, a phototransistor, a photo IC, a photomultiplier, or a CMOS sensor can be used. In addition, binarization processing, detection processing of edge with concentration difference, sobel processing, averaging processing, median processing, or the like can be conducted to obtained data.

According to the above structure of the invention, a large grain size region can be favorably detected without the influence of the periphery of light when light is emitted in a predetermined period and only reflected light which is synchronized with the period is detected.

According to the invention, the following advantages can be given. First, the formation of a marker is not required since a photolithography can be conducted by using a large grain size region as a marker. In other words, a step which is separately required for forming a marker conventionally can be omitted.

Second, light-exposure can be certainly conducted wherever a large grain size region exists since light-exposure by a light source for light-exposure is conducted in accordance with a large grain size region. In other words, a large grain size region corresponds to an exposed region; therefore, a TFT can be manufactured in this region. Therefore, each of the TFTs has high characteristics and variation of characteristics is reduced.

BRIEF DESCRIPTION OF DRAWINGS

In the accompanying drawings:

FIGS. 33A and 33B are explanatory view of a method for manufacturing a thin film integrated circuit manufactured using the invention;

FIGS. 34A and 34B are explanatory view of a method for manufacturing a thin film integrated circuit manufactured using the invention;

FIGS. 36A to 36D are explanatory pictures substitutive for drawings of conducting image processing on an image of a semiconductor film in which light in received;

BEST MODE FOR CARRYING OUT THE INVENTION

Embodiment modes according to the present invention are described in detail with reference to the drawings. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the present invention.

In this embodiment mode, a method of using a camera using a CCD as a detection method is explained. A semiconductor film is irradiated with a monochromatic light (not shown) having a short wavelength to detect a scattered light from a large grain size region and a poorly crystalline region by a CCD camera. By recognizing the detected scattered light, the position of the large grain size region is detected. In the surface of the poorly crystalline region, there is a projection portion having a height which is equivalent to the film thickness of the semiconductor film; therefore, the emitted light is scattered. The intensity of the scattered light is high. On the other hand, the large grain size region has high planarity compared with the poorly crystalline region; therefore, the intensity of the scattered light is low.

Figure 5:
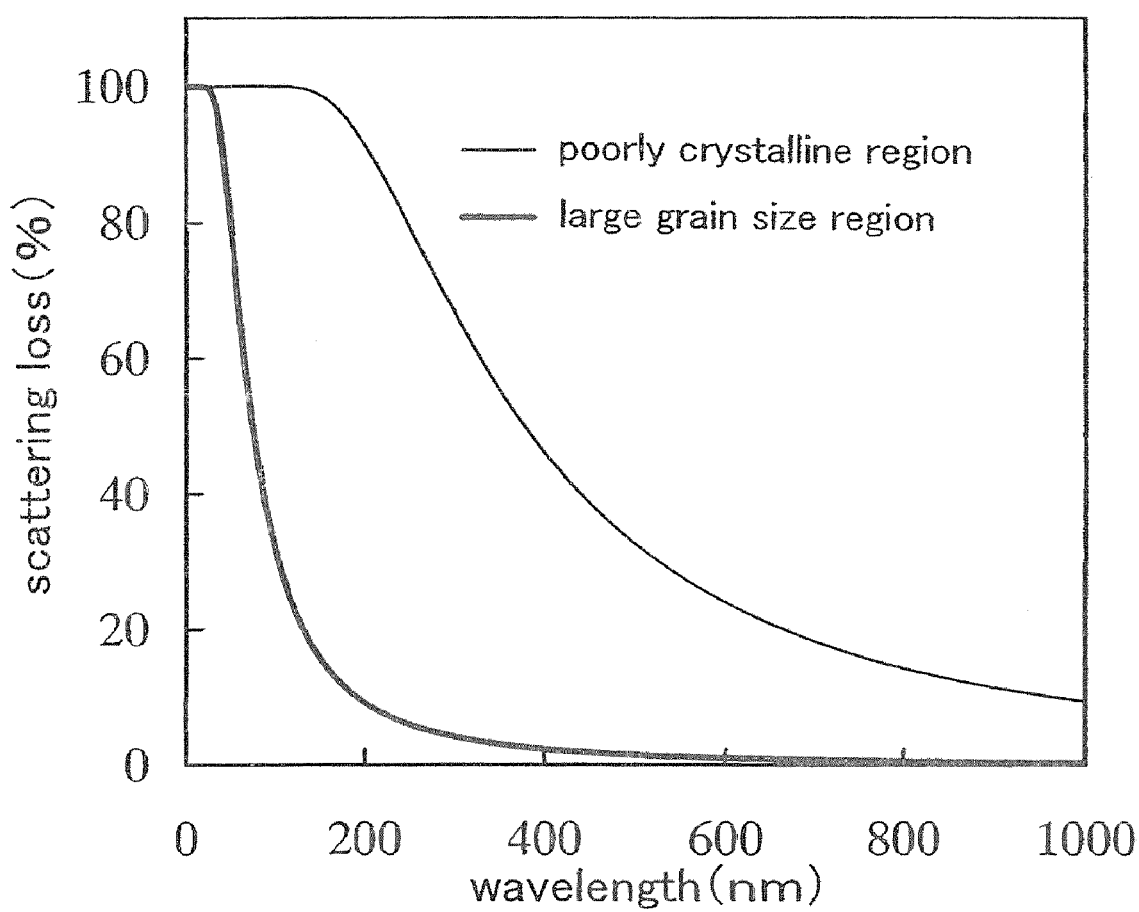
FIG. 5 is a view showing relation between depression/projection of a surface and scattering intensity.

FIG. 5 is a graph showing a relationship between surface roughness and scattering loss. Scattering loss (Loss) is obtained by substituting incidence angle θ, surface roughness σ, and wavelength λ for the above-described equation. Incidence angle with respect to an irradiated surface is 0 degree. The height of the projection portion of the poorly crystalline region is approximately 30 nm and the height of the projection portion of the large grain size region is approximately 5 nm; therefore, the surface roughness of the poorly crystalline region is set to be 30 nm and the surface roughness of the large grain size region is set to be 5 nm.

In FIG. 5, a horizontal axis represents a wavelength (nm), and a vertical axis represents scattering loss (%). The higher the scattering intensity, the higher the scattering loss. Therefore, FIG. 5 shows that the poorly crystalline region is totally high in scattering intensity compared with the large grain size region. However, contrast is difficult to obtain depending on a wavelength of light which is emitted.

For example, in the case of using red light (with a wavelength of approximately 650 to 780 nm), there is not much difference between the scattering intensity of both regions. Therefore, it is difficult to detect the poorly crystalline region and the large grain size region by the CCD camera in this case. On the other hand, in the case of using blue light (with a wavelength of approximately 450 to 490 nm), contrast which is twice or more than the red light can be obtained. Therefore, it is conceivable that the poorly crystalline region and the large grain size region can be detected.

Figure 23A:
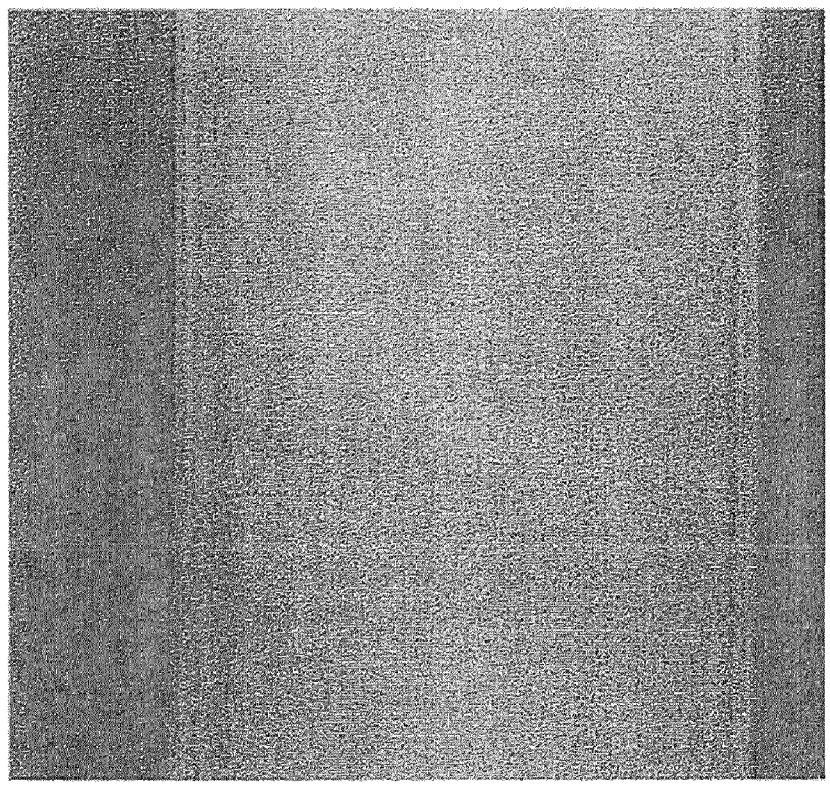
FIGS. 23A and 23B are pictures substitutive for drawings for showing substrates, each of which has a semiconductor film crystallized by a laser irradiation and each of which is irradiated with a white light.
Figure 23B:
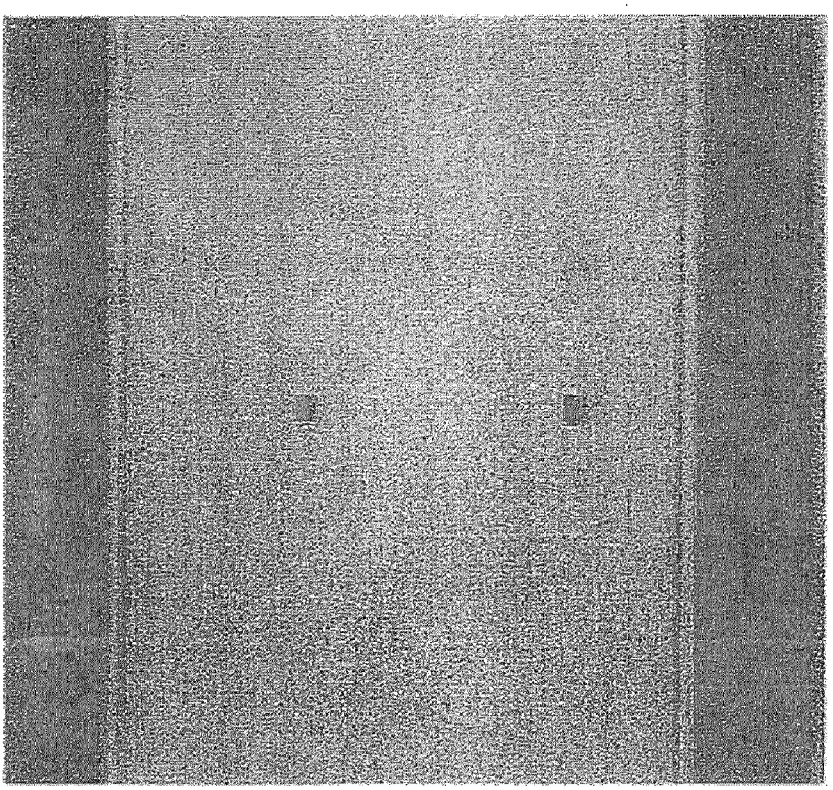
Figure 24A:
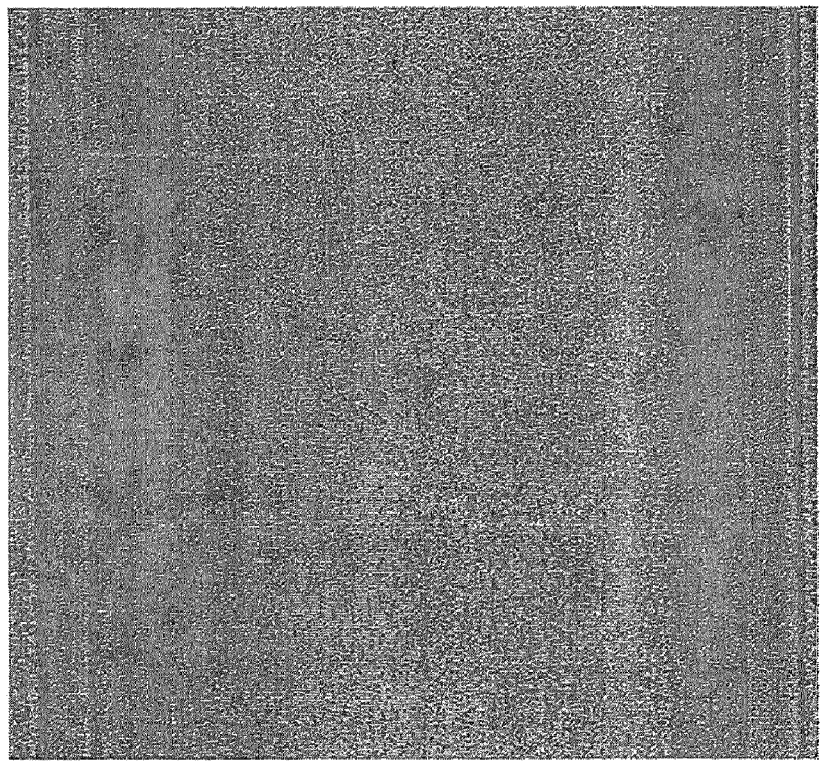
FIGS. 24A and 24B are pictures substitutive for drawings for showing a substrate, each of which has a semiconductor film crystallized by a laser irradiation and each of which is irradiated with a blue light.
Figure 24B:
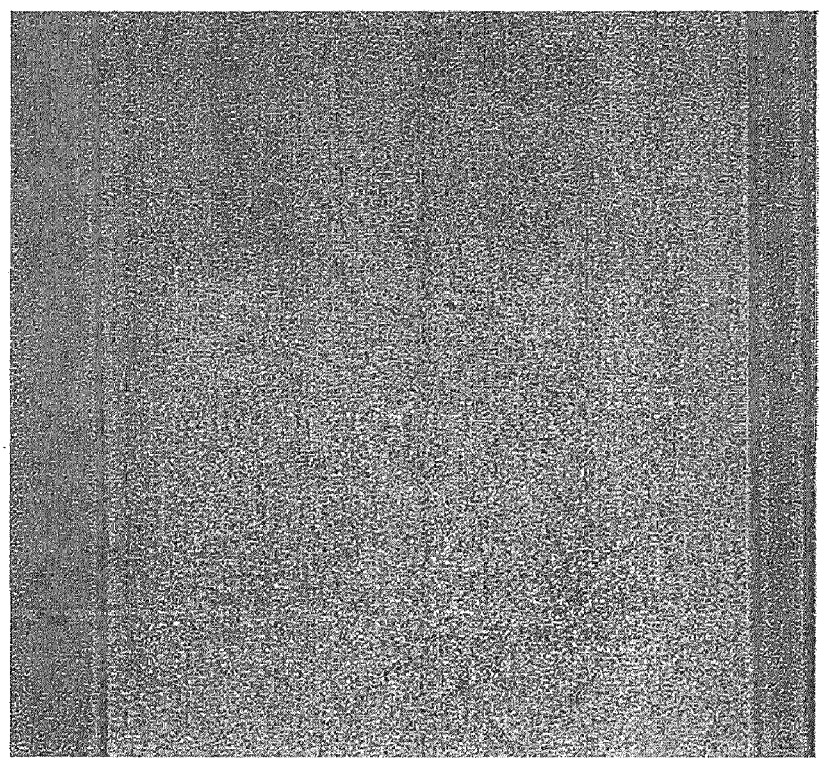

Therefore, the inventors conducted experiment whether there is a difference between the reflected light intensity of the large grain size region and the reflected light intensity of the poorly crystalline region by taking a picture in the state where white light and blue light are separately emitted from a direction perpendicular to a substrate that laser crystallization of a semiconductor film is completed. FIGS. 23A to 24B show the result thereof. When light is emitted from a direction perpendicular to the poorly crystalline region having a lot of depressions/projections and light reflected to a direction perpendicular to the substrate is shot, it appears dark since the reflected light is reduced by being scattered over a substrate surface. On the contrary, in the large grain size region having a few depressions/projections, it appears bright since the reflected light is increased. FIGS. 23A and 23B are pictures of shooting light reflected in a direction perpendicular to the substrate by emitting white light from a direction perpendicular to the substrate. FIG. 23A is a picture of shooting a sample in which a laser irradiation region has wholly large grain size crystal, and FIG. 23B is a picture of shooting a sample in which there is a poorly crystalline region in the opposite ends of the laser irradiation region. In this case, the obvious difference in contrast cannot be found between the edge portion (poorly crystalline region) and the central portion (large grain size region) of the laser irradiation region; therefore, it is expected to be difficult to distinguish between the large grain size region and the poorly crystalline region. On the other hand, FIGS. 24A and 24B are pictures of shooting light reflected in a direction perpendicular to the substrate by emitting blue light from a direction perpendicular to the substrate. FIG. 24A is a picture of shooting a sample in which a laser irradiation region has wholly a large grain size crystal, and FIG. 24B is a picture of shooting a sample in which there is a poorly crystalline region in the opposite ends of the laser irradiation region. It is revealed that the obvious difference in contrast can be found between the edge portion (poorly crystalline region) and the central portion (large grain size region) of the laser irradiation region.

Therefore, according to this experiment, it is revealed that a large grain size region and a poorly crystalline region can be detected easier by using blue light since a blue light can obtain higher contrast than a white light. Three colors of R (red), G (green), and B (blue) are mixed with white light, and detection can be conducted by blue color among three colors; therefore, it is conceivable that, in white light, detection is difficult to be conducted due to another long wavelength. Therefore, it is preferable to use a wavelength which is shorter than the wavelength of the blue light for detecting a large grain size region.

However, scattering intensity from a minute depression/projection is increased as wavelength is shortened. As shown in a graph in FIG. 5, a contrast ratio of a poorly crystalline region to a large grain size region is reduced when a wavelength is too short; therefore, detection of both regions cannot be conducted. Hence, light with a wavelength which can distinguish a poorly crystalline region and a large grain size region may be used. In this embodiment mode, a semiconductor film is irradiated with blue light to detect a poorly crystalline region and a large grain size region by a CCD camera.

Figure 1A:
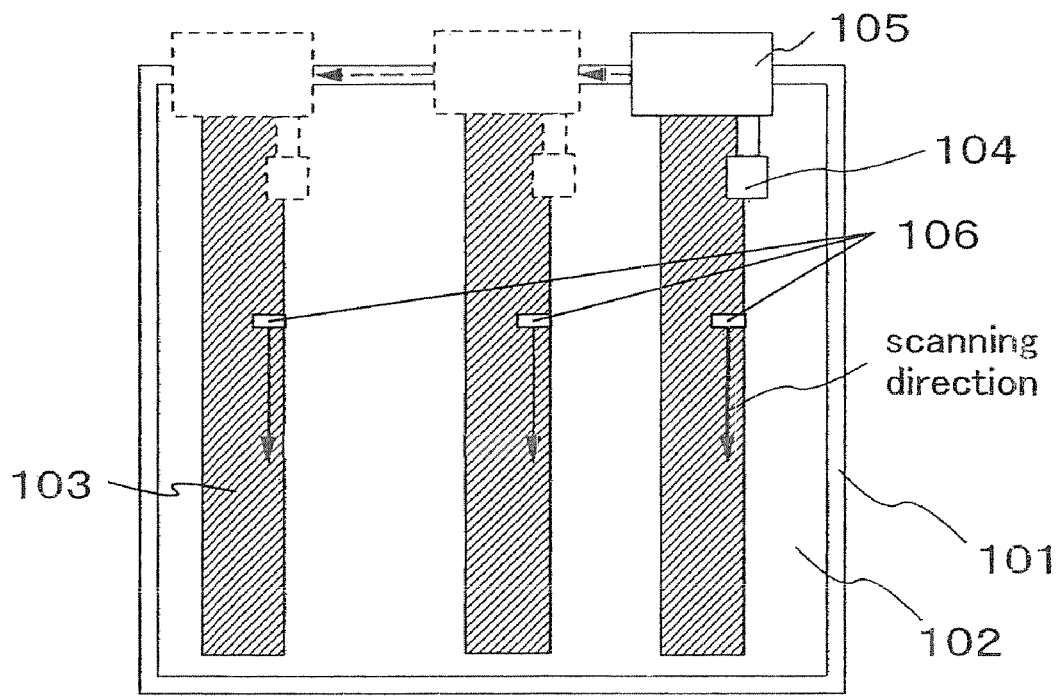
FIGS. 1A and 1B are views showing an embodiment mode of the present invention.
Figure 1B:
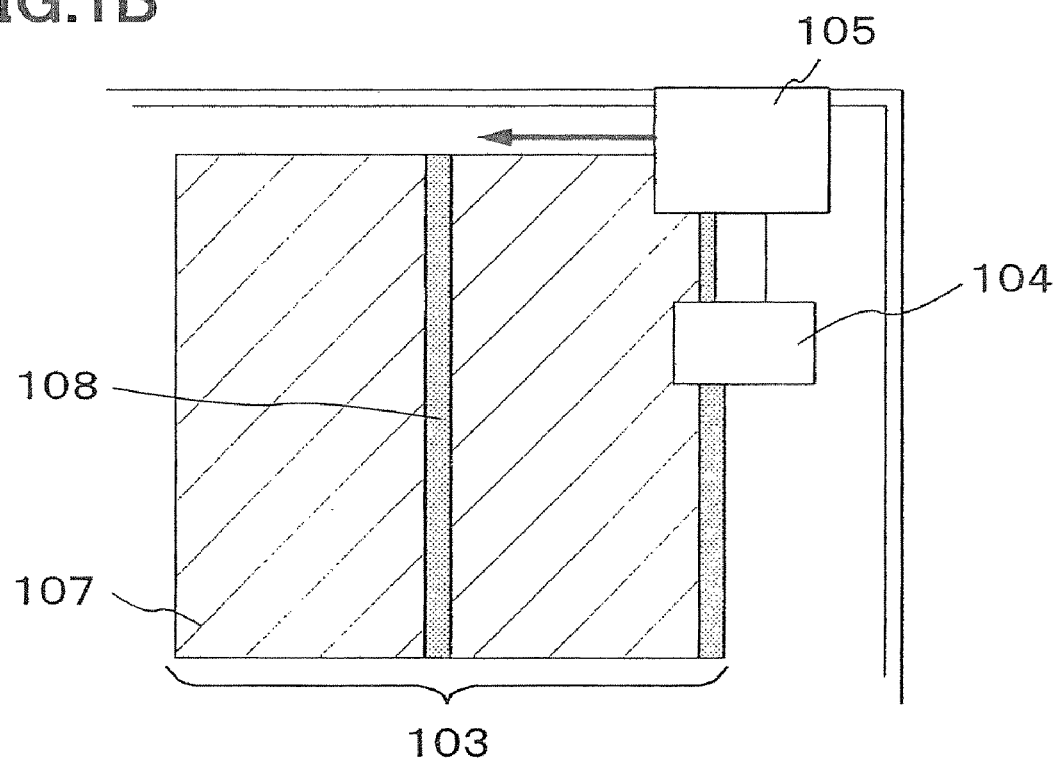

FIGS. 1A and 1B show an outline of an actual process. First, a substrate 101 provided with a non-single crystal semiconductor film 102 is prepared. Then, a laser crystallization step that the non-single crystal semiconductor film 102 is an irradiated surface is conducted. In the laser crystallization step, a plurality of solid state lasers such as a YAG laser or a $YVO_4$ laser is used to conduct crystallization efficiently. The beam spots of each of the laser beams are transformed using an optical system so as to be a linear beam spot 106 on the irradiated surface, and the beam is made to scan in a direction of a short side of the linear beam spot 106 to conduct laser annealing. According to this step, a plurality of laser irradiation regions 103 is formed by laser irradiation using a plurality of lasers.

After the laser irradiation step, a resist is formed to conduct a photolithography step. In this photolithography step, a CCD camera 104 integrated with a light source for light-exposure 105 is moved little by little from one edge of the substrate in a direction perpendicular to a scanning direction of the beam spot to a direction perpendicular to a scanning direction of the beam spot while the non-single crystal semiconductor film 102 is irradiated with blue light from above the resist in order to determine a light-exposure starting position of the light source for light-exposure 105. Then, the blue light reflected from the non-single crystal semiconductor film 102 is received by the CCD camera 104, and data of the received light is outputted to an information processor such as a computer. In the information processor, the positions of a large grain size region 107 and a poorly crystalline region 108 are specified by utilizing the fact that a contrast ratio of the scattered light in the large grain size region 107 and the poorly crystalline region 108 is high. It is to be noted that the material or the like of the resist is not limited in particular if the blue light can be transmitted to the resist to the degree that the large grain size region 107 and the poorly crystalline region 108 can be distinguished from each other.

Figure 6A:
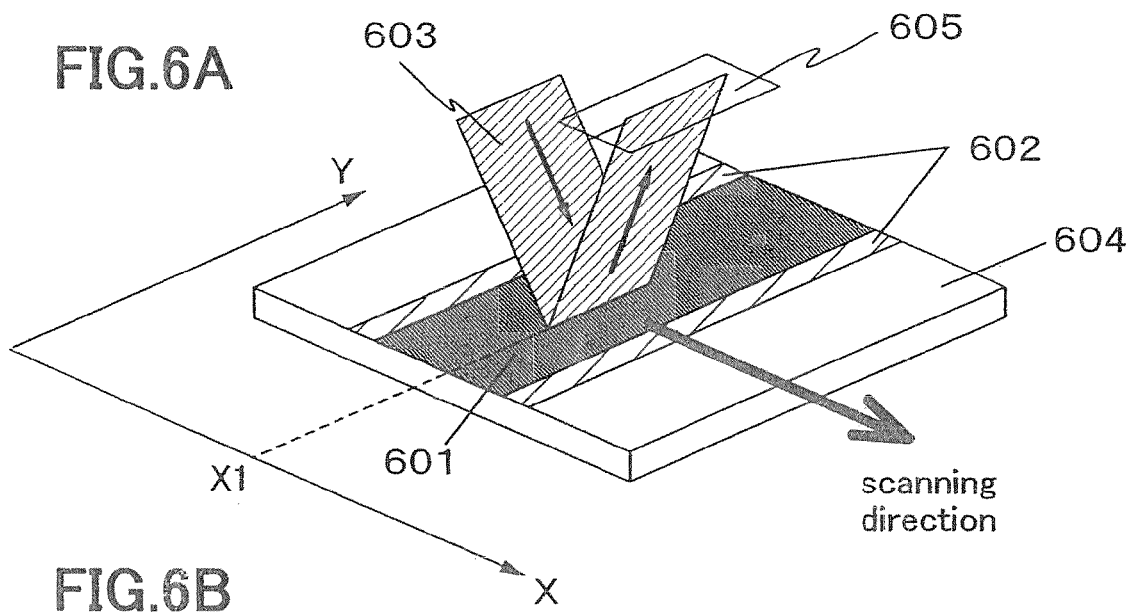
FIGS. 6A to 6C are views showing one mode of the invention.
Figure 6B:
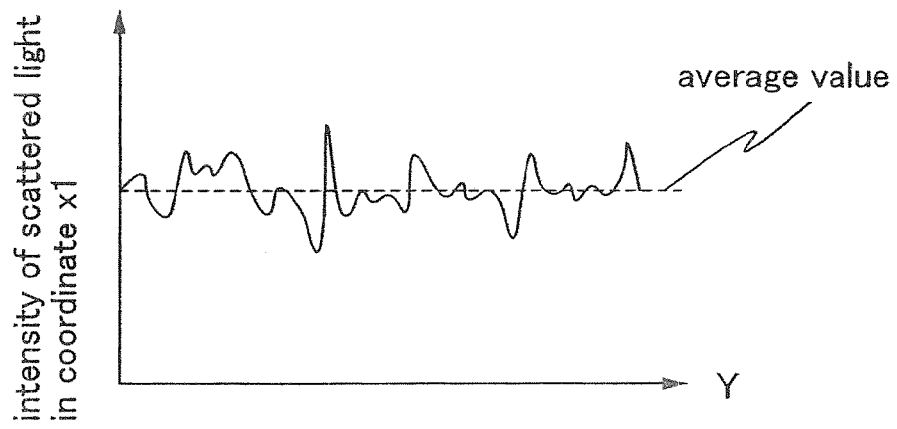
Figure 6C:
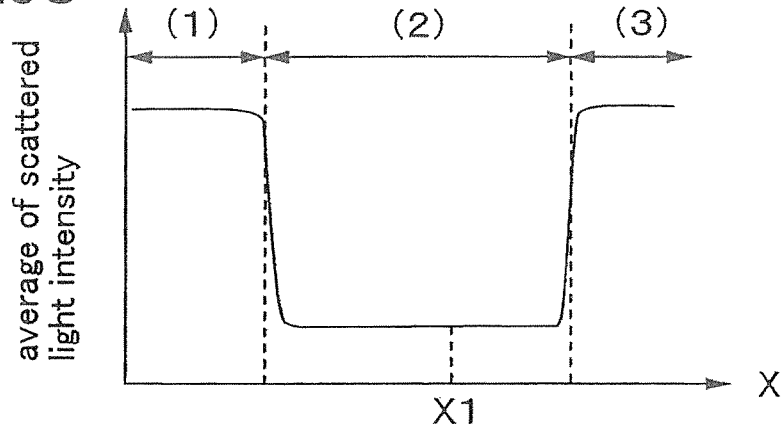

In addition, the positions of a large grain size region 601 and a poorly crystalline region 602 can be detected by using a method shown in FIGS. 6A to 6C. As shown in FIG. 6A, an X direction indicates a direction of measuring a scattered light and a Y direction indicates a direction of laser irradiation. It is to be noted that the X direction is perpendicular to the Y direction. Light 603 is transformed into a linear shape or a rectangular shape and is emitted to a substrate 604 so that a cross-section direction of the light 603 is parallel to the Y direction, and a reflected light at the same time is received by a CCD camera 605 having a planar shape, thereby measuring a scattered light. FIG. 6B shows data of a scattered light at a certain moment, for example, in the Y direction in a coordinate $x_1$ of the X direction. This data of the scattered light in the Y direction is averaged with an information processor, thereby calculating the scattering intensity in the coordinate $x_1$. Further, the light 603 and the CCD camera 605 are moved toward the X direction comparatively to the substrate 604, thereby measuring a scattered light. FIG. 6C shows data of a thusly obtained scattered light which is averaged in the Y direction in each position in the X direction.

According to the data, the large grain size region 601 which corresponds to (2) in FIG. 6C can be distinguished from the poorly crystalline region 602 which corresponds to (1) and (3) in FIG. 6C. By using this method, the large grain size region 601 can be distinguished from the poorly crystalline region 602 more precisely than a case of measuring a scattered light by receiving a reflected light at the time of emitting the light 603 in a spot shape to a semiconductor film by a CCD camera.

The movement of the light source for light-exposure 105 and the CCD camera 104 and the irradiation with the blue light are stopped at the time that the large grain size region has been detected, and then light-exposure by the light source for light-exposure is started. The light-exposure can be started from the position in which the large grain size region 107 is detected by integrating the CCD camera 104 with the light source for light-exposure 105, accordingly, the large grain size region 107 can be made to correspond to a poorly crystalline region 108 certainly.

After thusly completing the light-exposure of one laser irradiation region, the light-exposure of adjacent laser irradiation region is similarly conducted by detecting a large grain size region by the CCD camera 104 and the light source for light-exposure 105. By repeating a series of the operations, the large grain size region 107 of the whole surface of the substrate 101 can be certainly exposed to light.

Although the position of the large grain size region is detected by obtaining scattering intensity in this embodiment mode, the position of the large grain size region may be detected by the intensity of reflected light.

Embodiment 1

In this embodiment, an example of detecting a large grain size region and a poorly crystalline region by using laser which is separately provided is explained.

Figure 2A:
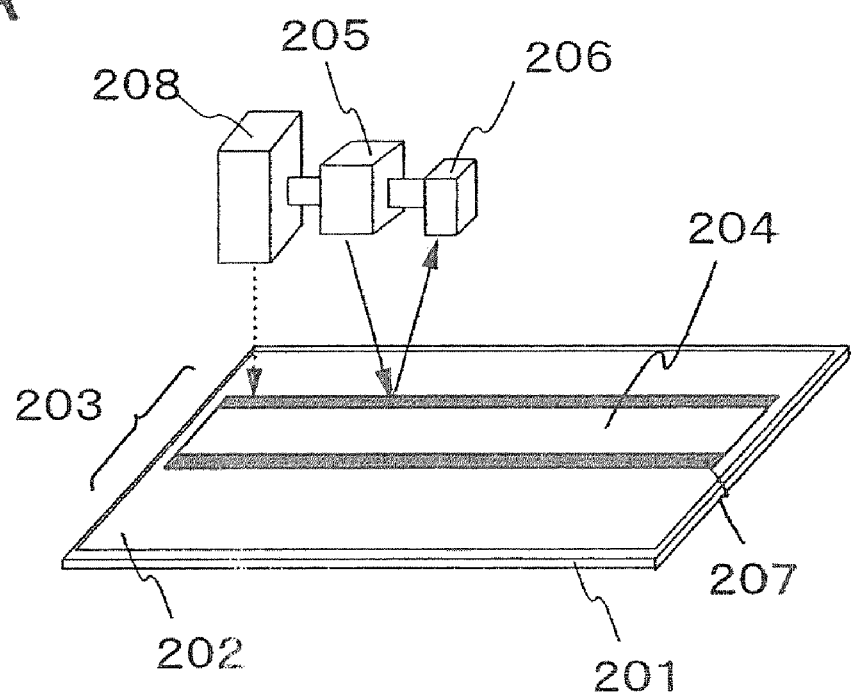
FIGS. 2A and 2B are views showing an embodiment mode of the invention.

First, a non-single crystal semiconductor film 202 is formed over a substrate 201 in the same manner as in Embodiment Mode 1. Then, as shown in FIG. 2A, laser irradiation is conducted using the non-single crystal semiconductor film 202 as an irradiated surface to form a laser irradiation region 203.

Next, a resist is formed, and a large grain size region 204 in the laser irradiation region 203 is detected to determine a place where a photolithography step is conducted. In this embodiment, laser 205 and an optical sensor 206 are used. It is to be noted that the resist has only to be able to transmit the laser 205 to the degree that the large grain size region 204 and the poorly crystalline region 207 can be distinguished from each other.

The wavelength of the laser 205 is required to be able to detect the large grain size region 204 and a poorly crystalline region 207 as explained in Embodiment Mode 1. In this embodiment, laser with a wavelength of approximately 300 to 400 nm, for example, a XeCl excimer laser (308 nm), a XeF excimer laser (351 nm), a nitrogen laser (337 nm), or the like can be used. In the case of using another laser, it can be used by being converted to harmonic wave with a wavelength of approximately 300 to 400 nm using a nonlinear optical element. Instead of laser, blue diode (gallium nitrogen (405 nm)) or the like can be used.

The optical sensor 206 is used for receiving light reflected from the non-single crystal semiconductor film 202. To distinguish the large grain size region 204 from the poorly crystalline region 207, it is more preferably to use an optical sensor which has favorable linearity of the mount of received light and output. As the optical sensor 206 which is used here, a photodiode, a phototransistor, a photo IC, and the like can be given. The optical sensor 206 is not limited to this, and a CCD, a CMOS sensor, a photomultiplier, or the like can be similarly used.

Further, the large grain size region 204 and the poorly crystalline region 207 can be detected more precisely by shielding light (ambient light) in the periphery of the optical sensor 206. Consequently, an optical modulation type optical sensor with the optical sensor 206 built-in can be used.

Figure 7A:
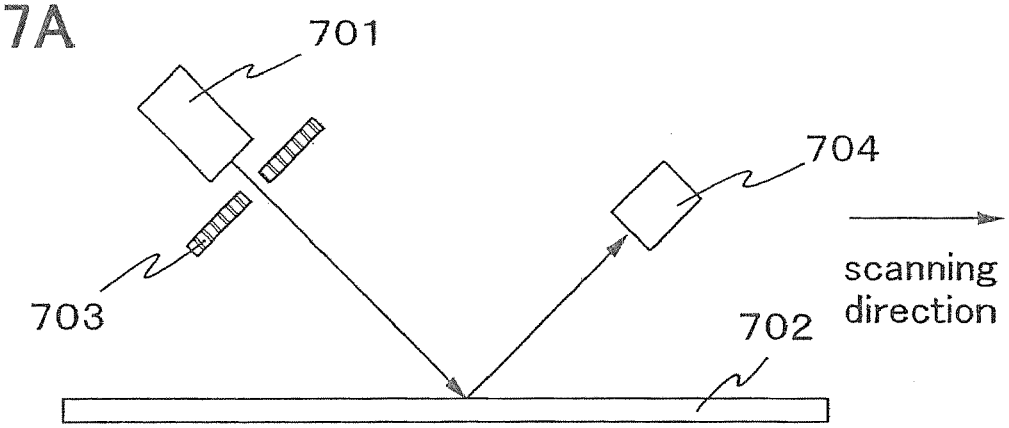
FIGS. 7A to 7C are views showing one mode of the invention.
Figure 7B:
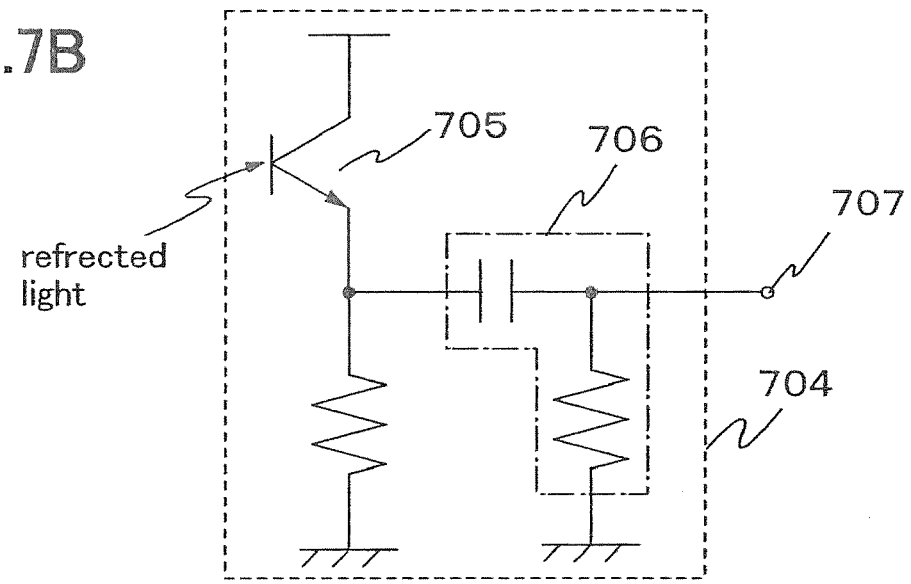
Figure 7C:
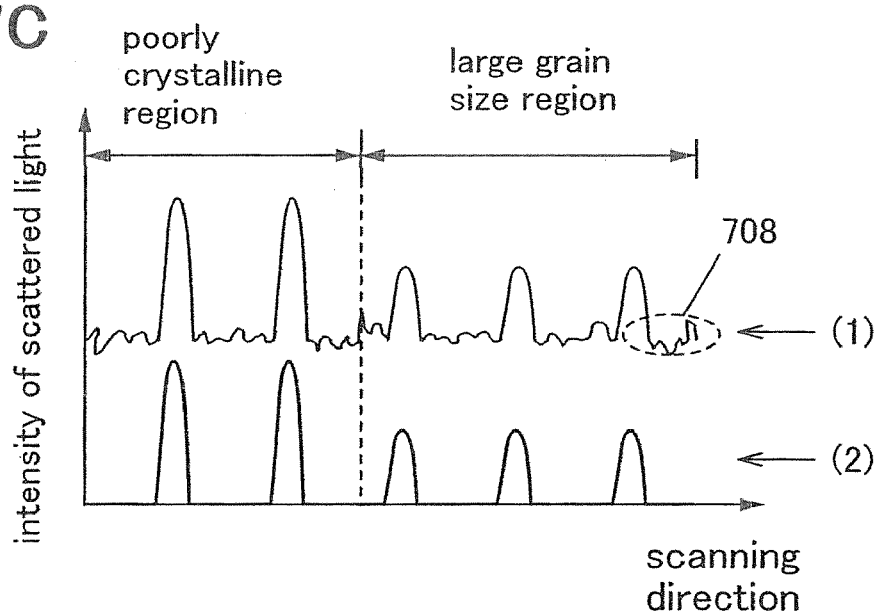

A method of using the same is explained with reference to FIGS. 7A to 7C. First, an irradiated surface 702 is set to be irradiated with laser outputted from a laser oscillator 701 with respect to each predetermined period. Specifically, the irradiated surface 702 is irradiated with the laser periodically by using a method such as a method of using a pulsed laser as the laser oscillator 701 or a method of placing a slit 703 which opens and shuts with respect to each predetermined period on an optical path of the laser. FIG. 7A shows an example of using a slit which opens and shuts with respect to each predetermined period. Light reflected from the irradiated surface 702 is received by an optical sensor 704. The optical sensor 704 has a structure shown in, for example FIG. 7B, and is provided with a photo detector 705 using a photodiode, a phototransistor, a photo IC, or the like, and a high pass filter 706 which extracts only reflected light which is synchronized with the period of light emitted to the irradiated surface. As shown in FIG. 7C, only data of reflected light can be extracted from data including an ambient light 708 by passing through the high pass filter 706. The data of the reflected light obtained here is outputted from an output terminal 707. A graph of (1) in FIG. 7C is an example of data before passing through the high pass filter 706, and a graph of (2) in FIG. 7C is an example of data after passing through the high pass filter 706. By providing the high pass filter 706, the difference between a poorly crystalline region and a large grain size region becomes more obvious, and detection can be easily conducted.

By using these means, a large grain size region is detected in the same manner as a method shown in Embodiment Mode 1. In this embodiment, a specular reflection light is observed as shown in FIG. 7A. When light is emitted to the poorly crystalline region, the emitted light is scattered since the surface of the poorly crystalline region has a projection portion having a height which is equivalent to the thickness of a semiconductor film. Therefore, the intensity of the scattered light is high and the intensity of the specular reflection light is lowered. On the other hand, most of light emitted to the large grain size region reflects specularly since the large grain size region has higher planarity than that of the poorly crystalline region; therefore, the intensity of scattered light is low and the intensity of the specular reflection light is increased. Hence, the scattering intensity of the large grain size region is different from the scattering intensity of the poorly crystalline region as shown in FIGS. 5 and 7C. Therefore, high contrast can be obtained and detection can be conducted.

Figure 2B:
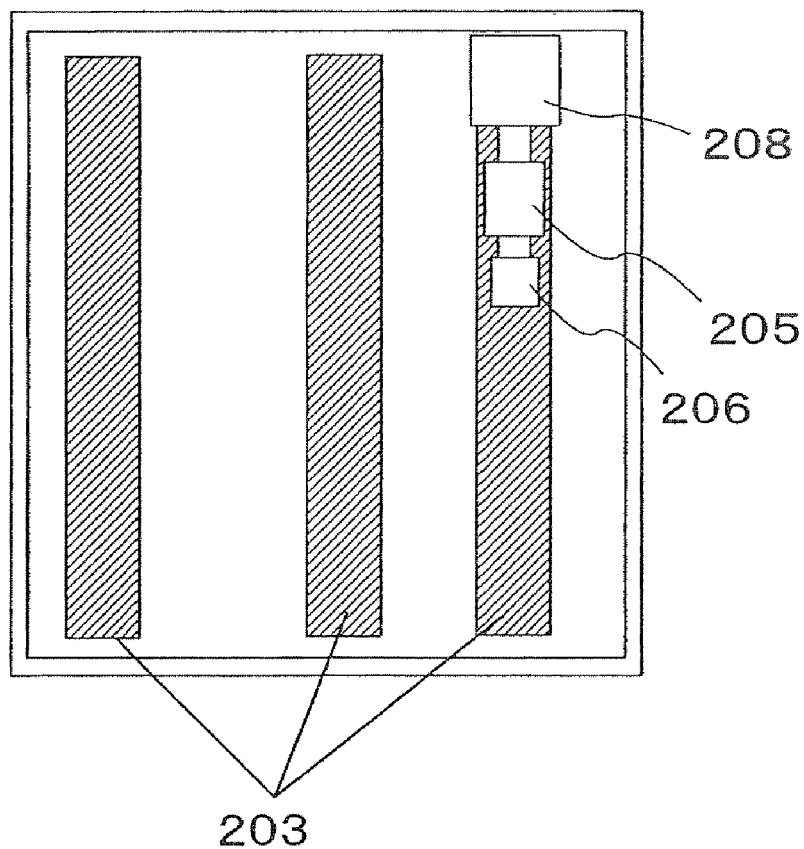
Figure 3A:
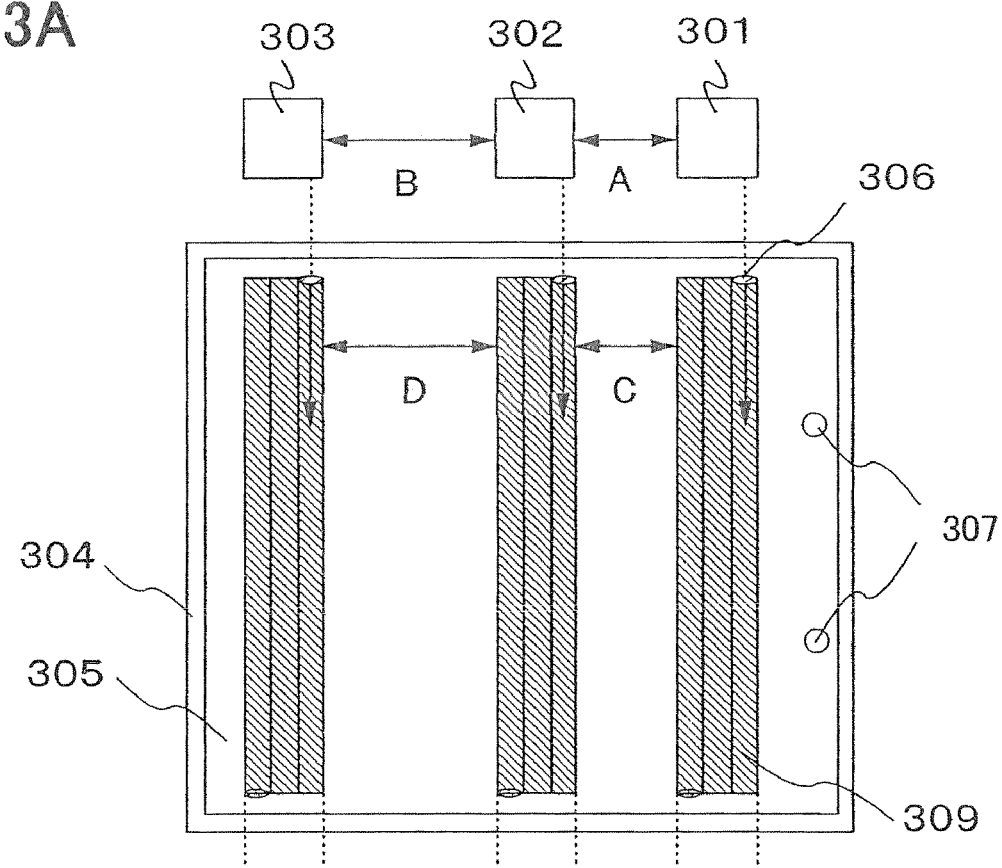
FIGS. 3A and 3B are views showing conventional art.
Figure 3B:
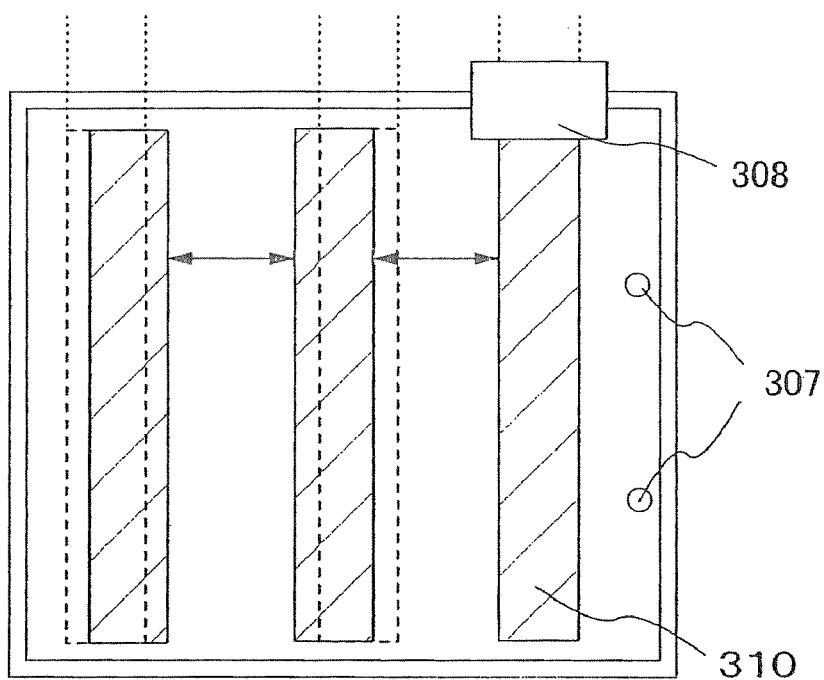

After detecting the large grain size region, light-exposure is conducted by a light source for light-exposure 208 as shown in FIGS. 2A and 2B. In the same manner as in Embodiment Mode, the laser 205, the optical sensor 206, and the light source for light-exposure 208 are integrated with each other. In addition, although laser is emitted from an angle with respect to the irradiated surface, an irradiation direction is not limited to an angle. Laser may be emitted from a direction perpendicular to the irradiated surface.

Thus, light-exposure is conducted to a large grain size region in the whole surface of the substrate and then various steps are conducted, whereby a TFT can be manufactured in the large grain size region.

By using the invention, a light-exposure position of a light source for light-exposure can be made to coincide with a large grain size region formed by laser irradiation. Therefore, (1) a marker is not required and a step of forming a marker is not required, (2) characteristics of a semiconductor device is high and variation of characteristics is reduced when the semiconductor device is manufactured using a semiconductor film exposed to light since light-exposure can be conducted in accordance with a large grain size region.

This embodiment can be freely combined with embodiment mode and another embodiment. Although an example of detecting a large grain size region and a poorly crystalline region using laser is shown in this embodiment, the invention is not limited to laser, and a blue light used in embodiment mode can be used.

Although the position of a large grain size region is detected by obtaining scattering intensity in this embodiment, the position of the large grain size region may be detected by the intensity of reflected light.

Embodiment 2

In this embodiment, a process of manufacturing a CMOS transistor using a p-channel and an n-channel TFT manufactured by using the invention is explained with reference to drawings.

Figure 8A:
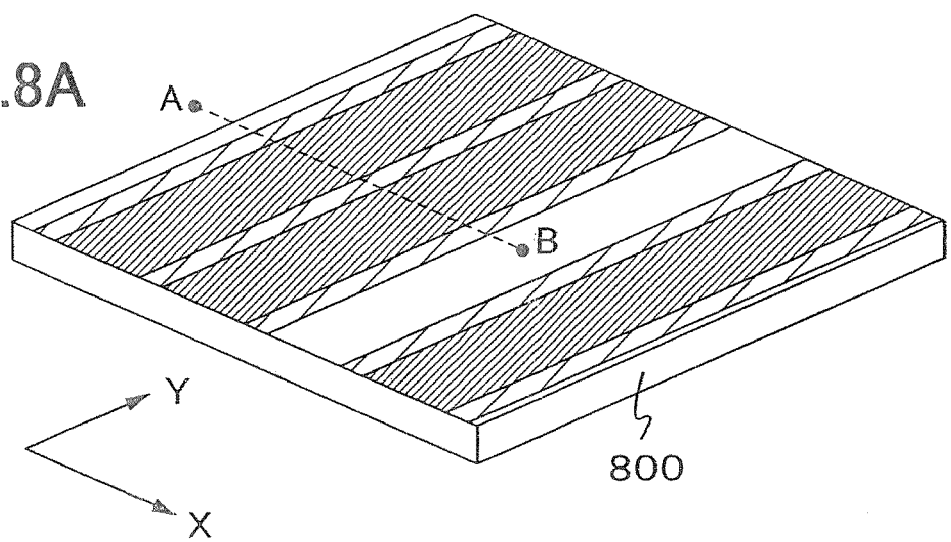
FIGS. 8A to 8D are explanatory view of a method for manufacturing a semiconductor device using the invention.

FIG. 8A shows a state just after laser irradiation is conducted with a plurality of laser irradiation apparatuses with respect to an amorphous semiconductor film 802 formed over a substrate 800. Hereinafter, a manufacturing process viewed from a cross section taken along a dotted line A-B in this drawing is explained.

Figure 8B:
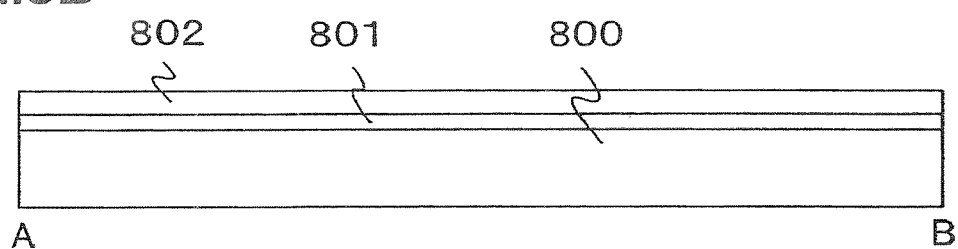

As shown in FIG. 8B, a base film 801 is tuned over a substrate 800 having an insulating surface. In this embodiment, a glass substrate is used as the substrate 800. As the substrate used here, a glass substrate formed of barium borosilicate glass, aluminoborosilicate glass, or the like, a quartz substrate, a ceramic substrate, a stainless steel substrate, or the like can be used. Moreover, although a substrate formed from synthetic resin typified by acrylic or plastic such as PET (Polyethylene Terephthalate), PES (Polyethersulfone resin), or PEN (Polyethylene Naphthalate) tends to have lower heat resistance temperature than that of the other substrates, the substrate formed from synthetic resin can be used if the substrate can resist a process of this step.

The base film 801 is provided in order to prevent an alkaline earth metal or an alkali metal such as Na included in the substrate 800 from diffusing into a semiconductor and from causing an adverse effect on the characteristic of a semiconductor element. Therefore, the base film is formed from an insulating film such as a silicon oxide film, a silicon nitride film, or a silicon nitride film containing oxygen, which can suppress the diffusion of an alkaline earth metal and an alkali metal into the semiconductor. The base film 801 may have either a single-layer or a stacked-layer structure. In the present embodiment, a silicon nitride film containing oxygen is formed in 10 to 400 nm thick by a plasma CVD method (Chemical Vapor Deposition).

In the case of using a substrate containing even a small amount of an alkali metal or an alkaline earth metal such as a glass substrate or a plastic substrate as the substrate 800, it is effective to provide the base film in order to prevent the diffusion of the impurity. However, when a quartz substrate is used, which does not lead a severe problem of impurity diffusion, the base film 801 is not necessarily provided.

Next, an amorphous semiconductor film 802 is formed over the base film 801 in 25 to 100 nm thick (preferably, 30 to 60 nm) by a known method (a sputtering method, an LPCVD method, a plasma CVD method, or the like). Silicon, silicon germanium, or the like can be used as the amorphous semiconductor film used herein. Silicon is used in this embodiment. In the case of using silicon germanium, the concentration of germanium is preferably in the range of approximately 0.01 to 45 atomic %.

Figure 8C:
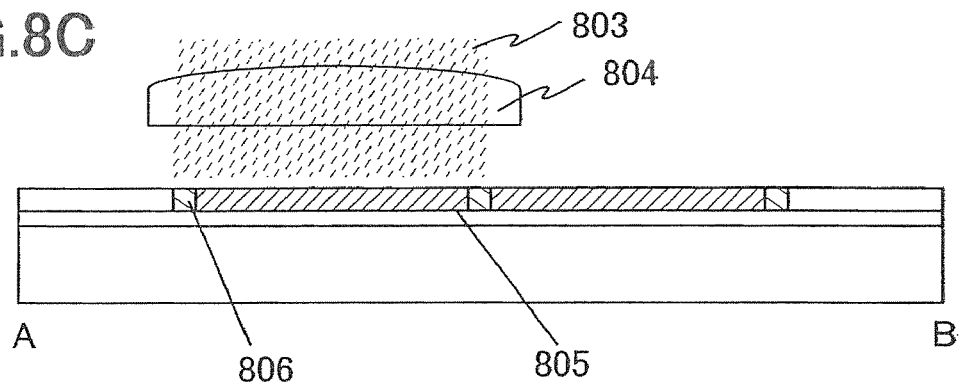

Subsequently, the amorphous semiconductor film 802 is crystallized by irradiation with a laser beam 803 using a laser annealing apparatus as shown in FIG. 8C. In this embodiment, the laser beam 803 is emitted from a CW ceramic YAG laser. By adding plural kinds of dopants such as Nd and Yb into a laser crystal of a ceramic YAG, multiple wavelength oscillation is achieved. The central wavelength of the fundamental wave of this laser ranges from 1030 to 1064 mu and the full width at half maximum of the oscillation wavelength is approximately 30 nm. This fundamental wavelength is converted into a second harmonic wave by a non-linear optical crystal inside the laser oscillator. This second harmonic wave has a central wavelength ranging from 515 to 532 nm and a full width at half maximum of approximately 15 nm. The laser beam is condensed by a cylindrical lens 804 to be emitted.

In addition to the above-mentioned laser oscillators, a laser oscillator including a crystal of sapphire, YAG, ceramic YAG, ceramic $Y_2O_3$, KGW, KYW, $Mg_2SiO_4$, YLF, $YVO_4$, or $GdVO_4$, which is doped with one or more selected from Nd, Yb, Cr, Ti, Ho, or Er, can be used. It is preferable to use a laser crystal doped with a plurality of dopants in order to widen an oscillation wavelength range. Some lasers can oscillate multiple wavelengths with one kind of dopant like a Ti: sapphire laser. The laser 803 is converted into a harmonic wave by a known non-linear optical element. Although the laser beam 803 is converted into the second harmonic wave by the non-linear optical element in this embodiment, harmonic waves other than the second harmonic wave are also applicable.

By using the above method, a large grain size region 805 with a crystal grain grown continuously in the scanning direction and a poorly crystalline region 806 are formed. It is to be noted that a laser irradiation is conducted in a Y direction in FIG. 8A. That is, a laser irradiation is conducted in the direction perpendicular to a paper in FIG. 8C.

Figure 8D:
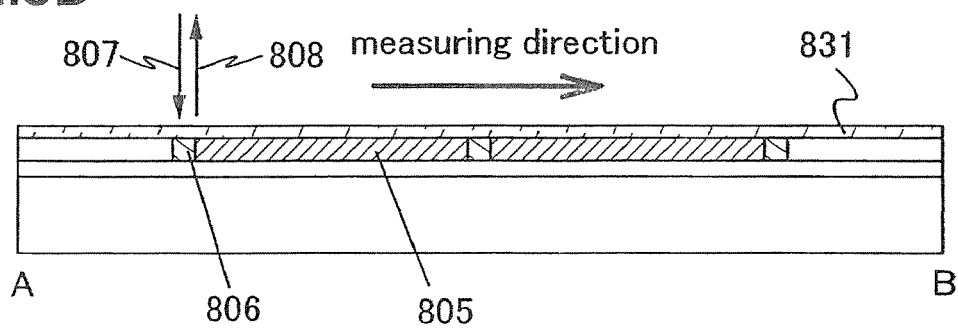

Thereafter, in FIG. 8D, after forming a resist 831, in the same manner as in embodiment mode or Embodiment 1, light with a wavelength shorter than one of blue light or a laser light 807 is emitted from above the resist 831 to a poorly crystalline region 806 and a large grain size region 805 formed by laser beam irradiation and a reflected light 808 is measured, thereby obtaining scattered light intensity. The light 807 may be a laser light. It is to be noted that the material or the like of the resist 831 is not limited in particular if the blue light can be transmitted to the resist 831 to the degree that the large grain size region 805 and the poorly crystalline region 806 can be distinguished from each other. The position of the large grain size region 805 is detected by the measurement result of this scattered light. When a light source for light-exposure, a light source of the light 807, and a sensor observing the reflected light 808 are integrated with each other, the position of the light source for light-exposure can be made to coincide with the large grain size region 805 while the measurement is conducted.

Figure 9A:
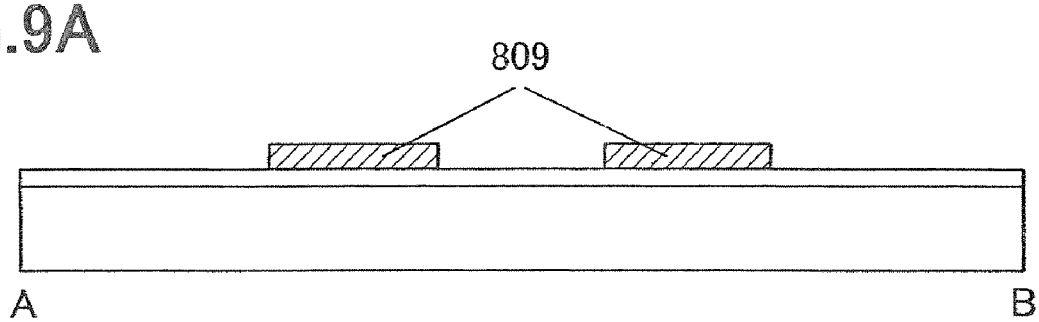
FIGS. 9A to 9C are explanatory view of a method for manufacturing a semiconductor device using the invention.
Figure 9B:
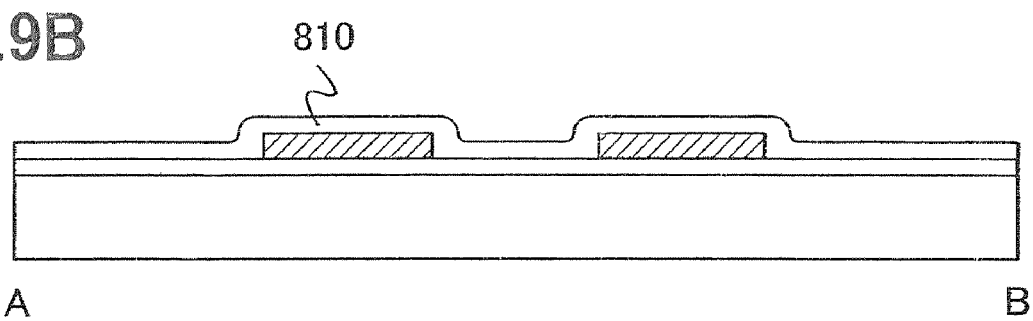

If the position of the light source for light-exposure coincides with the position of the large grain size region 805, light-exposure can be conducted in accordance with the position of the large grain size region. Further, the resist 831 to which light is exposed is molded in a desired shape to conduct etching using the molded resist 831 as a mask, thereby forming a semiconductor film 809 to have an island shape (FIG. 9A). An insulating film 810 is formed so as to cover this island-like semiconductor film (FIG. 9B).

The gate insulating film 810 can be formed by a thermal oxidation method, a plasma CVD method, or a sputtering method. For example, the gate insulating film 810 may be formed of a stacked film including a silicon oxide film with a thickness of 5 nm obtained by a thermal oxidation method and a silicon oxide film containing nitrogen with a thickness of 10 to 15 nm obtained by a CVD method by switching gas. The films can be continuously farmed by switching gas.

A material of the gate insulating film 810 is not limited to the above-described material, and the material of the gate insulating film 810 can be (1) a silicon oxide film, a silicon nitride film containing oxygen, a silicon oxide film containing nitrogen, a silicon nitride film, or a stacked film of these, or (2) a high dielectric constant material (also referred to as a high-k material) such as a tantalum oxide, a hafnium oxide ($HfO_2$), hafnium silicon oxynitride (HfSiON), a zirconium oxide ($ZrO_2$), or an aluminum oxide ($Al_2O_3$); or a rare-earth oxide such as a lanthanum oxide ($La_2O_2$).

Figure 9C:
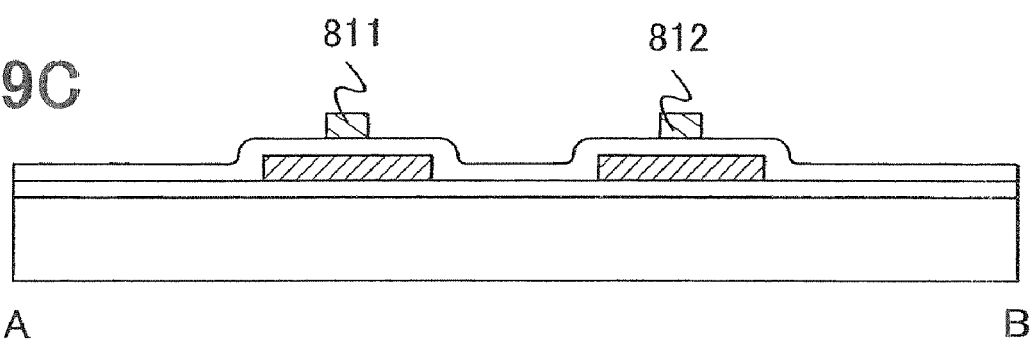

Next, a conductive film is formed over the gate insulating film 810 and shaped desirably to form gate electrodes 811 and 812 as shown in FIG. 9C as outlined below. First, a conductive film formed over the gate insulating film 810 may be formed from a material having conductivity. As the material, an element selected from gold (Au), silver (Ag), copper (Cu), platinum (Pt), aluminum (Al), molybdenum (Mo), tungsten (W), or titanium (Ti), or an alloy material or a compound material containing these elements as its main component can be used. Furthermore, a stacked material of these materials can be used. Although a stacked film of W (tungsten) and TaN (tantalum nitride) is used in this embodiment, a conductive film formed by stacking Mo (molybdenum), Al (aluminum), and Mo in this order using Al and Mo or a conductive film formed by stacking Ti (titanium), Al, and Ti in this order using Ti and Al may also be used. In particular, in the case where the gate insulating film 810 is formed from the high dielectric constant material (high-k material) which is described above, depletion of the gate electrode can be reduced and a large amount of current can be flowed, so that lower power consumption of a semiconductor element can be achieved.

Then, a resist mask for patterning this conductive film is formed. First, the conductive film is coated with photoresist by a spin coating method or the like and light-exposure is conducted. Next, heat treatment (prebake) is conducted to the photoresist. The temperature for the prebake is set in the range of 50 to 120° C., which is lower than the temperature for postbake to be conducted later. In this embodiment, the heat temperature is set to 90° C. and the heat time is set to 90 seconds.

Next, the resist which has been exposed to light is developed by dropping a developing solution onto the photoresist or spraying the developing solution from a spray nozzle thereon.

Thereafter, a so-called postbake that heat treatment is conducted to the developed photoresist at 125° C. for 180 seconds is conducted so that moisture or the like remaining in the resist mask is removed and the stability against the heat is increased at the same time. By these steps, a resist mask is formed. With this resist mask, the conductive film is etched to form the gate electrodes 811 and 812.

As another method, a droplet discharging method typified by a printing method or an ink jet method capable of discharging a material at a predetermined position can be used to form the gate electrodes 811 and 812 directly on the gate insulating film 810.

A conductive material is dissolved or dispersed into a medium, thereby forming a liquid substance having conductivity to be discharged. As the conductive material which can be used here, at least one element selected from gold (Au), silver (Ag), copper (Cu), platinum (Pt), aluminum (Al), chromium (Cr), palladium (Pd), indium (In), molybdenum (Mo), nickel (Ni), lead (Pd), iridium (Ir), rhodium (Rh), tungsten (W), cadmium (Cd), zinc (Zn), iron (Fe), titanium (Ti), zirconium (Zr), or barium (Ba), or an alloy of these metals can be used. The solvent may be an organic solvent, for example, esters such as butyl acetate or ethyl acetate; alcohols such as isopropyl alcohol or ethyl alcohol; methyl ethyl ketone; or acetone.

The viscosity of a composition is 300 cp or less in order to prevent drying and to facilitate the discharging of the composition from a discharge outlet. The viscosity and the surface tension of the composition may be appropriately adjusted in accordance with the solvent and the intended purpose.

Figure 10A:
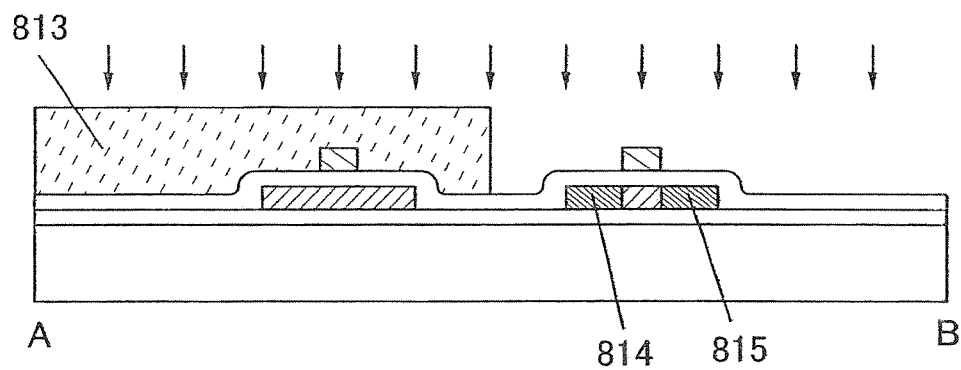
FIGS. 10A to 10D are explanatory view of a method for manufacturing a semiconductor device using the invention.
Figure 10B:
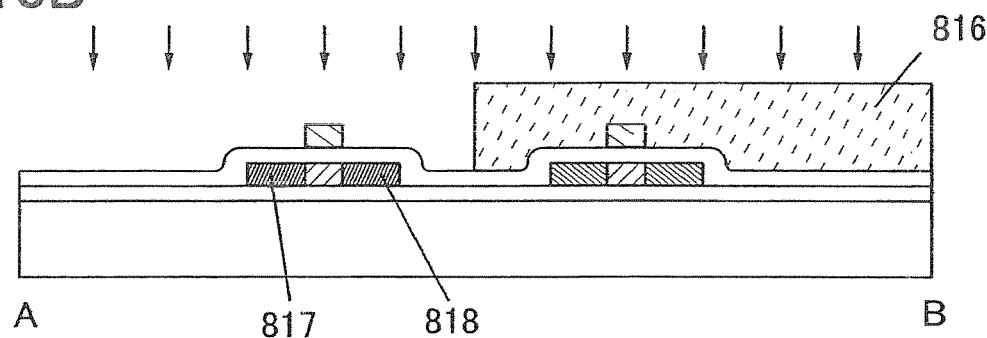

After that, a portion where a p-channel TFT is formed is covered with a resist 813 which is used when the gate electrode 811 or the gate electrode 812 is formed as a mask, and arsenic (As) or phosphorus (P) of an N-type conductivity is introduced to the portion. By the process, a source region 814 and a drain region 815 are formed (FIG. 10A). Similarly, a source region 817 and a drain region 818 are formed by covering a portion where an n-channel TFT is formed with a resist 816 and introducing boron (B) which is a P-type impurity to the portion (FIG. 10B).

Figure 10C:
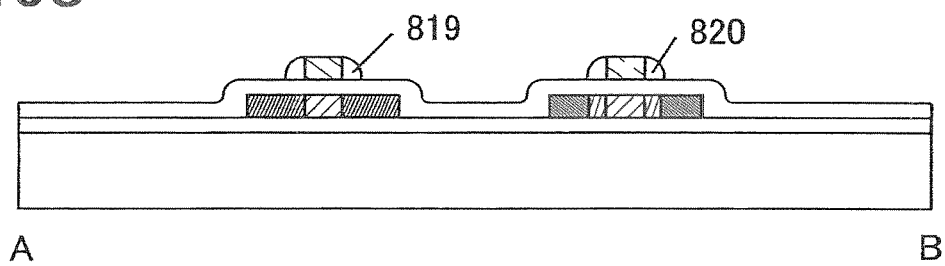

Then, sidewalls 819 and 820 are formed on the sidewalls of the gate electrodes 811 and 812. For example, an insulating film formed from silicon oxide is formed over a whole surface of the substrate by a CVD method. The sidewall may be formed by conducting anisotropic etching with respect to the insulating film (FIG. 10C).

Figure 10D:
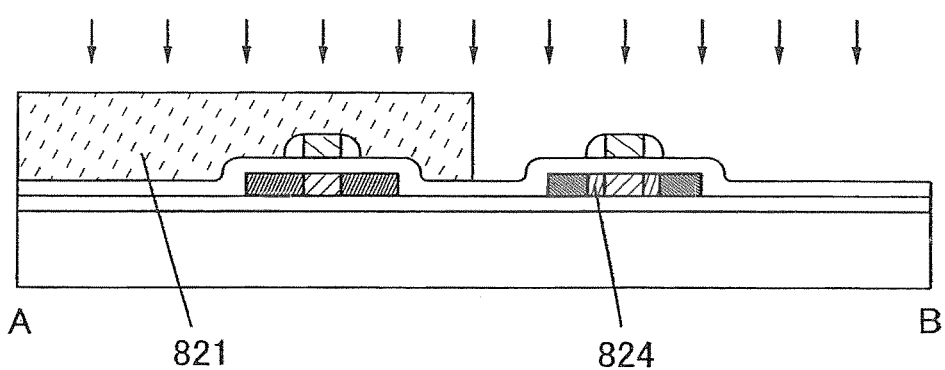
Figure 11A:
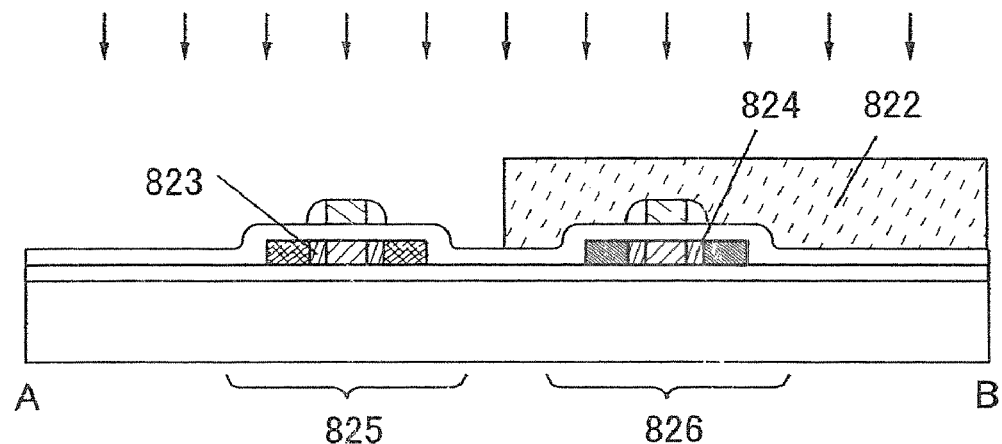
FIGS. 11A to 11C are explanatory view of a method for manufacturing a semiconductor device using the invention.

Then, as shown in FIG. 10D, a portion to be a P-type TFT is covered with a resist 821 and ion which shows N-type conductivity is introduced to form a LDD region 824. It is to be noted that ion which shows N-type conductivity is introduced at higher dose amount than the above step. Similarly, as shown in FIG. 11A, a portion to be an N-type TFT is covered with a resist 822 and ion which shows P-type conductivity is introduced to form a LDD region 823. Also in this step, ion which shows P-type conductivity is introduced at higher dose amount than the above step.

As described above, treatment is conducted by laser annealing, lamp annealing, or furnace annealing after completing impurity introduction to activate introduced impurity and to recover damage of crystal lattice due to impurity introduction.

According to the above step, a p-channel TFT 825 and an n-channel TFT 826 can be formed over the same substrate.

Figure 11B:
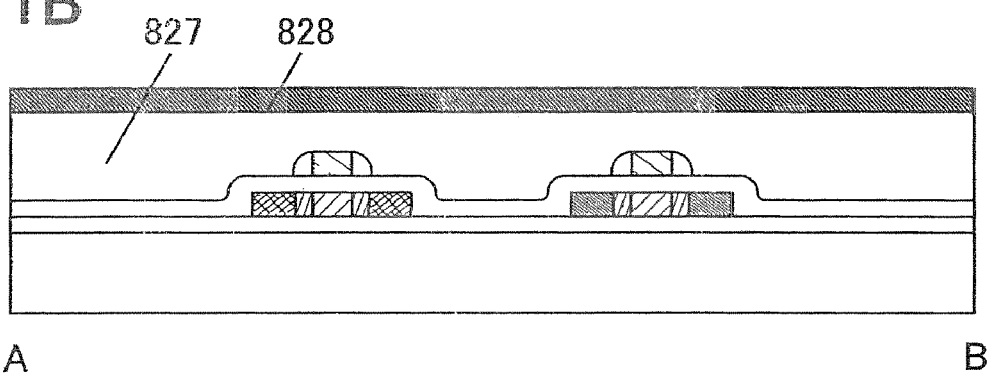

Subsequently, as shown in FIG. 11B, an insulating film 827 is formed as a protective film of those Mts. This insulating film 827 is formed in a single-layer or a stacked-layer structure of a silicon nitride film or a silicon nitride film containing oxygen in 100 to 200 nm thick by a plasma CVD method or a sputtering method. In the case of combining a silicon nitride film containing oxygen and a silicon oxide film containing nitrogen, these films can be formed continuously by switching gas. In this embodiment, a silicon oxide film containing nitrogen is formed in 100 nm thick by a plasma CVD method. By providing the insulating film 827, a blocking effect to block the intrusion of various ionic impurities and oxygen and moisture in the air can be obtained.

Next, an insulating film 828 is further formed. Here, an organic resin film such as polyimide, polyamide, BCB (benzocyclobutene), acrylic, or siloxane (a substance in which a skelton structure is composed of a bond of silicon and oxygen and which has a structure in which silicon is bonded with at least one of fluorine, aliphatic hydrocarbon, and aromatic hydrocarbon); an inorganic interlayer insulating film (an insulating film containing silicon such as silicon nitride or silicon oxide); a low-k (low dielectric constant) material; or the like can be used. Since the insulating film 828 is formed mainly for the purpose of relaxing and flattening the depression/projection due to the TFTs fixated over the glass substrate, a film being superior in flatness is preferable for the insulating film 828.

Moreover, the gate insulating film 810 and the insulating films 827 and 828 are patterned by a photolithography method to form contact holes which reach the source regions 814 and 817 and the drain region 815 and 818.

Figure 11C:
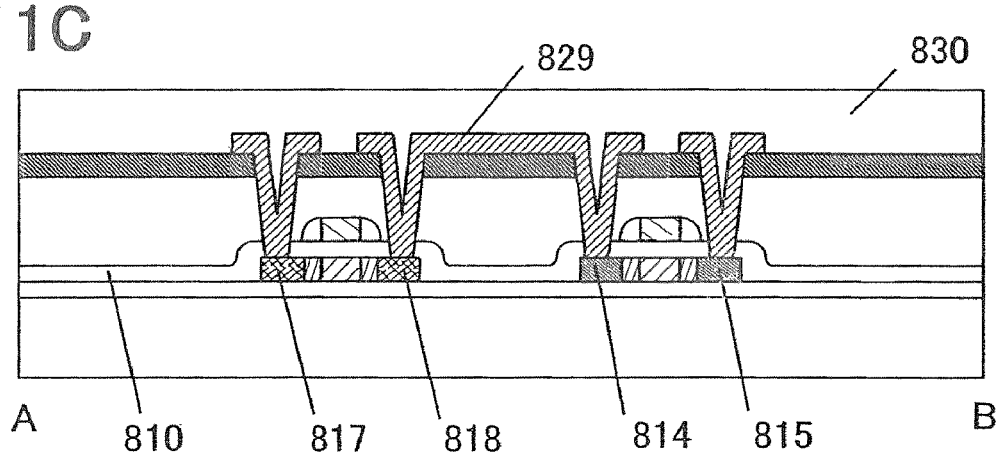

Next, a conductive film is formed from a conductive material, and a wiring 829 is formed by patterning the conductive film. After that, an insulating film 830 is formed as a protective film, thereby completing a semiconductor device shown in FIG. 11C.

The method for manufacturing the semiconductor device of the invention is not limited to the above-described manufacturing process of the TH. This embodiment shows a process of manufacturing a CMOS transistor. However, the present invention can be used in the case of forming one or both of an N-type TFT and a P-type TFT over the substrate. Although a staggered TFT is manufactured in this embodiment, the present invention is not limited to this and can be used in the case of manufacturing an inversely staggered TFT.

Before the crystallization step by laser beam, a crystallization step using a catalytic element may be provided. As the catalyst element, an element such as nickel (Ni), germanium (Ge), iron (Fe), palladium (Pd), tin (Sn), lead (Pb), cobalt (Co), platinum (Pt), copper (Cu), or gold (Au) can be used. It is to be noted that the crystallization may be conducted in such a way that the heat treatment is performed in order to promote the crystallization after the catalytic element is added. Alternatively, the heat treatment may be omitted. Further, after the heat treatment, the laser treatment may be conducted while keeping the temperature. After these steps, light-exposure can be favorably conducted to a portion of a large grain size region using the invention.

The method for manufacturing the semiconductor device using the invention can be used for a method for manufacturing an integrated circuit or a semiconductor display device.

By using the invention, light-exposure position can be made to coincide with a portion of a large grain size region with high crystallinity. Therefore, the characteristics of all of TFTs manufactured using the invention are high and the characteristics of each of the TFTs are uniform.

This embodiment can be freely combined with embodiment mode or another embodiment.

Embodiment 3

In this embodiment, a light emitting device using a light emitting element formed by using a TFT manufactured in another embodiment and an example of manufacturing the light emitting device are explained. The light emitting device which will be explained in this embodiment has a structure in which light is extracted from a substrate (hereinafter, referred to as opposing substrate) side which is opposed to a substrate having an insulating surface; however, the present invention is not limited to this structure and can be similarly used for a light emitting device having a structure in which light is extracted from a substrate side having an insulating surface, or a light emitting device having a structure in which light is extracted from both sides of a substrate side having an insulating surface and an opposing substrate side.

Figure 12:
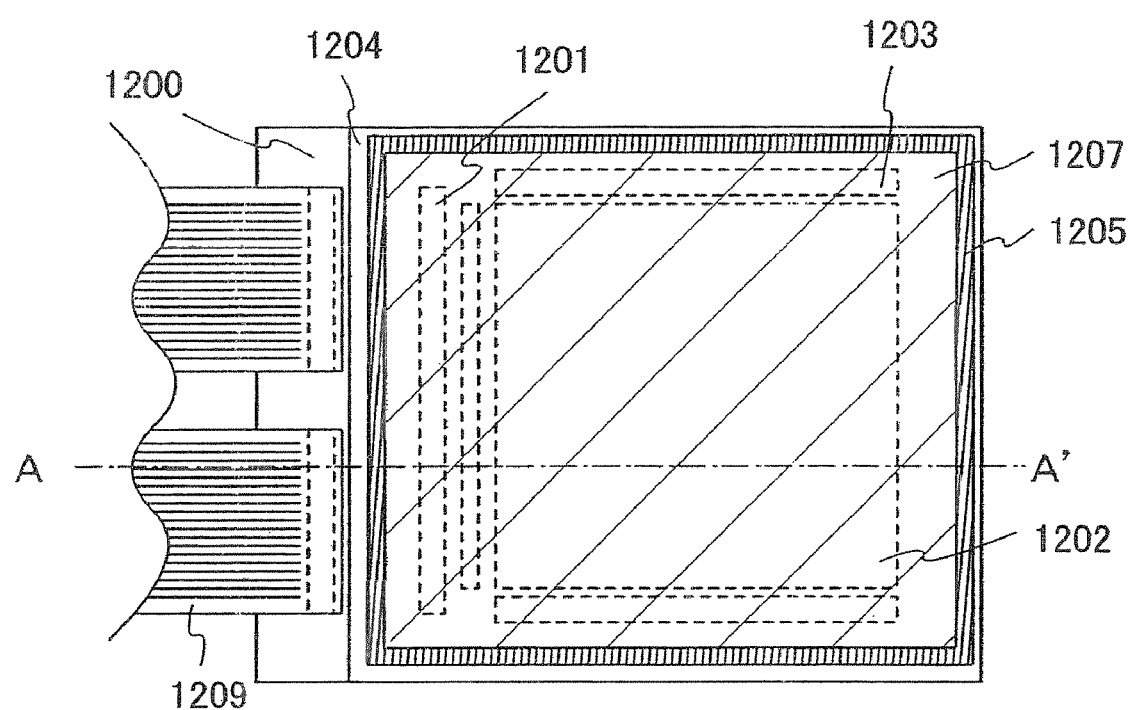
FIG. 12 is an explanatory view showing an outline of a display device manufactured by using the invention.
Figure 13:
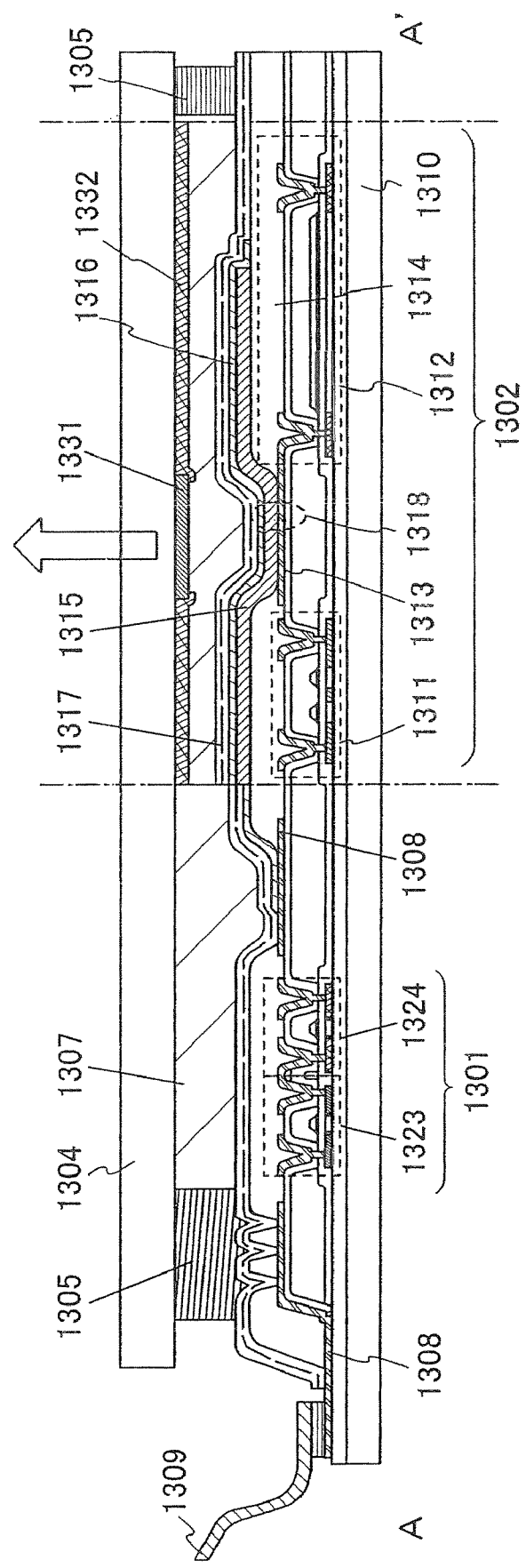
FIG. 13 is an explanatory view showing an outline of a display device manufactured by using the invention.

FIG. 12 is a top view of the light emitting device and FIG. 13 is a cross-sectional view taken along A-A' of FIG. 12. Reference numeral 1200 denotes a substrate. Reference numeral 1201 denotes a source signal line driver circuit; 1202, a pixel portion; and 1203, a gate signal line driver circuit, all of which are illustrated with a dotted line. Moreover, reference numeral 1204 denotes a transparent sealing substrate; and 1205, a first sealing material. The inside surrounded by the first sealing material 1205 is filled with a second sealing material 1207 which is transparent. The first sealing material 1205 contains a gap material for holding an interval between the substrates.

Reference numeral 1208 denotes a connection wire for sending a signal which will be inputted into the source signal line driver circuit 1201 and the gate sip al line driver circuit 1203 and for receiving a video signal or a clock signal from an FPC (flexible printed circuit) 1209 to be an external input terminal. Although only the FPC is illustrated here, this FPC may have a printed wiring board (PWB) attached thereto.

Next, the cross-sectional structure is described with reference to FIG. 13. Although a driver circuit and a pixel portion are formed over a substrate 1310, a source signal line driver circuit 1301 and a pixel portion 1302 are shown here as the driver circuit.

In the source signal line driver circuit 1301, a CMOS circuit is formed by combining an n-channel TFT 1323 and a p-channel TFT 1324 with each other. Moreover, TFTs for forming the driver circuit may be formed of a known CMOS circuit, PMOS circuit, or NMOS circuit. Although this embodiment shows a driver-integrated type in which the driver circuit is formed over the substrate, the present invention is not limited to this and the driver circuit may be formed outside the substrate, not over the substrate. Moreover, the structure of the TFT which uses a poly-silicon film as an active layer is not limited in particular, and both of a top-gate TFT and a bottom-gate TFT are applicable.

Moreover, the pixel portion 1302 is formed by a plurality of pixels each including a switching TFT 1311, a current control TFT 1312, and a first electrode (anode) 1313 which is electrically connected to a drain of the current control TFT 1312. The current control TFT 1312 may be either an n-channel TFT or a p-channel TFT; however, the current control TFT 1312 is preferably a p-channel TFT in the case of being connected to the anode. Moreover, a storage capacitor (not shown) is preferably provided as appropriate. Here, only the cross-sectional structure of one pixel among an infinite number of pixels arranged is shown and two TFTs are used in the one pixel; however, three or more TFTs may be appropriately used.

Since the first electrode (anode) 1313 is in direct contact with a drain of the TFT here, it is desirable that a lower layer of the first electrode (anode) 1313 be formed from a material making an ohmic contact with the drain fowled from silicon and an uppermost layer to be in contact with a layer containing an organic compound be formed from a material having a high work function. The first electrode (anode) desirably has a work function of 4.0 eV or more. For example, when the first electrode is formed in a three-layer structure of a titanium nitride film, a film containing aluminum as its main component, and a titanium nitride film, the resistance as a wiring can be made to be low, favorable ohmic contact can be made, and the first electrode can function as an anode. Moreover, the first electrode (anode) 1313 may be formed in a single-layer structure of ITO (indium tin oxide), ITSO (indium oxide to which silicon oxide ($SiO_2$) is mixed for 2 to 20 atomic %), gold (Au), platinum (Pt), nickel (Ni), tungsten (W), chromium (Cr), molybdenum (Mo), iron (Fe), cobalt (Co), copper (Cu), palladium (Pd), or zinc (Zn), or nitride of a metal material (titanium nitride or the like). Alternatively, the first electrode may be formed by stacking three or more layers.

Moreover, an insulator (also referred to as a bank, a partition wall, a barrier wall, an embankment, or the like) 1314 is formed at opposite ends of the first electrode (anode) 1313. The insulator 1314 may be formed of an organic resin film or an insulating film containing silicon. Here, an insulator having a shape shown in FIG. 13 is formed as the insulator 1314 by using a positive photosensitive acrylic resin film.

In order to conduct subsequent film formation favorably, the insulator 1314 is made to have a curved surface having a curvature at its upper edge portion or lower edge portion. For example, in the case of using a positive photosensitive acrylic as a material of the insulator 1314, it is preferable that only the upper edge portion of the insulator 1314 have a curved surface having a radius of curvature (0.2 to 3 μm). Moreover, as the insulator 1314, either a negative type which becomes insoluble in etchant by photosensitive light or a positive type which becomes soluble in etchant by light can be used.

The insulator 1314 may be covered with an aluminum nitride film, an aluminum nitride oxide, a thin film containing carbon as its main component, or a protective film formed of a silicon nitride film.

Next, an electroluminescent layer 1315 is formed. As a material for forming the electroluminescent layer 1315, a low molecular weight material, a high molecular weight material, and a medium molecular (an intermediate molecular) weight material having an intermediate property between the high molecular weight material and the low molecular weight material are given. In this embodiment, since the electroluminescent layer 1315 is formed by a vapor deposition method, the low molecular weight material is used. Both of the low molecular weight material and the high molecular weight material can be applied by spin-coating method or an ink-jet method when the material is dissolved in a solvent. Further, not only an organic material but also a composite material including an organic material and an inorganic material can be used.

Moreover, the electroluminescent layer 1315 is selectively formed over the first electrode (anode) 1313. For example, the evaporation is conducted in a deposition chamber which is evacuated to the degree of vacuum decreases to 0.7 Pa or less, preferably $1.3 \times 10^{-2}$ to $1.3 \times 10^{-4}$ Pa. At the evaporation, the organic compound is vaporized in advance by being heated, and the vaporized organic compound is deposited to form the electroluminescent layer 1315 (the electroluminescent layer 1315 is formed by stacking sequentially a hole injecting layer, a hole transport layer, a light emitting layer, an electron transport layer, and an electron injecting layer from the first electrode side). Instead of such a stacked-layer structure, the electroluminescent layer 1315 may have a single-layer structure or a mixed-layer structure. Moreover, a second electrode (cathode) 1316 is fowled over the electroluminescent layer 1315.

As the second electrode 1316 (cathode), it is preferable to use metal, alloy, an electrically conductive compound, a mixture of these, or the like each having a low work function (an appropriate indication is a work function of 3.8 eV or less). Specifically, the second electrode 1316 (cathode) can be formed from an element which belongs to Group 1 or Group 2 in the periodic table, namely an alkali metal such as Li, Rb, or Cs or an alkaline earth metal such as Mg, Ca or Sr; alloy including these such as Mg:Ag or Al:Li; a compound such as LiF, CsF, or $CaF_2$; or a transition metal including a rare-earth metal (such as Yb). However, in order to give the second electrode (cathode) a light-transmitting property in this embodiment, the second electrode is formed by forming these metals or the alloy including these metals extremely thinly and by stacking together with ITO, IZO, ITSO, or another metal (including alloy).

Here, the second electrode (cathode) 1316 is formed of a stacked layer of a thin metal film with a thin film thickness having a low work function and a transparent conductive film (such as ITO, IZO, or ZnO) so that the emitted light passes through the second electrode 1316. In this way, an electroluminescent element 1318 including the first electrode (anode) 1313, the electroluminescent layer 1315, and the second electrode (cathode) 1316 is formed.

In this embodiment, the electroluminescent layer 1315 is formed by sequentially stacking Cu—Pc in 20 nm thick as a hole injecting layer, α-NPD in 30 nm thick as a first light emitting layer having a hole transporting property, a substance in 20 nm thick in which Pt(ppy)acac is added with 15 wt % into CBP (4,4'-N,N'-dicarbazol-biphenyl) as a second light emitting layer, and BCP (2,9-dimethyl-4,7-diphenyl-1,10-phenanthrolin) in 30 nm thick as an electron transport layer. Since a metal thin film having a low work function is used as the second electrode (cathode) 1316, an electron injecting layer (calcium fluoride) is unnecessary here.

The electroluminescent element 1318 formed thus exhibits white emission. In order to achieve full color, a color filter including a colored layer 1331 and light shielding layer (BM) 1332 (an overcoat layer is not shown here for simplicity) is provided.

Moreover, a transparent protective layer 1317 is formed to seal the electroluminescent element 1318. The transparent protective layer 1317 is formed of a stacked layer of a first inorganic insulating film, a stress relaxing film, and a second inorganic insulating film. The first inorganic insulating film and the second inorganic insulating film can be formed of a silicon nitride film, a silicon oxide film, a silicon nitride film containing oxygen, a silicon oxide film containing nitrogen, or a thin film containing carbon as its main component (for example, a DLC film or a CN film) formed by a sputtering method or a CVD method. These inorganic insulating films have a high blocking effect against moisture; however, the inorganic insulating films are easier to be peeled as the film becomes thicker because the film stress increases.

However, when the stress relaxing film is interposed between the first inorganic insulating film and the second inorganic insulating film, moisture can be absorbed as well as the stress can be relaxed. Even through a microscopic hole (such as a pinhole) is formed in the first inorganic insulating film from any cause during forming the film, the stress relaxing film can cover the hole, and extremely high blocking effect can be obtained against moisture or oxygen by providing the second inorganic insulating film thereover.

The stress relaxing film is preferably formed from a moisture-absorbing material which has smaller stress than the inorganic insulating film. Moreover, the stress relaxing film desirably has a light-transmitting property. Further, a material film containing an organic compound such as α-NPD, BCP, MTDATA, $Alq_3$, or the like may be used as the stress relaxing film. These material films have a moisture-absorbing property and are almost transparent if the films are thin. Moreover, since MgO, $SrO_2$, and SrO have a moisture-absorbing property and a light-transmitting property and can be formed into a thin film by a vapor deposition method, these materials can be used for the stress relaxing film.

In this embodiment, a film formed by using a silicon target in an atmosphere containing nitrogen and argon, that is, a silicon nitride film having a high blocking effect against impurities such as moisture and an alkali metal is used as the first inorganic insulating film or the second inorganic insulating film, and a thin film of $Alq_3$ by a vapor deposition method is used as the stress relaxing film. The total film thickness of the transparent protective layer is preferably made as small as possible to make the emitted light pass through the transparent protective layer.

Further, a sealing substrate 1304 is pasted to seal the electroluminescent element 1318 in an inert gas atmosphere with a first sealing material 1305 and a second sealing material 1307. It is preferable to use an epoxy-based resin as the first sealing material 1305 and the second sealing material 1307. Further, the first sealing material 1305 and the second sealing material 1307 are desirably materials which do not transmit moisture or oxygen as much as possible.

In this embodiment, the sealing substrate 1304 may be a glass substrate, a quartz substrate, or a plastic substrate formed from FRP (Fiberglass-Reinforced Plastics), PVF (polyvinyl fluoride), polyester, acrylic, or the like. Moreover, it is possible to seal with a third sealing material so as to cover a side surface (exposed surface) after pasting the sealing substrate 1304 with the first sealing material 1305 and the second sealing material 1307.

In this way, the electroluminescent element 1318 is sealed with the first sealing material 1305 and the second sealing material 1307, thereby completely shielding the electroluminescent element 1318 from outside and preventing the intrusion of a substance promoting deterioration of the electroluminescent layer 1315 such as moisture or oxygen from outside. Therefore, a light emitting device with high reliability can be obtained.

Further, a dual-emission type light emitting device can be manufactured by using a transparent conductive film as the first electrode (anode) 1313.

This embodiment can be freely combined with embodiment mode or another embodiment. Moreover, not only the display device using the light emitting element but also a display device using a liquid crystal can be manufactured by using a semiconductor film crystallized by the invention.

Embodiment 4

Various kinds of semiconductor devices can be manufactured by using a semiconductor element manufactured by using the present invention. This embodiment describes an example of manufacturing a CPU (Central Processing Unit) and an example of configuring various circuits using a TFT as one example of a semiconductor device which is manufactured using the invention.

Figure 14A:
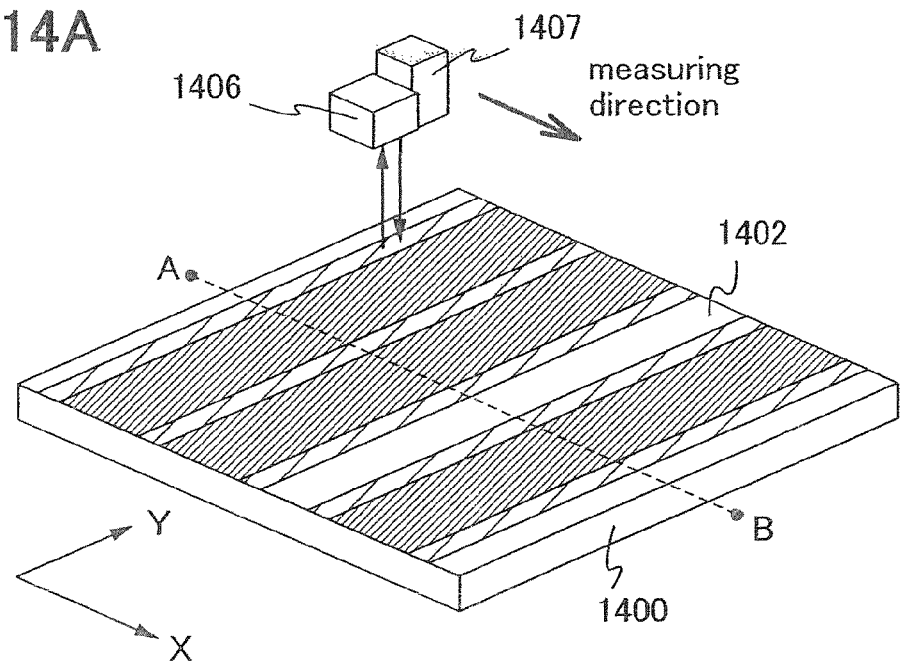
FIGS. 14A to 14D are explanatory view of a method for manufacturing a semiconductor device using the invention.

FIG. 14A shows the following state: after conducting laser irradiation using a plurality of laser irradiation apparatuses to an amorphous semiconductor film 1402 formed over a substrate 1400, light with a wavelength shorter than one of blue light is emitted to distinguish a large grain size region and a poorly crystalline region and received using a photo detector 1406. Hereinafter, a manufacturing process viewed from a cross section taken along a dotted line A-B in FIG. 14A is explained. The photo detector 1406 is integrated with a light source of blue light.

Figure 14B:
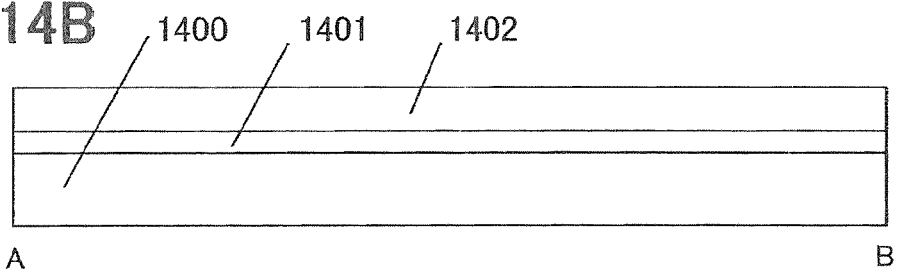

As shown in FIG. 14B, a base insulating film 1401 is fanned over a substrate 1400 having an insulating surface. The substrate 1400 may be, for example, a glass substrate formed of barium borosilicate glass, alumina borosilicate glass, or the like. In addition, although a substrate formed from a flexible synthetic resin such as acrylic or plastic typified by PET, PES, or PEN tends to have lower heat resistance temperature than the other substrates, the substrate formed from flexible synthetic resin can be used when the substrate can resist the process temperature in the manufacturing process.

The base insulating film 1401 is provided in order to prevent an alkaline earth metal or an alkali metal such as Na included in the substrate 1400 from diffusing into a semiconductor film and from causing an adverse effect on the characteristic of the semiconductor element. Therefore, the base insulating film is fanned from an insulating film of a silicon oxide, a silicon nitride, a silicon oxide containing nitrogen, or the like which can suppress the diffusion of an alkaline earth metal and an alkali metal into the semiconductor film.

Next, an amorphous semiconductor film 1402 is formed over the base insulating film 1401 in 25 to 100 nm thick (preferably, 30 to 60 nm). The amorphous semiconductor may be silicon or silicon germanium. When silicon germanium is used, it is preferable that the concentration of germanium be in the range of approximately 0.01 to 4.5 atomic %. Here, a semiconductor film containing silicon as its main component (also referred to as an amorphous silicon film or amorphous silicon) is formed in 66 nm thick.

Figure 14C:
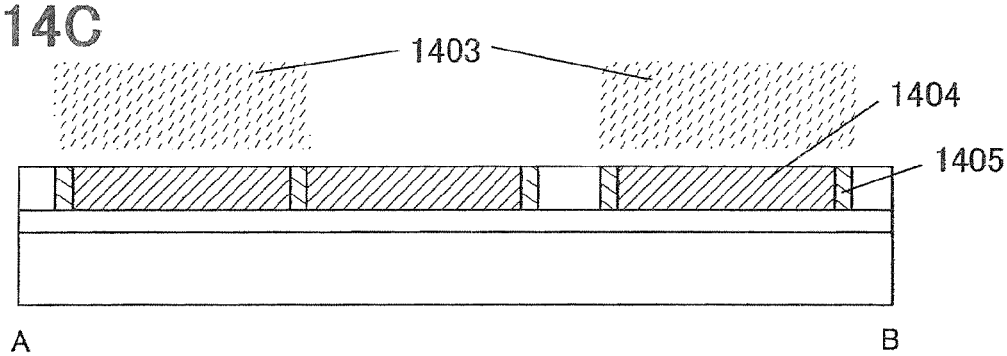

Then, as shown in FIG. 14C, laser irradiation is conducted to the amorphous semiconductor film 1402 by a plurality of lasers 1403 in the same manner as in embodiment mode or another embodiment. The amorphous semiconductor film 1402 is crystallized by this treatment, thereby forming a large grain size region 1404 and a poorly crystalline region 1405. The laser irradiation is conducted in the Y direction in FIG. 14A.

Figure 14D:
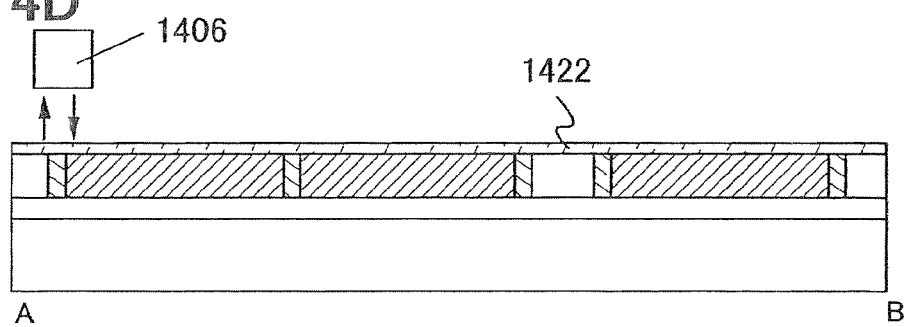

Then, as shown in FIG. 14D, a resist 1422 is formed over the amorphous semiconductor film 1402, the large grain size region 1404, and the poorly crystalline region 1405. And then, in order to determine a place where a photolithography step is conducted, blue light is emitted perpendicular to the amorphous semiconductor film and the semiconductor film having a crystalline structure from above the resist 1422 and reflected light is measured using a photo detector 1406. Scattered light intensity of the surface is obtained by the obtained reflected light to detect the large grain size region 1404. The blue light can be transmitted to the resist 1422 to the degree that the large grain size region 1404 and the poorly crystalline region 1405 can be distinguished from each other. As the photo detector 1406, a photo detector shown in another embodiment can be used. The photo detector 1406 is integrated with a light source of blue light.

Figure 15A:
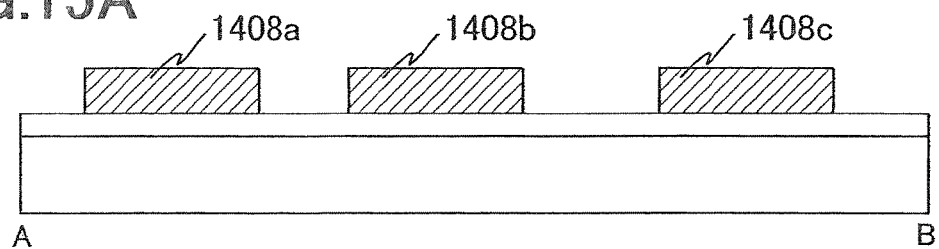
FIGS. 15A to 15E are explanatory view of a method for manufacturing a semiconductor device using the invention.

Next, as shown in FIG. 15A, after detecting the position of the large grain size region 1404, a light source for light-exposure 1407 is made to coincide with the position of the large grain size region 1404 to conduct light-exposure, then a resist 1402 is formed in a predetermined shape, thereby obtaining island-like semiconductor films 1408a to 1408c by etching. When the light source for light-exposure 1407 and the photo detector 1406 are integrated with each other, the light source for light-exposure 1407 can be made to coincide with the large grain size region 1404 while measuring.

Next, if necessary, a small amount of impurity elements (such as boron) is added to make the threshold which is an electric characteristic of a thin film transistor closer to zero.

Figure 15B:
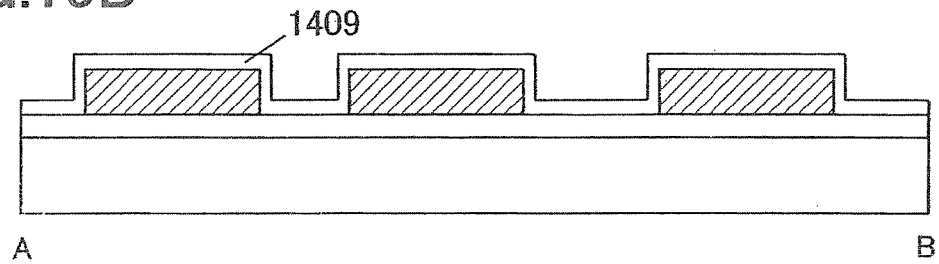

Next, an insulating film which is to cover the island-like semiconductor films 1408a to 1408c, which is a so-called gate insulating film 1409, is formed as shown in FIG. 15B. Before forming the gate insulating film 1409, the surfaces of the island-like semiconductor films are washed with fluorine acid or the like. The gate insulating film 1409 is formed of an insulating film containing silicon in 10 to 150 nm thick, preferably 20 to 40 nm, by a thermal oxidation method, a plasma CVD method, or a sputtering method.

The gate insulating film 1409 is not limited to the above-described material, and the material can be (1) a silicon oxide film, a silicon nitride film containing oxygen, a silicon oxide film containing nitrogen, a silicon nitride film, or a stacked film of these, or (2) a high dielectric constant material (also referred to as a high-k material) such as a tantalum oxide, a hafnium oxide ($HfO_2$), a hafnium silicon oxynitride (Hf-SiON), a zirconium oxide ($ZrO_2$), or an aluminum oxide ($Al_2O_3$); or a rare-earth oxide such as a lanthanum oxide ($La_2O_2$). Further, in the case of employing a stacked layer of a silicon nitride film containing oxygen and a silicon oxide film containing nitrogen as the gate insulating film 1409, the films may be knitted continuously by switching gas.

After that, a first conductive film 1410a and a second conductive film 1410b to be a gate electrode are formed over the gate insulating film 1409. Although the gate electrode has a two-layer structure here, the gate electrode may have a single-layer structure or a stacked-layer structure of three or more layers. The first and second conductive films 1410a and 1410b may be formed from an element selected from Ta, W, Ti, Mo, Al, and Cu or an alloy material or a compound material containing these elements as its main component.

Figure 15C:
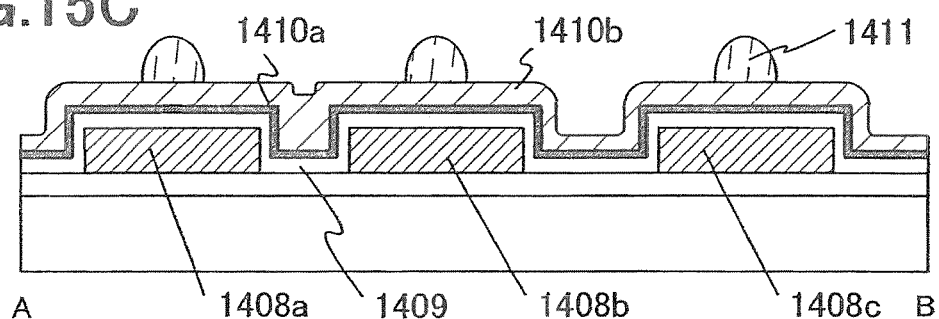

Next, as shown in FIG. 15C, a resist mask 1411 is formed to etch the first conductive film 1410a and the second conductive film 1410b. The resist mask 1411 only needs to have a tapered edge portion and may have a fan shape or a trapezoidal shape.

Figure 15D:
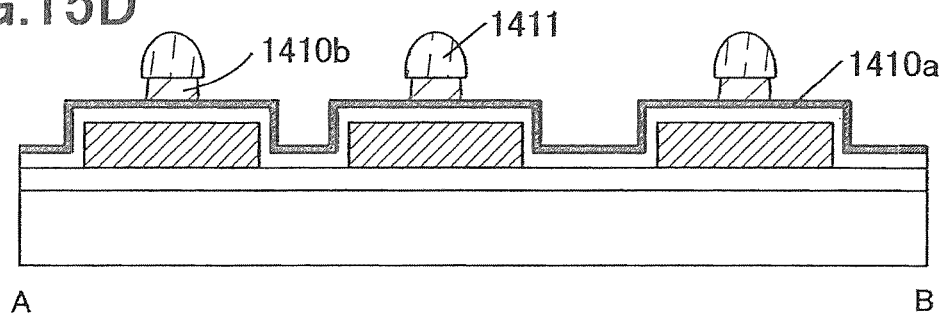

Subsequently, the second conductive film 1410b is selectively etched by using the resist mask 1411 as shown in FIG. 15D. The first conductive film 1410a serves as an etching stopper so that the gate insulating film 1409 and the semiconductor films 1408a to 1408e are not etched. The etched second conductive film 1410b has a gate length of 0.2 μm or more to 1.0 μm or less.

Figure 15E:
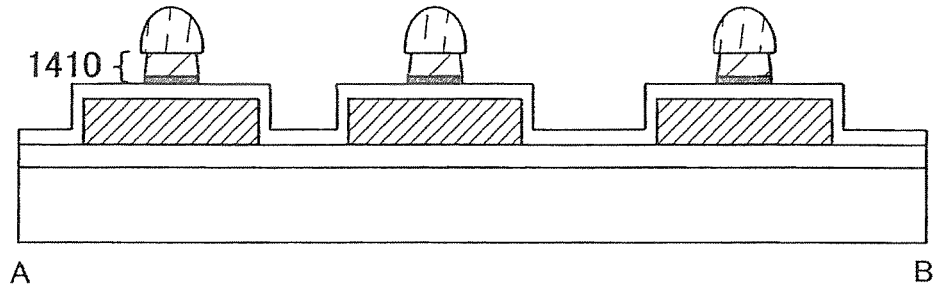

Next, the first conductive film 1410a is etched with the resist mask 1411 provided as shown in FIG. 15E. At this time, the first conductive film 1410a is etched under a condition where a selective ratio between the gate insulating film 1409 and the first conductive film 1410a is high. In this step, the resist mask 1411 and the second conductive film 1410b may be etched to some extent and be narrower. Thus, a very small gate electrode 1410 having a gate length of 1.0 μm or less is formed.

Figure 16A:
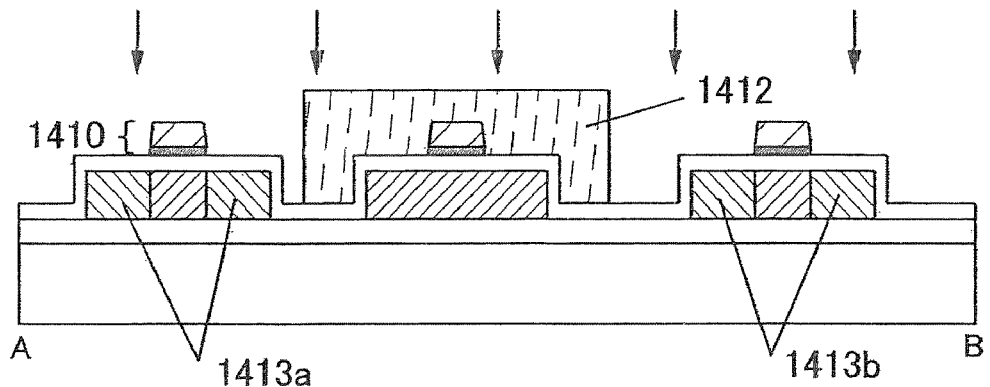
FIGS. 16A to 16C are explanatory view of a method for manufacturing a semiconductor device using the invention.

Next, as shown in FIG. 16A, the resist mask 1411 is removed by O₂ ashing or a resist peeling solution and then a resist mask 1412 for adding impurities is appropriately formed. Here, the resist mask 1412 is formed so as to cover a region to be a p-channel TFT.

Next, phosphorus (P) which is an impurity element is added in a self-aligning manner in a region to be an n-channel TFT by using the gate electrode 1410 as a mask. Here, phosphine ($PH_3$) is added at 60 to 80 keV. With this step, impurity regions 1413a and 1413b are formed in the region to be an n-channel TFT.

Figure 16B:
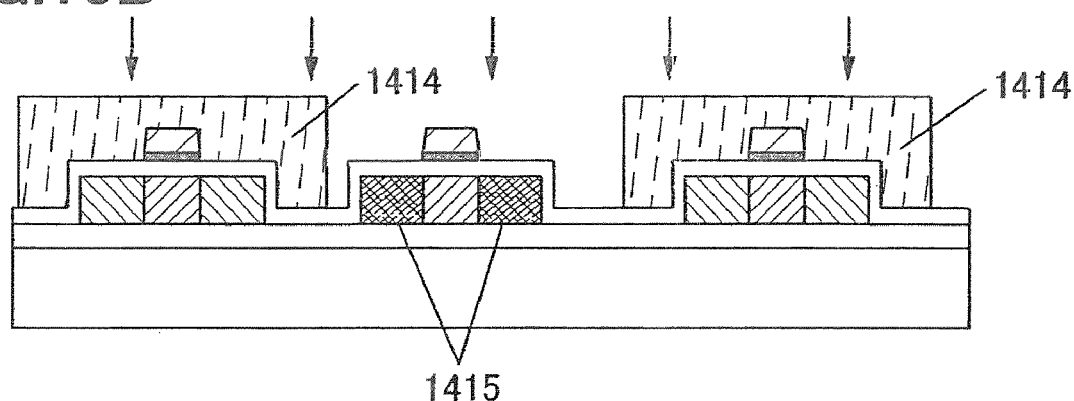
Figure 16C:
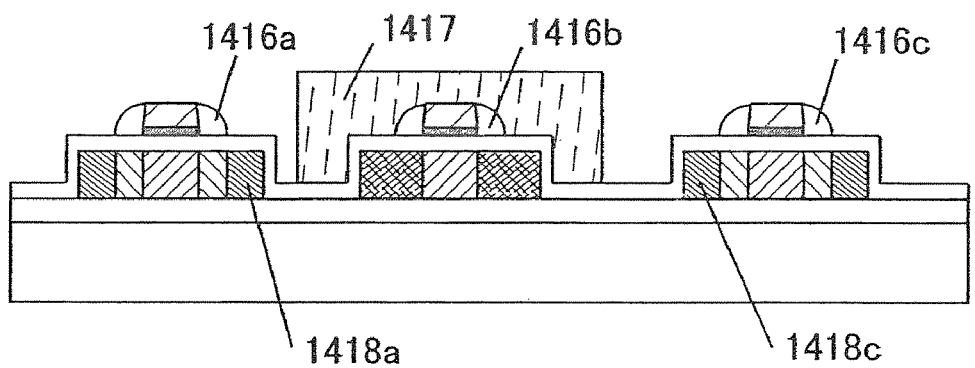

Subsequently, the resist mask 1412 is removed and a resist mask 1414 is formed so as to cover the region to be an n-channel PI. Then, boron (B) which is an impurity element is added in a self-aligning manner by using the gate electrode 1410 as a mask as shown in FIG. 16B. With this step, impurity regions 1415 are formed in the region to be a p-channel TFT.

Next, after removing the resist mask 1414, an insulating film covering side surfaces of the gate electrode 1410, which is so-called sidewalls 1416a to 1416c, are formed. The sidewalls 1416a to 1416c can be formed by etching an insulating film containing silicon formed by a plasma CVD method or a low-pressure CVD (LPCVD) method.

Subsequently, a resist mask 1417 is formed over a p-channel TFT, and then phosphine ($PH_3$) is added at 15 to 25 keV to form high-concentration impurity regions, which are so-called a source region and a drain region. With this step, high-concentration impurity regions 1418a and 1418c are formed in a self-aligning manner by using the sidewalls 1416a and 1416c as a mask as shown in FIG. 16D.

Next, the resist mask 1417 is removed by O₂ ashing or a resist peeling solution.

Further, treatment is conducted by laser annealing, lamp annealing, or furnace annealing for activating introduced impurity and for recovering damage of crystal lattice due to impurity introduction. In addition, the impurity region may be activated by heating the substrate at 550° C. in a nitrogen atmosphere.

Figure 17A:
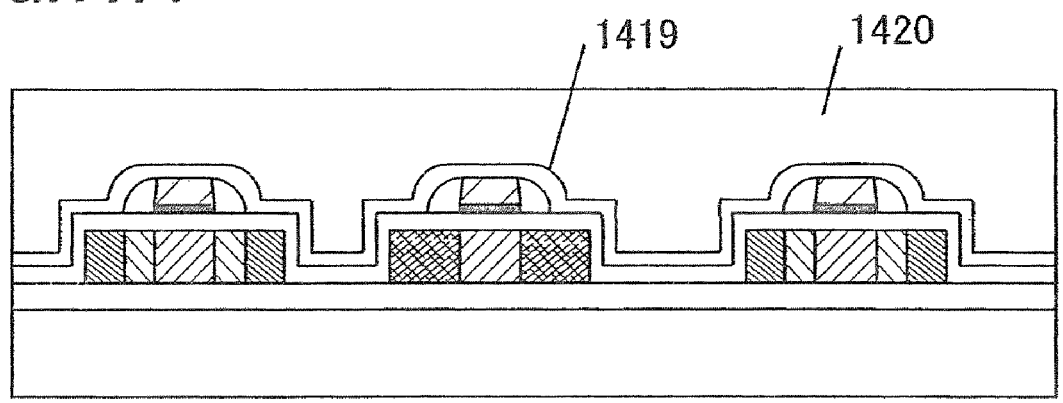
FIGS. 17A and 17B are explanatory view of a method for manufacturing a semiconductor device using the invention.

Then, as shown in FIG. 17A, a first interlayer insulating film 1419 which covers the gate insulating film 1409 and the gate electrode 1410 is formed. The first interlayer insulating film 1419 is formed of an inorganic insulating film containing hydrogen, for example, a silicon nitride film.

After that, heat treatment is conducted for hydrogenation. With the hydrogen emitted from the silicon nitride film included in the interlayer insulating film 1419, a dangling bond in the silicon oxide film and the silicon film is terminated.

Next, a second interlayer insulating film 1420 is formed so as to cover the first interlayer insulating film 1419. The second interlayer insulating film 1420 can be formed from an inorganic material (such as silicon oxide, silicon nitride, or silicon nitride containing oxygen), a photosensitive or non-photosensitive organic material (such as polyimide, acrylic, polyamide, polyimide amide, resist, or benzocyclobutene), siloxane (a substance in which a skelton structure is composed of a bond of silicon and oxygen (siloxane bond) and which has a structure in which silicon is bonded with at least one of fluorine, aliphatic hydrocarbon, and aromatic hydrocarbon), or a stacked-layer structure of these materials.

Figure 17B:
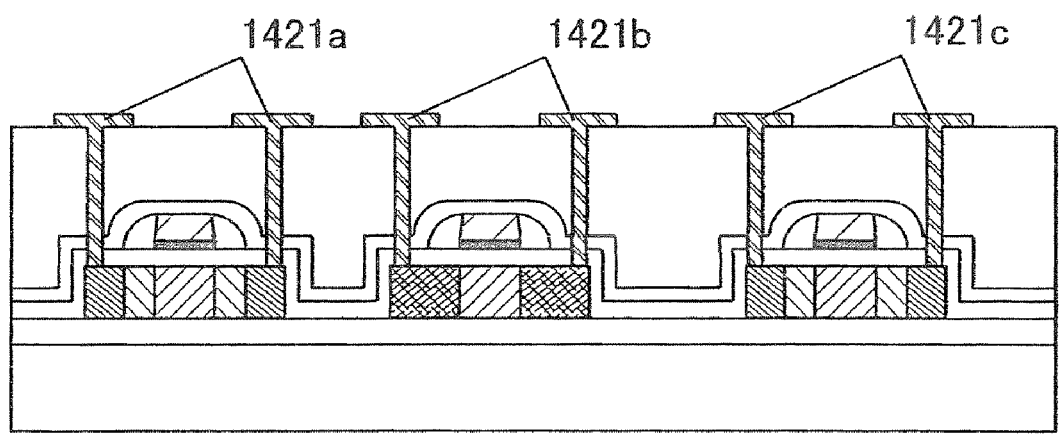

Subsequently, an opening portion, which is a so-called contact hole, is formed in the gate insulating film 1409, the first insulating film 1419, and the second insulating film 1420. Then, wirings 1421a to 1421c to be connected to the respective impurity regions are formed as shown in FIG. 17B. If necessary, a wiring to be connected to the gate electrode is also formed simultaneously. These wirings may be formed from a film or an alloy film which contains aluminum (Al), titanium (Ti), molybdenum (Mo), tungsten (W), or silicon (Si). In addition, these wirings may be formed of at least one element selected from nickel, cobalt, or iron, or an aluminum alloy film containing carbon.

In this way, an n-channel thin film transistor having an LDD structure formed to have a low-concentration impurity region and having a gate length of 1.0 μm or less can be formed. Moreover, a p-channel thin film transistor having a so-called single drain structure formed so as not to have a low-concentration impurity region and having a gate length of 1.0 μm or less is completed. A TFT having a gate length of 1.0 μm or less can be referred to as a submicron TFT. Since a short-channel effect and deterioration due to hot carriers are difficult to occur in the p-channel thin film transistor, the single drain structure can be employed.

In the embodiment, the p-channel thin film transistor may have an LDD structure. Moreover, the n-channel thin film transistor and the p-channel thin film transistor may have, instead of the LDD structure, a so-called GOLD structure in which the low-concentration impurity region overlaps the gate electrode.

Thus, a semiconductor device having the thin film transistor fanned thus, which is a CPU in this embodiment, can be manufactured. The semiconductor device can operate at high speed with an operation frequency of 30 MHz at a drive voltage of 5 V.

Next, a block diagram of a CPU formed over a glass substrate using a TFT manufactured using the invention is shown.

Figure 18:
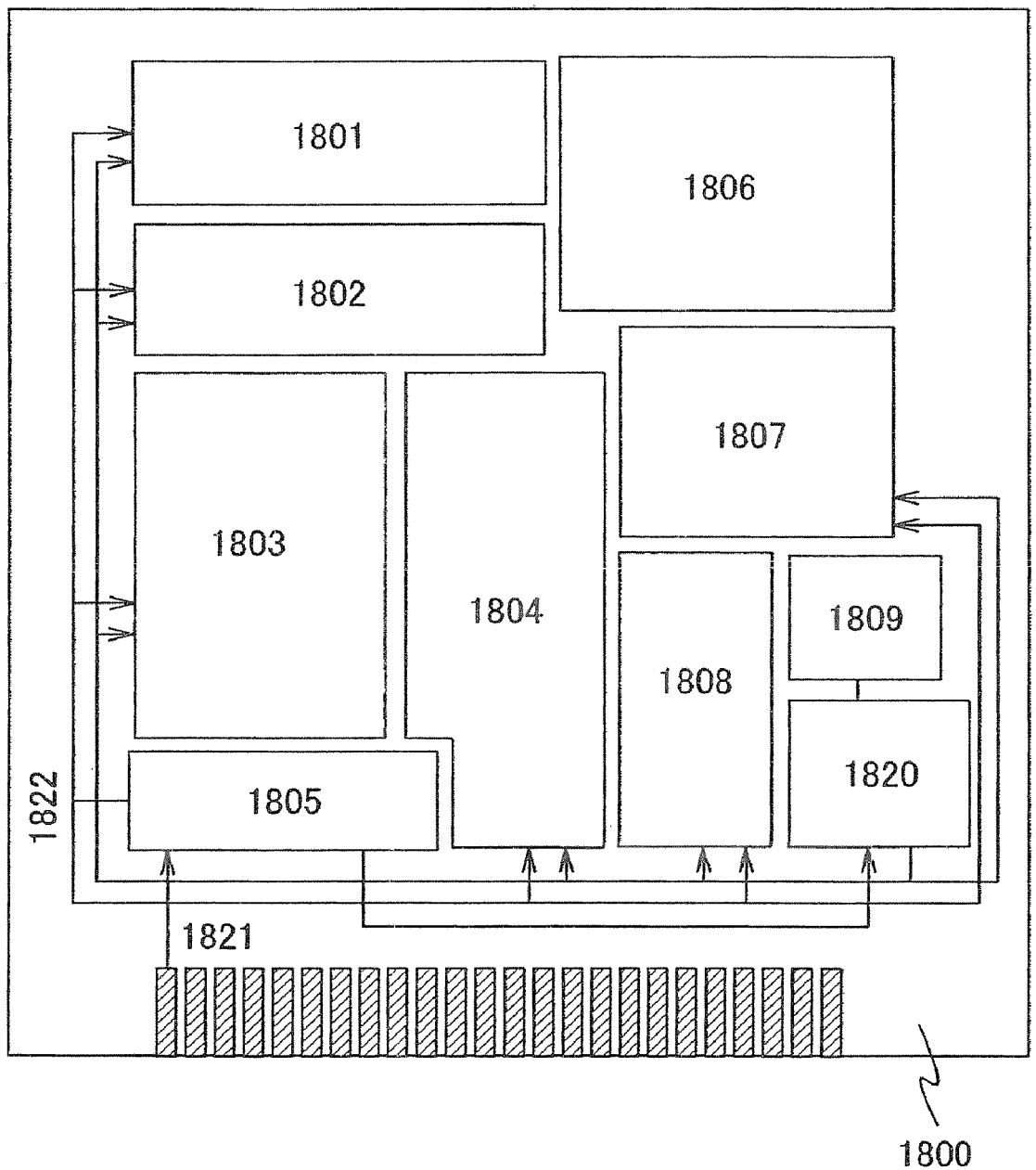
FIG. 18 is an explanatory view showing an outline of a display device manufactured by using the invention.

A CPU shown in FIG. 18 mainly includes an arithmetic logic unit (ALU) 1801, an ALU controller 1802, an instruction decoder 1803, an interrupt controller 1804, a timing controller 1805, a register 1806, a register controller 1807, a bus I/F 1808, a rewritable ROM 1809, and a ROM I/F 1820 over a substrate 1800. The ROM 1809 and the ROM I/F 1820 may be provided to another chip.

The CPU shown in FIG. 18 is just an example in which the structure is simplified, and actual CPUs have various structures according to their intended purposes.

An instruction inputted into the CPU through the bus I/F 1808 is inputted into the instruction decoder 1803 and decoded, and then inputted into the ALU controller 1802, the interrupt controller 1804, the register controller 1807, and the timing controller 1805.

The ALU controller 1802, the interrupt controller 1804, the register controller 1807, and the timing controller 1805 conduct various controls based on the decoded instructions. Specifically, the ALU controller 1802 generates signals for controlling the operation of the arithmetic logic unit 1801. Further, the interrupt controller 1804 processes an interrupt request from the peripheral circuit or an external input/output device during the execution of a program of the CPU by judging from the priority or the mask condition. The register controller 1807 generates an address of the register 1806 and reads from or writes in the register 1806 in accordance with the condition of the CPU.

The timing controller 1805 generates signals for controlling the timing of the operation of the arithmetic logic unit 1801, the ALU controller 1802, the instruction decoder 1803, the interrupt controller 1804, and the register controller 1807. For example, the timing controller 1805 is equipped with an internal clock generator for generating an internal clock signal CLK2 (1822) based on a standard clock signal CLK1 (1821) and supplies the clock signal CLK2 to the above various circuits.

In the case of forming a TFT included in a CPU using the invention, a photolithography step can be conducted by determining the light-exposure position in accordance with the large grain size region; therefore, a TFT is favorable in performance and has less variation in performance. Therefore, a CPU in which the TFT is integrated has favorable quality and less variation in performance. In addition, it is unnecessary to manufacture a marker for a photolithography step; therefore, a CPU can be manufactured for a shorter time.

This embodiment can be freely combined with embodiment mode or another embodiment.

Embodiment 5

Various electronic devices can be completed by mounting a TFT manufactured by using the invention as an IC, a memory, or a CPU which is integrated, or by using as a panel.

Such electronic devices include a camera such as a digital video camera or a digital camera, a reflective projector, a television (display), a goggle-type display (head mount display), a navigation system, a sound reproducing device (audio), a mobile terminal (a mobile computer, a mobile phone, a mobile game machine, an electronic book, or the like), a game machine, an image reproducing device equipped with a recording medium (specifically, an appliance having a CPU and a display which can reproduce information recorded in a recording medium such as a digital versatile disk (DVD) or a hard disk drive (HDD) and can display the image), and so on.

Hereinafter, a mobile phone which is one of the electronic devices manufactured by using the invention is explained with reference to the drawings.

Figure 19:
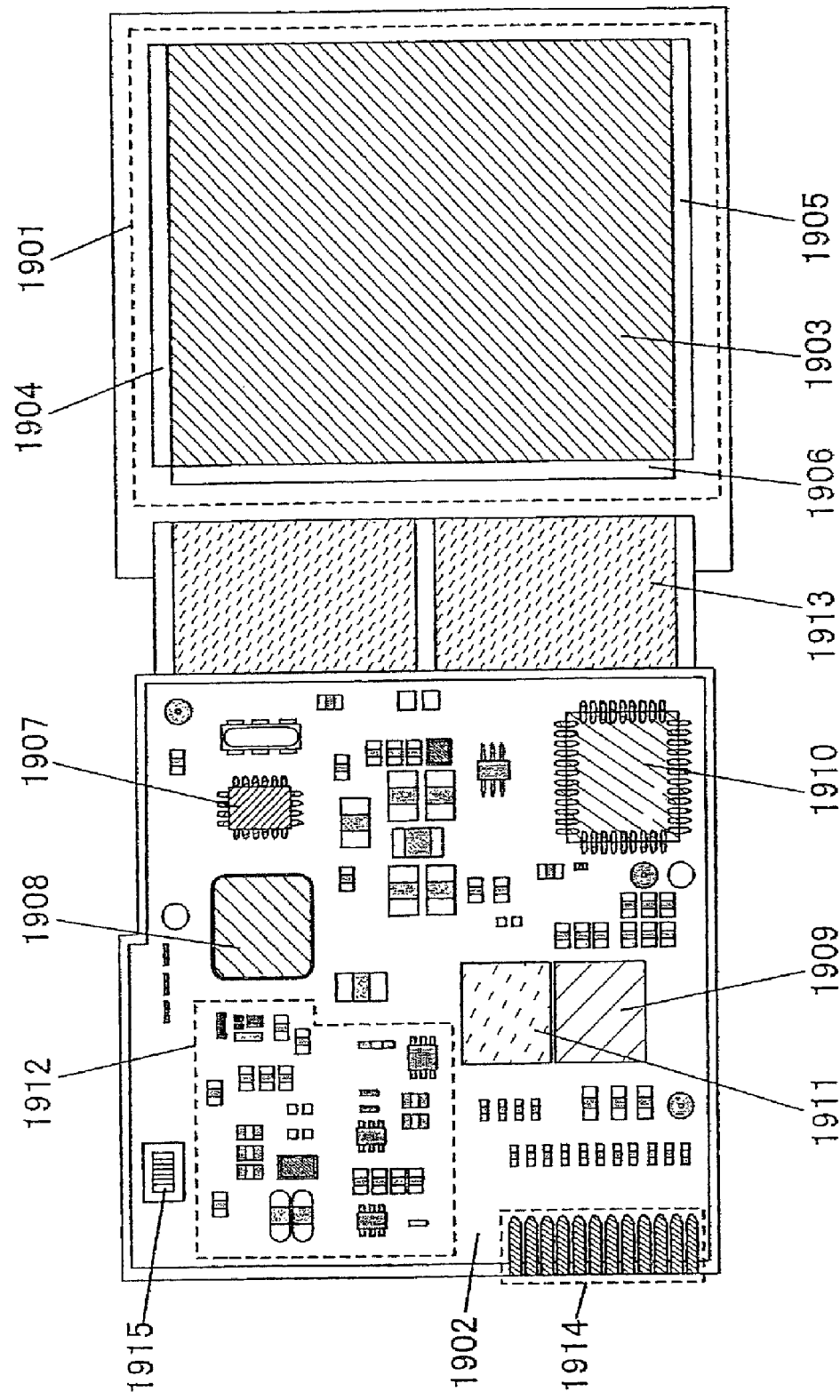
FIG. 19 is an explanatory view showing an outline of a display device manufactured by using the invention.

FIG. 19 shows a module in which a display panel 1901 and a printed wiring board 1902 are combined. The display panel 1901 is equipped with a pixel portion 1903 in which a light emitting element is provided in each pixel, a first scanning line driver circuit 1904, a second scanning line driver circuit 1905, and a signal line driver circuit 1906 which supplies a video signal to the selected pixel. An element used for the display panel is not limited to a light emitting element, and a liquid crystal element may be used.

The printed wiring board 1902 is equipped with a controller 1907, a central processing unit (CPU) 1908, a memory 1909, a power supply circuit 1910, a speech processing circuit 1911, a send/receive circuit 1912, and the like. The printed wiring board 1902 and the display panel 1901 are connected via a flexible wiring board (FPC) 1913. In the printed wiring board 1913, a capacitor element, a buffer circuit, and the like may be provided in order to prevent a noise in a power supply voltage and a signal and a slow edge of a signal. The controller 1907, the speech processing circuit 1911, the memory 1909, the CPU 1908, the power supply circuit 1910, and the like can be mounted onto the display panel 1901 by a COG (Chip On Glass) method. The scale of the printed wiring board 1902 can be decreased by a COG method.

Various control signals are inputted/outputted through an interface (I/F) portion 1914 provided for the printed wiring board 1902. In order to send and receive a signal between the printed wiring board 1902 and an antenna, an antenna port 1915 is provided to the printed wiring board 1902.

Figure 20:
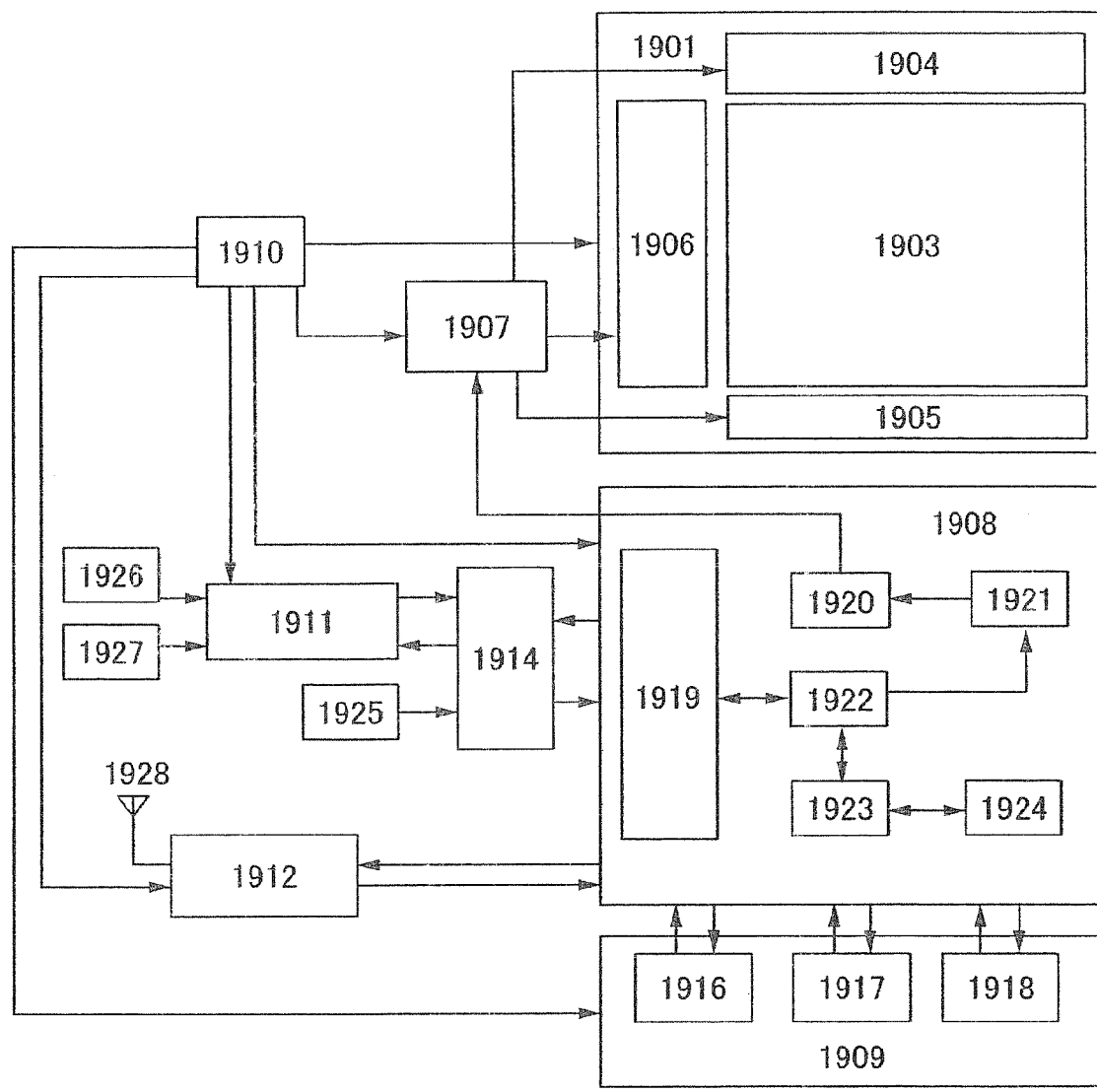
FIG. 20 is an explanatory view showing an outline of a display device manufactured by using the invention.

FIG. 20 is a block diagram of the module shown in FIG. 19. This module includes a VRAM 1916, a DRAM 1917, a flash memory 1918, and the like as a memory 1909. Image data which will be displayed in the panel are stored in the VRAM 1916, image data or audio data are stored in the DRAM 1917, and various programs are stored in the flash memory 1918.

The power supply circuit 1910 supplies electric power for operating the display panel 1901, the controller 1907, the CPU 1908, the speech processing circuit 1911, the memory 1909, and the send/receive circuit 1912. The power supply circuit 1910 may be provided with a current source depending on a specification of the panel.

The CPU 1908 has a control signal generating circuit 1920, a decoder 1921, a register 1922, an arithmetic circuit 1923, a RAM 1924, an interface 1919 for the CPU 1908, and the like. Various signals inputted into the CPU 1908 through the interface 1919 are held in the register 1922 once, and then inputted into the arithmetic circuit 1923, the decoder 1921, and the like. The arithmetic circuit 1923 conducts arithmetic based on the inputted signal, and specifies a place to which various instructions are sent. Meanwhile, the signal inputted into the decoder 1921 is decoded and inputted into the control signal generating circuit 1920. The control signal generating circuit 1920 generates a signal including various instructions based on the inputted signal, and sends the signal to the place specified by the arithmetic circuit 1923, specifically the memory 1909, the send/receive circuit 1912, the speech processing circuit 1911, the controller 1907, and the like.

The memory 1909, the send/receive circuit 1912, the speech processing circuit 1911, and the controller 1907 operate in accordance with the received instruction. The operation is hereinafter described briefly.

The signal inputted from an input means 1925 is sent to the CPU 1908 mounted onto the printed wiring board 1902 through the interface portion 1914. The control signal generating circuit 1920 converts the image data stored in the VRAM 1916 into a predetermined format in accordance with the signal sent from the input means 1925 such as a pointing device or a keyboard and sends the data to the controller 1907.

The controller 1907 conducts data processing to the signal including the image data which has been sent from the CPU 1908 in accordance with the specification of the panel, and supplies the signal to the display panel 1901. Further, the controller 1907 generates a Hsync signal, a Vsync signal, a clock signal CLK, an alternating voltage (AC Cont), and a switching signal L/R based on the power supply voltage inputted from the power supply circuit 1910 or various signals inputted from the CPU 1908 and supplies them to the display panel 1901.

The send/receive circuit 1912 processes a signal to be sent or received as an electric wave in an antenna 1928. Specifically, a high-frequency circuit such as an isolator, a bandpass filter, a VCO (Voltage Controlled Oscillator), an LPF (Low Pass Filter), a coupler, or a balun is included. Among the signals to be sent or received in the send/receive circuit 1912, a signal including audio information is sent to the speech processing circuit 1911 in accordance with the instruction from the CPU 1908.

The signal including the audio information which has been sent in accordance with the instruction of the CPU 1908 is demodulated into an audio signal in the speech processing circuit 1911 and sent to a speaker 1927. An audio signal sent from a microphone 1926 is modulated in the speech processing circuit 1911 and sent to the send/receive circuit 1912 in accordance with the instructions from the CPU 1908.

The controller 1907, the CPU 1921, the power supply circuit 1910, the speech processing circuit 1911, and the memory 1909 can be mounted as a package according to this embodiment. This embodiment can be applied to any kind of circuit except a high-frequency circuit such as an isolator, a bandpass filter, a VCO (Voltage Controlled Oscillator), an LPF (Low Pass Filter), a coupler, or a balun.

Variation in characteristics among TFTs can be reduced by using the invention since a circuit pattern can be formed only on a large grain size region in a laser irradiation region. Further, a process can be simplified and a manufacturing cost can be lowered since an alignment which determines a light-exposure position of a light source for light-exposure is not required. When this is integrated to be mounted as a CPU, a memory, or an IC, or to be used as a panel, an electronic device with favorable quality and without variation in performance can be manufactured at low cost.

This embodiment can be freely combined with embodiment mode or another embodiment.

Embodiment 6

In this embodiment, a photo IC and a manufacturing example thereof are explained as one example of an element manufactured by using the present invention. FIGS. 25A to 29B are used for the explanation.

Figure 25A:
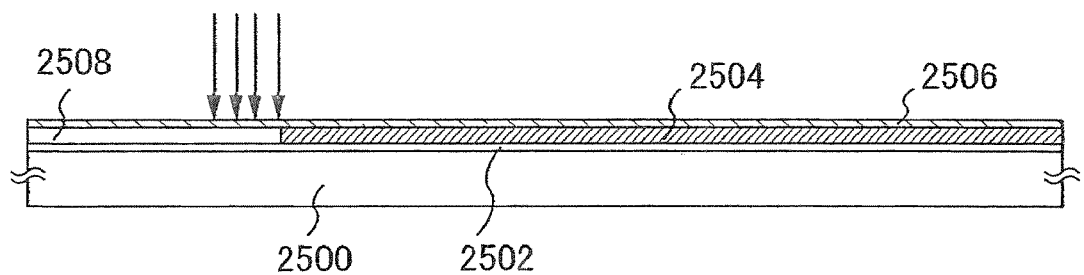
FIGS. 25A to 25C are explanatory view of a method for manufacturing a semiconductor device using the invention.

First, an element is formed over a substrate (a first substrate 2500) in FIG. 25A. Here, AN100 which is one of glass substrates is used as the substrate 2500.

Then, a silicon oxide film containing nitrogen (film thickness of 100 nm) which is to be a base insulating film 2502 is formed by a plasma CVD method, and further, a semiconductor film is stacked to have a film thickness of 20 nm or more to 150 nm or less, preferably, 30 nm or more to 80 nm or less without being exposed to atmospheric air, hi this embodiment, an amorphous silicon film containing hydrogen is formed as the amorphous semiconductor film 2504.

The base insulating film 2502 may be formed by stacking a silicon oxide film, a silicon nitride film, and a silicon oxide film containing nitrogen. For example, the base insulating film 2502 may be formed by a film which is formed by stacking a silicon nitride film containing oxygen to be 50 nm and a silicon oxide film containing nitrogen to be 100 nm. The silicon oxide film containing nitrogen or the silicon nitride film serves as a blocking layer which prevents an impurity such as an alkali metal from diffusing from a glass substrate.

Then, the amorphous semiconductor film 2504 is crystallized by a crystallization method such as a solid phase growth method, a laser crystallization method, or a crystallization method using catalytic metal to form, for example, a polycrystalline silicon film 2508 as a kind of a semiconductor film having a crystalline structure (crystalline semiconductor film).

In this embodiment, the polycrystalline silicon film 2508 is formed by a crystallization method using a catalytic element. First, a solution containing nickel in the range of 10 ppm to 100 ppm in weight, for example a nickel acetate solution, is applied to the part or the whole surface of the amorphous semiconductor film 2504 by a spinner. In addition, for example, a method for spraying a nickel element to the whole surface by a sputtering method may be used instead of a coating method. As another method, nickel may be added by a vapor deposition method or a plasma treatment. The catalytic element which can be used here is not only nickel, and germanium, iron, palladium, tin, lead, cobalt, platinum, copper, gold, or the like may be used. The applied catalyst is shown by reference numeral 2506 in FIG. 25A.

In the case of crystallizing the semiconductor film, in order to control a direction of crystal growth to be a direction perpendicular to the surface of the substrate 2500, a solution containing a catalytic element may be applied to the whole surface of the semiconductor film. Alternatively, in order to control a direction of crystal growth to be a direction parallel to the surface of the substrate 2500, a solution containing a catalytic element may be applied to the part of the semiconductor film.

Next, the semiconductor film is crystallized by heat treatment to form a semiconductor film having a crystalline structure (here, polycrystalline silicon film). Here, after heat treatment (at 500° C. for one hour), heat treatment (at 550° C. for four hours) for crystallization is conducted. By the former heat treatment, the amorphous semiconductor film 2504 and a catalytic element are reacted to form a compound over the surface or at the periphery of the surface of a face on which the catalytic element is in contact with the amorphous semiconductor film 2504. In the next heat treatment, crystal growth is caused by using this compound as a core. The lowering of crystallization temperature and the shortening of the heat treatment are due to the function of a metal element with catalytic action. The polycrystalline silicon film can be obtained by these heat treatments. By using the catalytic element, crystallinity is enhanced. As a result, mobility between elements, a threshold voltage, and variation of ON current can be suppressed.

Next, an oxide film on the surface of the polycrystalline silicon film 2508 is removed by dilute hydrofluoric acid or the like. Then, degree of crystallinity is heightened and laser beam irradiation for repairing a detect remaining in crystal grain is conducted.

A laser irradiation method which will be described hereinafter may be conducted in the case of obtaining a crystalline semiconductor film by crystallizing the amorphous semiconductor film by a laser crystallization method or the case of conducting laser irradiation for repairing a detect remaining in crystal grain after obtaining the semiconductor film having a crystalline structure.

In the case of using laser irradiation, a continuous oscillation laser beam (CW laser beam) can be used. As the laser beam which can be used here, a laser beam oscillated from one or more kinds of a Ti: sapphire laser, an alexandrite laser, or laser using a medium in which one or more kinds of Nd, Yb, Cr, Ti, Ho, Er, Tm, or Ta is added as a dopant to YAG, $YVO_4$, forsterite ($Mg_2SiO_4$), $YAlO_3$, or $GdVO_4$, each of which is a single crystal, or YAG, $Y_2O_3$, $YVO_4$, $YAlO_3$, or $GdVO_4$, each of which is a poly crystal (ceramic) can be used. A crystal with a large grain size can be obtained by emitting a laser beam having a fundamental wave of such lasers and a second to fourth harmonic wave of the fundamental wave. For example, the second harmonic wave (532 nm) or the third harmonic wave (355 nm) of an Nd:$YVO_4$ laser (fundamental wave with 1064 nm) can be used. In this case, the power density of laser is required to be approximately from 0.01 $MW/cm^2$ to 100 $MW/cm^2$ (preferably, from 0.1 $MW/cm^2$ to 10 $MW/cm^2$) at the scanning rate of approximately from 10 cm/sec to 2000 cm/sec.

In the case of using ceramic (poly crystal) as the medium of the laser, the medium can be formed to have any shape for a short time and at low cost. In the case of using a single crystal, a columnar medium with a diameter of several millimeters and with a length of several tens of millimeters is generally used; however, in the case of using ceramic, a medium which is larger can be formed.

The concentration of the dopant such as Nd or Yb in the medium, which contributes directly to light emission, cannot be changed drastically in either the single crystal or the poly crystal; therefore, the enhancement of outputting laser by increasing the concentration has limitations to some extent. However, in case of ceramic, the size of the medium can be drastically increased compared with the single crystal; therefore, the significant enhancement of output can be expected.

Further, in case of ceramic, a medium having a parallelepiped shape or a rectangular parallelepiped shape can be easily Ruined. When an oscillation light is made to zigzag inside the medium using the medium having such a shape, an oscillation optical path can be long. Therefore, amplification becomes large, and oscillation can be conducted with large output. In addition, the laser beam emitted from a medium having such a shape has a quadrangle shape in its cross section when the laser beam is emitted; therefore, it is more advantageous to transform in a linear shape compared with a laser beam having a sphere shape. By transforming the laser beam emitted as thus described by using an optical system, a linear beam with a short side length of 1 mm or less and with a long side length of several millimeters to several meters can be easily obtained. In addition, by emitting an excitation light to the medium uniformly, the linear beam is made to have a uniform energy distribution in a long side direction.

By emitting the linear beam to the semiconductor film, the semiconductor film can be annealed more uniformly. In the case where uniform annealing is required toward opposite edges of the linear beam, it is more preferable to contrive ways such as shielding light in an energy attenuation portion by arranging a slit in the opposite edges.

In the case where the laser irradiation is conducted in atmospheric air or an oxygen atmosphere, an oxide film is formed on the surface by laser beam irradiation.

Then, by the laser beam irradiation, a barrier layer 2510 formed of an oxide film having a thickness of 1 to 5 nm in total is formed by treating the surface with ozone water for 120 seconds, in addition to an oxide film formed over the polycrystalline silicon film 2508. This barrier layer is formed to remove a catalytic element added for crystallization, for example nickel (Ni), from the film. Here, the barrier is formed using ozone water; however, the barrier layer may be fanned by depositing an oxide film having a thickness of approximately 1 to 10 nm by a method for oxidizing the surface of a semiconductor film having a crystalline structure with ultraviolet irradiation under oxygen atmosphere, a method for oxidizing the surface of a semiconductor film having a crystalline structure with oxygen plasma treatment, a plasma CVD method, a sputtering method, a vapor deposition method, or the like. In addition, an oxide film formed by laser beam irradiation may be removed before forming the barrier layer 2510.

Figure 25B:
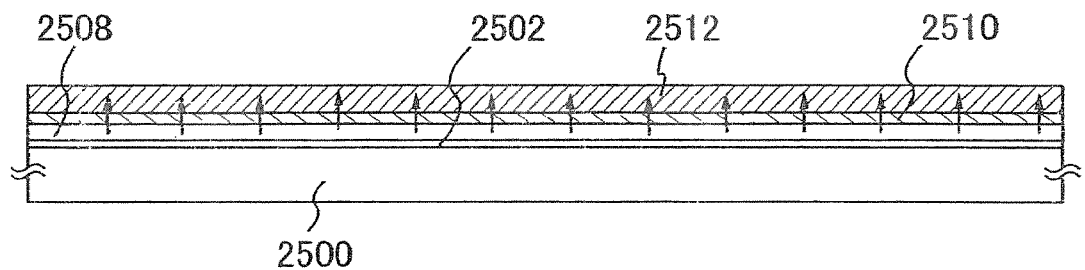

Next, an amorphous silicon film 2512 containing a rare gas element which is to be a gettering site is formed in 10 to 400 nm thick, in this embodiment 100 nm thick, by a sputtering method over the barrier layer 2510 (FIG. 25B). In this embodiment, the amorphous silicon film 2512 is formed under atmosphere including argon using a silicon target. In the case of using a plasma CVD method, the amorphous silicon film including the argon element is formed under the condition where the flow rate of monosilane and argon ($SiH_4$:Ar) is 1:99, the film-forming pressure is 6.665 Pa, RF power density is 0.087 $W/cm^2$, and the film-forming temperature is 350° C. It is desirable that the density of the amorphous silicon film 2512 which is formed here be lower than that of a single-crystal silicon film 2508 in order to increase the selecting ratio at the etching between the amorphous silicon film 2512 and the polycrystalline silicon film 2508. As the rare gas element, one or more of helium (He), neon (Ne), argon (Ar), krypton (Kr), and xenon (Xe) are used.

After that, the removing (gettering) of the catalytic element is performed by heat treatment for three minutes in a furnace heated to be 650° C. Thus, the concentration of the catalytic element in the polycrystalline silicon film 2508 is decreased. A lamp annealing apparatus may be used instead of the furnace. Through the heat treatment, the catalytic element in the polycrystalline silicon film 2508 is moved to a semiconductor film for the gettering, namely the amorphous silicon film 2512, due to the diffusion as indicated by an arrow.

Next, after removing selectively the amorphous silicon film 2512 including the argon element which is a gettering site by using the barrier layer 2510 as an etching stopper, the barrier layer 2510 is removed selectively by dilute hydrofluoric acid. Since the nickel is likely to move to a region where the concentration of oxygen is high during gettering, the barrier layer 2510 formed of the oxide film is desirably removed after the gettering.

In the case where the semiconductor film is not crystallized using the catalyst element, the steps of forming the barrier layer 2510, foaming the gettering site (the amorphous silicon film 2512 including the rare gas element), performing the heat treatment for the gettering, removing the gettering site, removing the barrier layer, and the like are unnecessary.

Figure 25C:
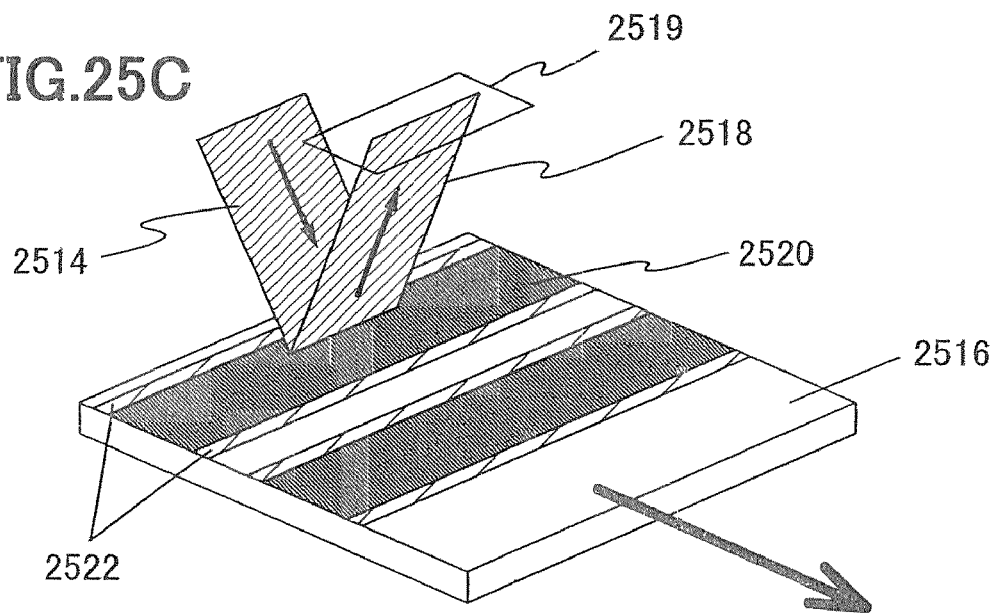

Then, a thin oxide film is formed on the surface of the obtained semiconductor film having a crystalline structure (for example, a crystalline silicon film) using ozone water, then a resist is further formed over the oxide film, and then the large grain size region in the laser irradiation region is detected to determine a place where a photolithography is conducted (FIG. 25C). Specifically, light 2514 outputted from a light source having a predetermined wavelength is emitted from above the resist to the semiconductor film, and light 2518 reflected by a semiconductor film 2516 is detected by a detector. Here, since the surface of the poorly crystalline region has a projection portion having a height which is equivalent to the thickness of the semiconductor film, emitted light is scattered. As a result, the intensity of the scattered light is high and the intensity of the reflected light is low. On the other hand, the large grain size region has higher planarity than that of the poorly crystalline region; therefore, the intensity of the scattered light is low and the intensity of the reflected light is high. By utilizing the difference, the difference between two regions is distinguished. It is to be noted that the light 2514 can be transmitted to the resist to the degree that the large grain size region and the poorly crystalline region can be distinguished from each other.

In this embodiment, a blue light emitting diode is used as a light source, and a CCD camera is used as a detector 2519. The wavelength of the blue light emitting diode may be approximately 300 to 400 nm which can detect a large grain size region 2520 and a poorly crystalline region 2522. For example, a light emitting diode using gallium nitride (GaN), zinc selenide (ZeSe), indium gallium nitride (InGaN), or the like can be used. The light source which can be used in this embodiment is not limited to the blue light emitting diode, and a light source which emits light with, a shorter wavelength than the blue light emitting diode may be used. For example, a light emitting diode which can emit ultraviolet light can be used. In addition, not only a light emitting diode but also laser shown in another embodiment can be used.

A CCD camera used as the detector 2519 is used for receiving light of the large grain size region 2520 and the poorly crystalline region 2522. To distinguish these two regions, it is preferable to use a detector which has favorable linearity of the amount of received light and output. Not only a CCD camera but also another detector shown in another embodiment can be used as the detector 2519.

By using these means, the large grain size region 2520 is detected in the same manner as a method shown in embodiment mode or another embodiment. Thus, the poorly crystalline region 2522 and the large grain size region 2520 can be distinguished from each other.

Figure 26A:
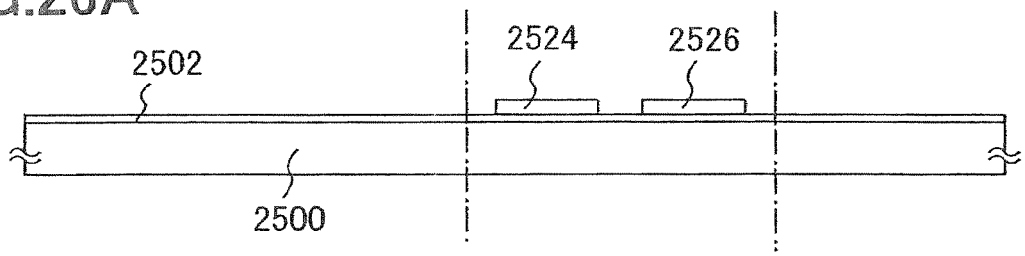
FIGS. 26A to 26D are explanatory view of a method for manufacturing a semiconductor device using the invention.

Subsequently, light-exposure is conducted to the resist formed over the large grain size region 2520 to form a resist mask Further etching is performed so that a desired shape is obtained to form a semiconductor films isolated from each other to have an island shape (hereinafter, referred to as "island-like semiconductor film" in this specification) 2524 and 2526 (refer to FIG. 26A). After forming the island-like semiconductor films 2524 and 2526, the resist mask is removed.

Next, an extremely small amount of impurity elements (boron or phosphorus) are added in order to control the threshold value of the TFT if necessary. In this embodiment, an ion doping method that diborane ($B_2H_6$) is excited in plasma without mass-separation is used.

Then, after removing the oxide film by etchant including hydrofluoric acid at the same time as washing the surface of island-like semiconductor films 2524 and 2526, an insulating film containing silicon as its main component which is to be a gate insulating film 2528 is formed. Here, a silicon oxide film containing nitrogen (composition ratio Si=32%, O=59%, N=7%, H=2%) is formed in 115 nm thick by a plasma CVD method.

Figure 26B:
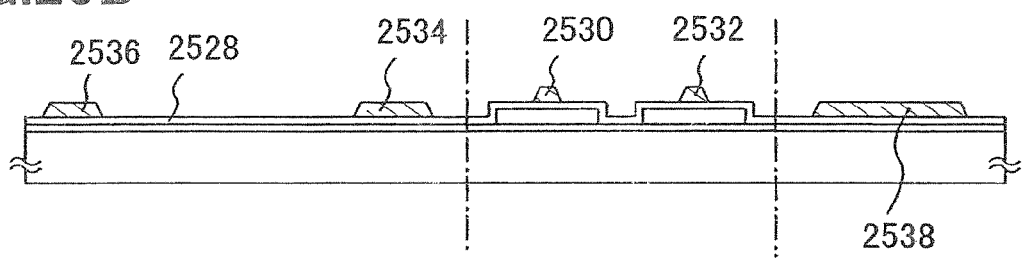
Figure 26C:
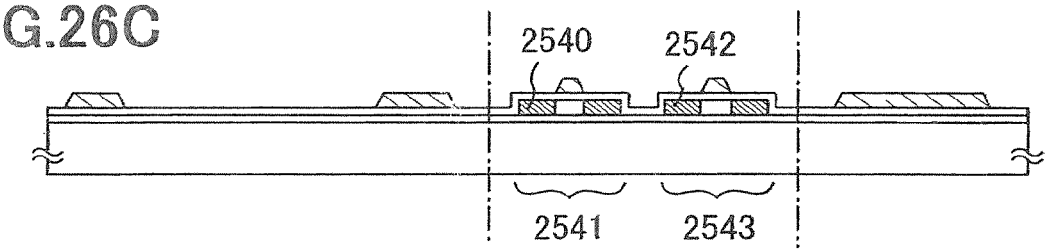

Then, after forming a metal film over the gate insulating film 2528, treatment (patterning) for forming the metal film in a predetermined shape is conducted with a second photo mask to form gate electrodes 2530 and 2532, wirings 2534 and 2536, and a terminal electrode 2538 (refer to FIG. 26B). For example, a film formed by stacking a tantalum nitride (TaN) and tungsten (W) in 30 nm and 370 nm, respectively, is used as the metal film.

In addition, other than the above-described material, an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platina (Pt), aluminum (Al), gold (Au), silver (Ag), or copper (Cu); a single-layer film formed from an alloy material or a compound material containing the element as its main component; or nitride of these can be used as the gate electrodes 2530 and 2532, the wirings 2534 and 2536, and the terminal electrode 2538. For example, a single-layer film formed from titanium nitride, tungsten nitride, tantalum nitride, or molybdenum nitride can be given.

Then, an impurity which imparts one conductivity to the island-like semiconductor films 2524 and 2526 is introduced to form a source region or a drain region 2540 of a TFT 2541, and a source region or a drain region 2542 of a TFT 2543. In this embodiment, an n-channel TFT is formed; therefore, n-type impurity, for example phosphorus (P) or arsenic (As), is introduced to the island-like semiconductor films 2524 and 2526 (refer to FIG. 26C).

After a first interlayer insulating film (not shown) including a silicon oxide film is formed in 50 nm thick by a CVD method, a step of activating the impurity element added in the respective island-like semiconductor films 2524 and 2526 is conducted. This activation step is performed by a rapid thermal annealing (RTA) method using a lamp as a light source, a method by which a YAG laser or an excimer laser is emitted from a rear face, heat treatment using a furnace, or a method that any one of these is combined with another.

Then, a second interlayer insulating film 2544 including a silicon nitride film containing hydrogen and oxygen is formed, for example, in 10 nm thick.

Figure 26D:
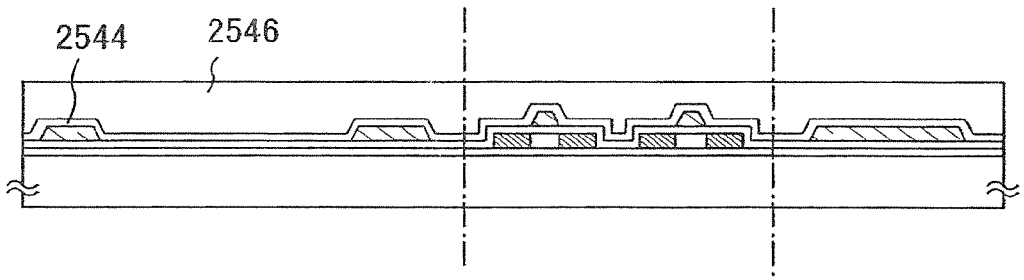

And then, a third interlayer insulating film 2546 formed from an insulating material is formed over the second interlayer insulating film 2544 (refer to FIG. 26D). As for the third interlayer insulating film 2546, an insulating film obtained by a CVD method can be used. In this embodiment, a silicon nitride film containing nitrogen is formed in 900 nm thick as the third interlayer insulating film 2546 to enhance adhesiveness.

Next, heat treatment (for 1 to 12 hours at 300 to 550° C., for example for 1 hour at 410° C. in a nitrogen atmosphere) is conducted to hydrogenate the island-like semiconductor films 2524 and 2526. This step is to terminate a dangling bond in the island-like semiconductor films 2524 and 2526 using hydrogen included in the second interlayer insulating film 2544. The island-like semiconductor films 2524 and 2526 can be hydrogenated regardless of the existence of the gate insulating film 2528.

As the third interlayer insulating film 2546, an insulating film using siloxane and a stacked-layer structure of these can be also used. Siloxane is a substance having a skelton structure of silicon and oxygen (siloxane bond) and having a structure in which at least one kind selected from fluorine, aliphatic hydrocarbon, or aromatic hydrocarbon is bonded to silicon.

In the case of using an insulating film using siloxane and a stacked-layer structure of these as the third interlayer insulating film 2546, the third interlayer insulating film 2546 can be formed after framing the second interlayer insulating film 2544 and then conducting heat treatment for hydrogenating the island-like semiconductor films 2524 and 2526.

Figure 27A:
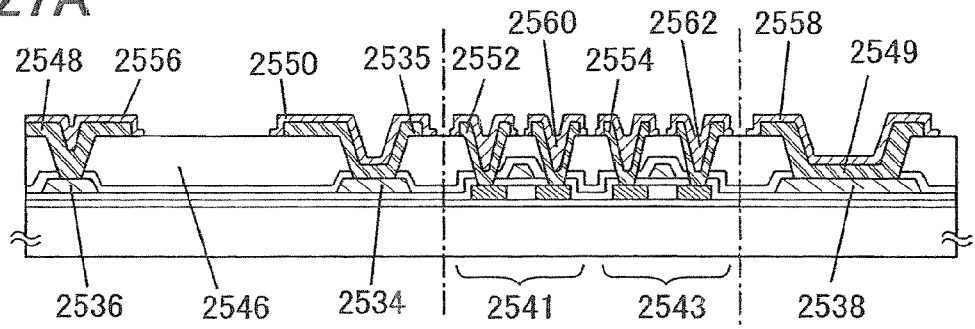
FIGS. 27A to 27D are explanatory view of a method for manufacturing a semiconductor device using the invention.

Subsequently, a resist mask is formed using a third photo mask, and then a contact hole is formed by etching selectively the first interlayer insulating film, the second interlayer insulating film 2544, and the third interlayer insulating film 2546 or the gate insulating film 2528 (FIG. 27A). Then, the resist mask is removed.

It is to be noted that the third interlayer insulating film 2546 may be formed according to need. In the case where the third interlayer insulating film 2546 is not formed, the first interlayer insulating film, the second interlayer insulating film 2544, and the gate insulating film 2528 are etched selectively after forming the second interlayer insulating film 2544 to form the contact hole.

Next, a stacked metal film is formed by a sputtering method, and a resist mask is formed using a fourth photo mask, then the metal film is etched selectively to form a wiring 2535, a connection electrode 2548, a terminal electrode 2549, an electrode (hereinafter, referred to as a source electrode or a drain electrode) 2552 which is connected to the source region or drain region 2540 of the TFT 2541, and an electrode (hereinafter, referred to as a source electrode or a drain electrode) 2554 which is connected to the source region or drain region 2542 of the TFT 2543. And then, the resist mask is removed. It is to be noted that the metal film has a three-layer structure including a 100-nm-thick Ti film, a 350-nm-thick Al film containing an extremely small amount of Si, and another 100-nm-thick Ti film.

Subsequently, after forming a conductive metal film (titanium (Ti), molybdenum (Mo), or the like) which is difficult to be an alloy even if the conductive metal film is reacted with a photoelectric conversion layer (typically, amorphous silicon) to be formed later, a resist mask is formed using a fifth photo mask, and the conductive metal film is etched selectively to form a protective electrode 2550 which is connected to the wiring 2534 (refer to FIG. 27A). Here, a Ti film with 200 nm thick obtained by a sputtering method is formed. Similarly, the connection electrode 2548, the terminal electrode 2538, the source electrode or drain electrode 2552 of the TFT 2541, and the source electrode or drain electrode 2554 of the TFT 2543 are also covered with the conductive metal film, and thus, protective electrodes 2556, 2558, 2560, and 2562, respectively, are formed. Therefore, as for the conductive metal film, the side surface of the protective electrode is covered with an Al film of a second layer in these electrodes, and accordingly, the conductive metal film can prevent an aluminum atom from diffusing toward the photoelectric conversion layer.

Figure 27B:
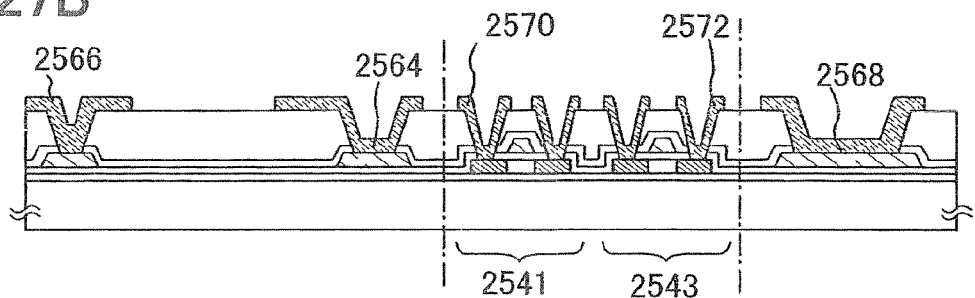

However, the protective electrode is not required to be formed in the case where the wiring 2534, the connection electrode 2548, the terminal electrode 2538, the source electrode or drain electrode 2554 of the TFT 2541, and the source electrode or drain electrode 2554 of the TFT 2543 are formed of a single-layer conductive film, in other words, in the case where a wiring 2564, a connection electrode 2566, a terminal electrode 2568, a source electrode or a drain electrode 2570 of the TFT 2541, and a source electrode or a drain electrode 2572 of the TFT 2543 are formed instead of the above-described electrodes or wirings as shown in FIG. 27B.

As shown in FIG. 27B, in the case where the wiring 2564, the connection electrode 2566, the terminal electrode 2568, the source electrode or drain electrode 2570 of the TFT 2541, and the source electrode or drain electrode 2572 of the TFT 2543 are formed of a single-layer conductive film, titanium nitride (Ti film) is preferable in terms of heat resistance, conductivity, or the like. Instead of the titanium film, an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platina (Pt); a single-layer film formed from an alloy material or a compound material containing the element as its main component; or nitride of these, for example, a single-layer film formed from titanium nitride, tungsten nitride, tantalum nitride, or molybdenum nitride can be used. By making the wiring 2564, the connection electrode 2566, the terminal electrode 2568, the source electrode or drain electrode 2570 of the TFT 2541, and the source electrode or drain electrode 2572 of the TFT 2543 be a single-layer film, the number of film formation can be reduced in a manufacturing process.

Figure 27C:
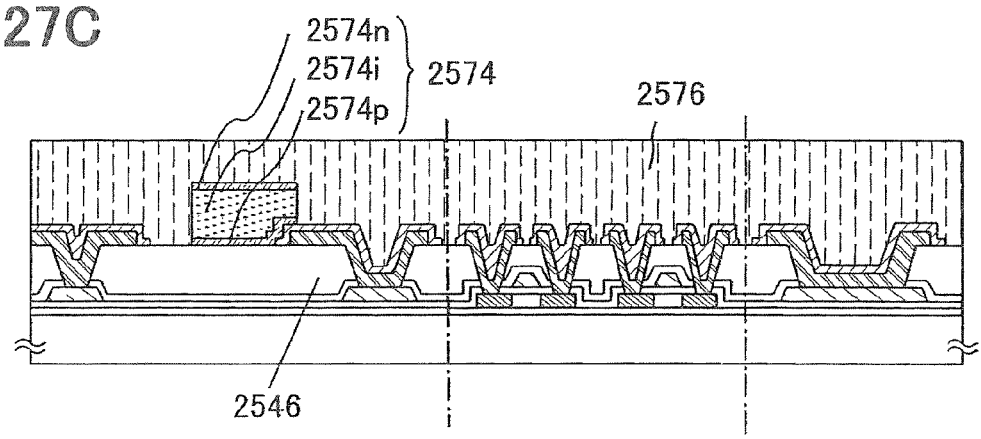

Next, a photoelectric conversion layer 2574 including a p-type semiconductor layer 2574p, an i-type semiconductor layer 2574i, and an n-type semiconductor layer 2574n is fowled over the third interlayer insulating film 2546 (FIG. 27C).

As for the p-type semiconductor layer 2574p, an amorphous silicon film containing an impurity element which belongs to Group 13, for example boron (B), may be formed by a plasma CVD method.

The wiring 2534 and the protective electrode 2550 are electrically connected to a layer which is in the lowest position of the photoelectric conversion layer 2574, in this embodiment the p-type semiconductor layer 2574p.

Although not shown, in the case where the wiring 2564, the connection electrode 2566, the terminal electrode 2568, the source electrode or drain electrode 2570 of the TFT 2541, and the source electrode or drain electrode 2572 of the TFT 2543 are formed to be a single-layer conductive film without forming a protective electrode as shown in FIG. 27B, the layer which is in the lowest position of the photoelectric conversion layer 2574 is on and in contact with the wiring 2564.

After forming the p-type semiconductor layer 2574p, the i-type semiconductor layer 2574i, and the n-type semiconductor layer 2574n are sequentially formed. Thus, the photoelectric conversion layer including the p-type semiconductor layer 2574p, the i-type semiconductor layer 2574i, and the n-type semiconductor layer 2574n are formed (FIG. 27C).

As the i-type semiconductor layer 2574i, for example, an amorphous silicon film may be formed by a plasma CVD method. As the n-type semiconductor layer 2574n, an amorphous silicon film containing an impurity element which belongs to Group 15, for example phosphorus (P), may be formed, and alternatively, an impurity element which belongs to Group 15 may be introduced after forming an amorphous silicon film.

Further, as the p-type semiconductor layer 2574p, the i-type semiconductor layer 2574i and the n-type semiconductor layer 2574n, a semi-amorphous semiconductor film may be used as well as the amorphous semiconductor film.

Then, a sealing layer 2576 formed from an insulating material (for example, an inorganic insulating film containing silicon) is formed in 1 to 30 μm thick on the whole surface. Here, as an insulating material film, a silicon oxide film containing nitrogen is formed in 1 μm thick by a CVD method. By using the insulating film formed by a CVD method as the sealing layer 2576, the enhancement of adhesiveness is attained (FIG. 27C).

Figure 27D:
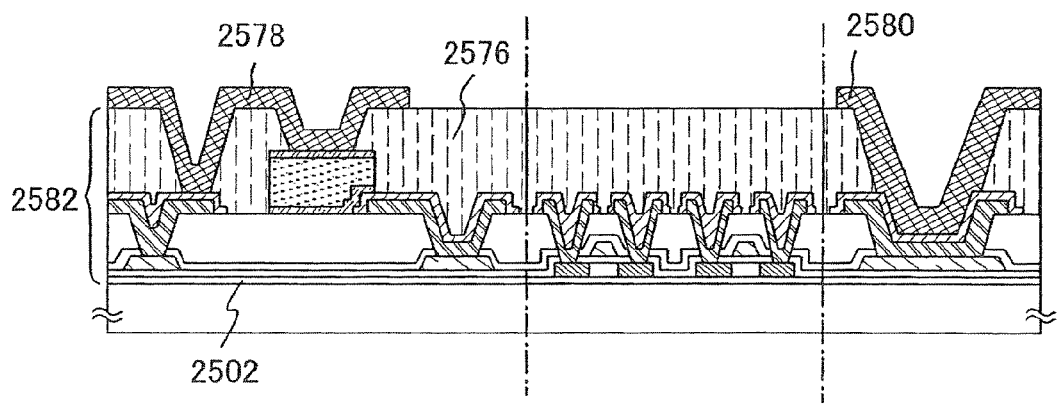

Next, after providing an opening portion by etching the sealing layer 2576, terminal electrodes 2578 and 2580 are formed by a sputtering method (FIG. 27D). Each of the terminal electrodes 2578 and 2580 is a stacked film of a titanium film (Ti film) (100 nm), a nickel film (Ni film) (300 nm), and a metal film (Au film) (50 nm). The fixing intensity of the terminal electrodes 2578 and 2580 thusly obtained is higher than 5N, and this is fixing intensity which is sufficient as that of the terminal electrode.

According to the above steps, the terminal electrodes 2578 and 2580 which can be soldered are formed and the structure shown in FIG. 27D is obtained. It is to be noted that a device formation layer 2582 indicates a layer in which the formation from the base film 2502 to the sealing film 2576 is completed.

Subsequently, the substrate is cut into individual pieces to obtain a plurality of photo sensor chips. A large amount of photo sensor chips (each having a size of 2 mm×1.5 mm) can be manufactured from a large substrate (for example, having a size of 600 cm×720 cm).

Figure 28A:
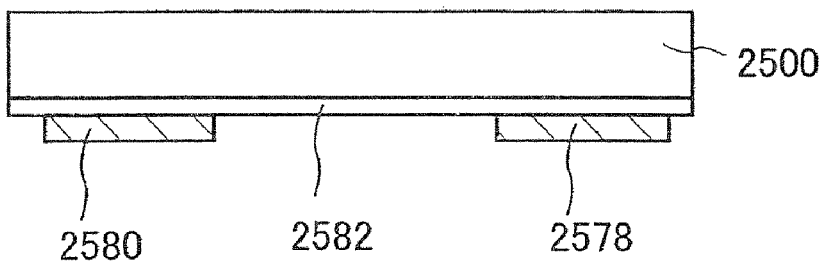
FIGS. 28A to 28C are explanatory view of a method for manufacturing a semiconductor device using the invention.
Figure 28B:
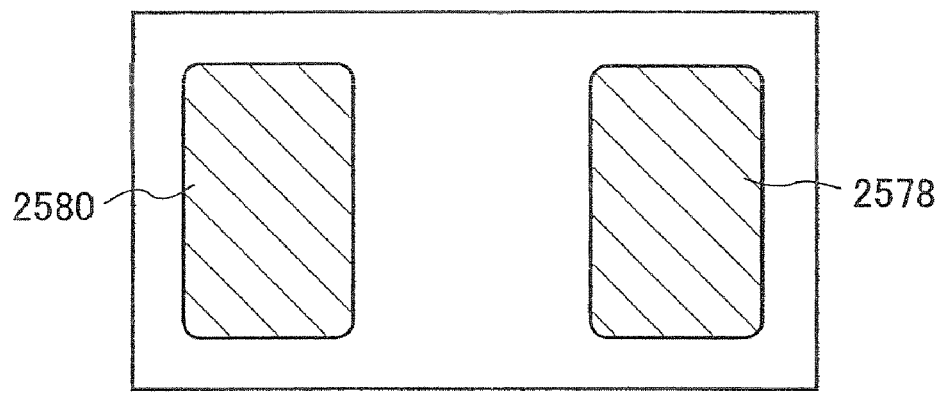
Figure 28C:
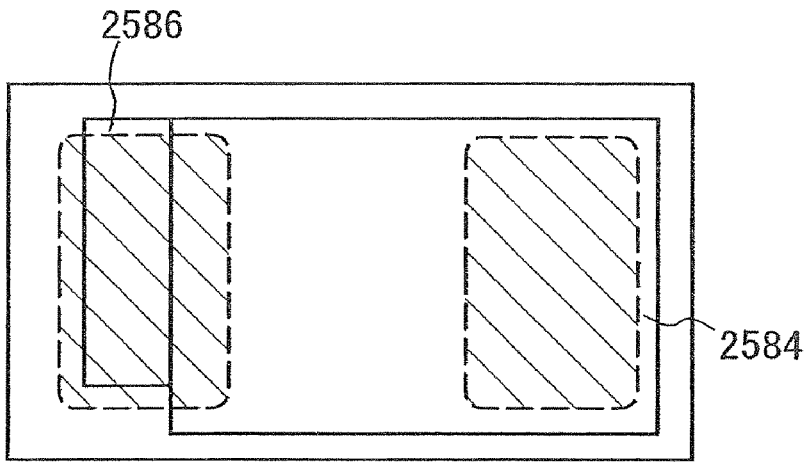

FIG. 28A is a cross-sectional view (side view) of one photo sensor chip (2 mm×1.5 mm), FIG. 28B is a bottom view thereof, and FIG. 28C is a top view thereof. In FIG. 28A, the total thickness of the substrate 2500, the device formation layer 2582, and the terminal electrodes 2578 and 2580 is 0.8±0.05 mm.

In order to thin the total thickness of the photo sensor chip, a plurality of photo sensor chips may be obtained by cutting into individual pieces using a dicer after thinning the substrate 2500 by grinding by CMP treatment or the like.

In addition, in FIG. 28B, each of the terminal electrodes 2578 and 2580 has a size of 0.6 mm×1.1 mm, and the electrode interval is 0.4 mm. In FIG. 28C, the square measure of the light-receiving portion 2584 is 1.57 mm². The amplifier circuit portion 2586 is provided with approximately 100 pieces of TFT.

Figure 29A:
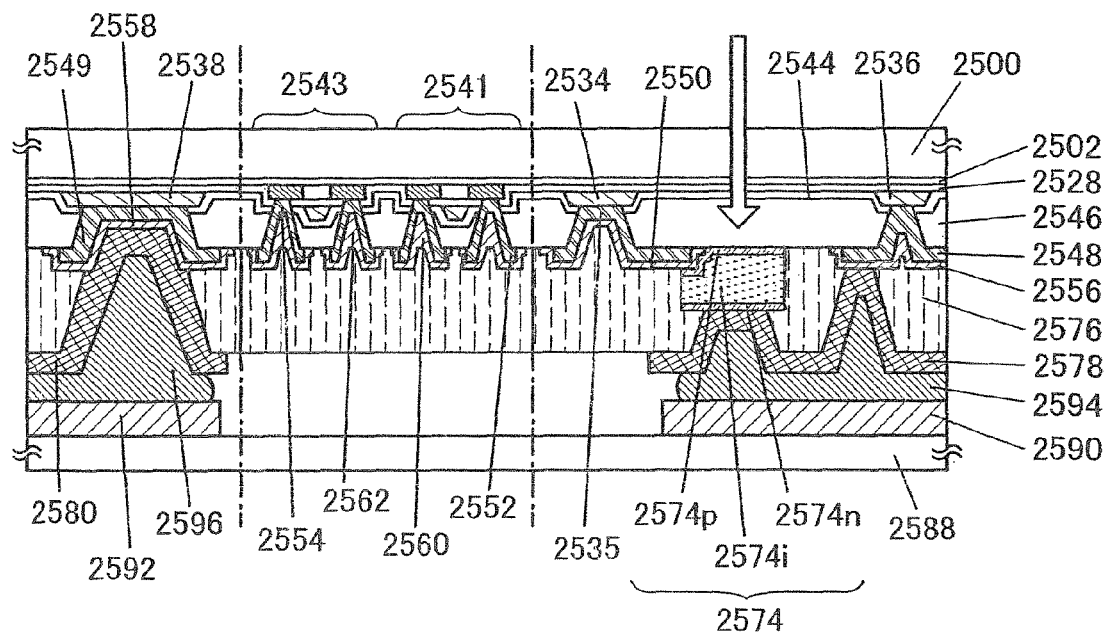
FIGS. 29A and 29B are explanatory view of a semiconductor device using the invention.
Figure 29B:
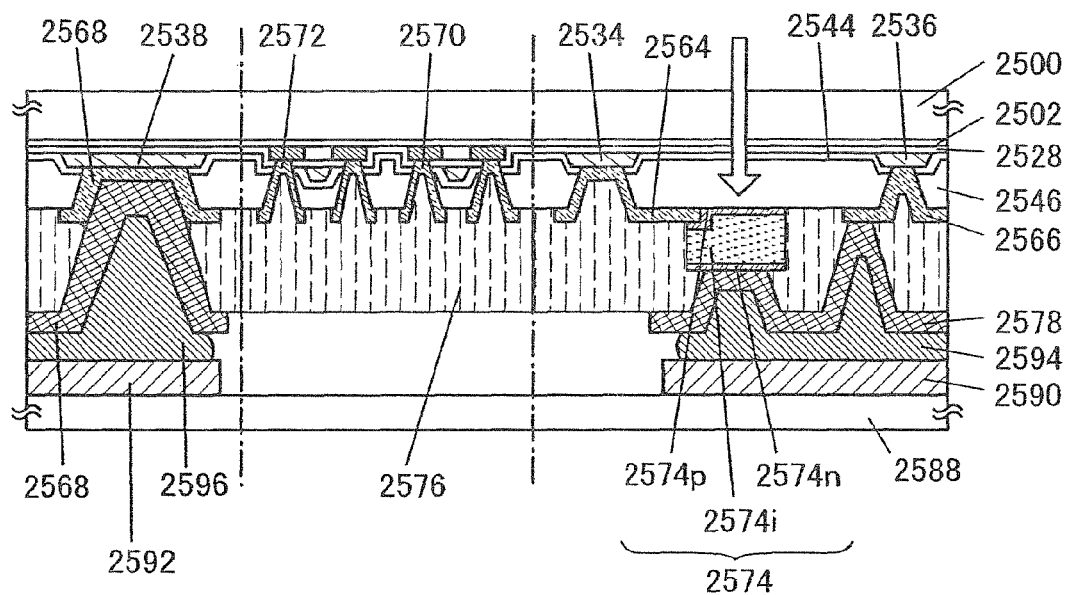

Finally, the obtained photo sensor chip is mounted on a mounting face of a substrate 2588. To connect the terminal electrodes 2578 and 2590 with the electrodes 2590 and 2592, respectively, solder is formed in advance on the electrodes 2590 and 2592 of the substrate 2500 by a screen printing method or the like. Then, after the solder and the terminal electrodes come into contact with each other, a solder reflow treatment is conducted to mount the photo sensor chip in the substrate 2588. The solder reflow treatment is performed for approximately 10 seconds at temperatures ranging from 255 to 265° C. in an inert gas atmosphere. Moreover, not only the solder but also a bump formed from metal (gold, silver, or the like), a bump formed from conductive resin, or the like can be used. In addition, lead-free solder may be used in consideration of an environmental problem. According to the above steps, a photo sensor chip shown in FIGS. 29A and 29B is completed. In FIGS. 29A and 29B, light is received from a portion indicated by an arrow. The difference between FIG. 29A and FIG. 29B is whether a protective electrode exists or not.

This embodiment can be freely combined with embodiment and another embodiment.

Embodiment 7

A TFT can be formed using the present invention, and further, a TFT can be used for a thin film integrated circuit device or a non-contact type thin film integrated circuit device (also referred to as a wireless IC tag or an RFID (wireless authentication, Radio Frequency Identification)) by integrating a TFT. The thin film integrated circuit device or the non-contact type thin film integrated circuit device can be utilized as a tag or a memory in combination with a manufacturing method shown in another embodiment.

According to the invention, the following advantages can be obtained. First, the formation of a marker is not required since a photolithography can be conducted by using a large grain size region as a marker. In other words, a step which is separately required for forming a marker conventionally can be omitted.

Second, light-exposure can be certainly conducted wherever a large grain size region exists since light-exposure by a light source for light-exposure is conducted in accordance with a large grain size region. In other words, a large grain size region corresponds to an exposed region; therefore, a TFT can be manufactured in this region. Therefore, each of the TFTs has high characteristics and variation of characteristics is reduced. In the future, demand for a thin film integrated circuit is expected to increase; therefore, it is required to manufacture a product having high performance with high yields. Hence, it is very useful to employ the invention. An example will be explained.

Although this embodiment shows an example of an isolated and insulated TFT as a semiconductor element used for an integrated circuit of a wireless IC tag, the semiconductor element which can be used for an integrated circuit of a wireless IC tag is not limited to the TFT, and other elements can be used. For example, a storage element, a diode, a photoelectric conversion element, a resistance element, a coil, a capacitor element, an inductor, and the like can be typically given. These elements can be similarly formed.

A method for manufacturing a wireless IC tag is explained with reference to the following drawings. Actually, the wireless IC tag is manufactured as follows: a number of semiconductor elements are concurrently formed over a substrate which is more than 1 m on a side, then an element group is peeled from a substrate to be cut into individual semiconductor elements, and then sealing is conducted to each of the semiconductor elements. In addition, not only the above-described method, but also the following method can be used: after a number of semiconductor elements are concurrently formed over the surface of a substrate which is more than 1 m on a side and the substrate is grinded thinly from a rear face of the substrate, the substrate is cut into individual semiconductor elements and sealing is conducted by a film or the like.

Figure 30A:
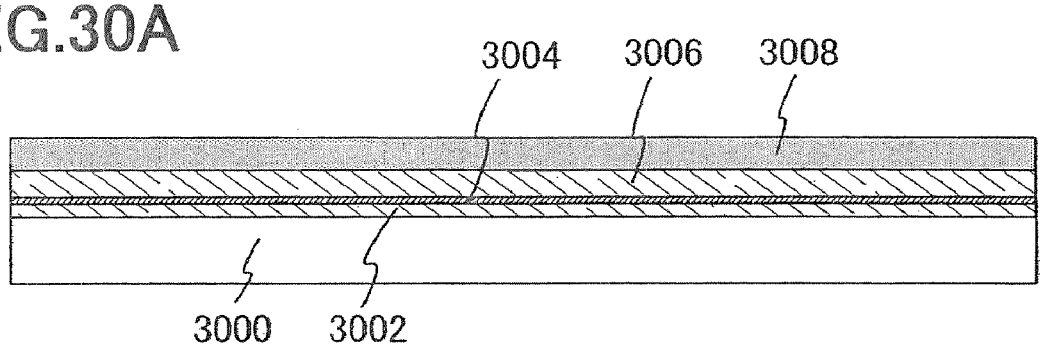
FIGS. 30A to 30D are explanatory view of a method for manufacturing a thin film integrated circuit manufactured using the invention.
Figure 30B:
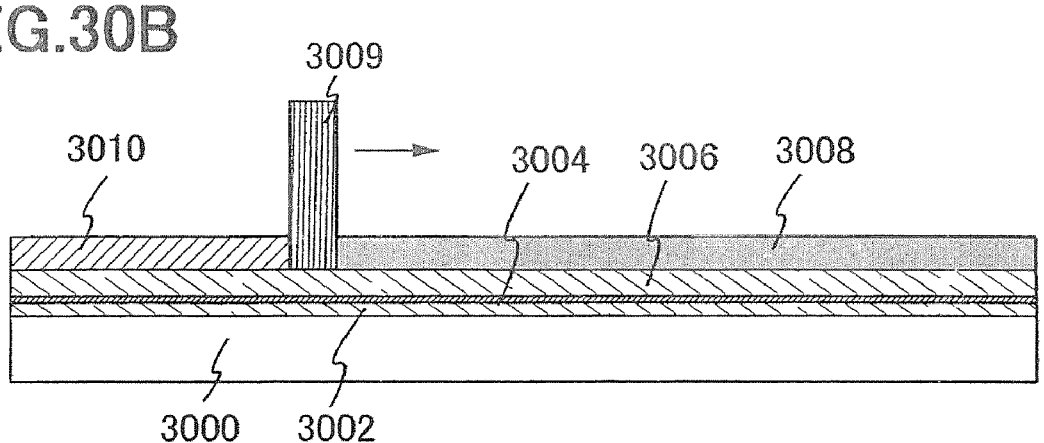

First, a substrate 3000 is prepared as shown in FIG. 30A. As the substrate 3000, a glass substrate such as a barium borosilicate glass or an alumino borosilicate glass, a quartz substraft, or the like can be used. Instead, a flexible synthetic resin such as acrylic or plastic typified by polyethylene terephthalate (PET), polyethylene naphthalate (PEN), and polyethersulfone (PES) may be used. A synthetic resin can be used as the substrate as long as the synthetic resin can withstand processing temperature, in a manufacturing process of the wireless IC tag.

There is not so much limitation on the square measure or shape of the substrate 3000 if the substrate 3000 is fowled from the above-described material. Therefore, productivity can be drastically enhanced if a substrate which is, for example 1 m or more on a side and is rectangular, is used as the substrate 3000. These are great advantages.

In addition, the surface of the substrate formed from the above-described material may be thinned by polishing such as a CMP method. For example, a semiconductor element may be formed by using the following method over a glass substrate, a quartz substrate, or a semiconductor substrate after polishing these substrates.

After preparing the substrate 3000, an insulating film 3002 is formed over the substrate 3000 (FIG. 30A). The insulating film 3002 can be provided by a single-layer structure or a stacked-layer structure of an insulating film containing oxygen or nitrogen, such as a silicon oxide (SiOx) film, a silicon nitride (SiNx) film, a silicon oxide film containing nitrogen, a silicon nitride film containing oxygen, or the like. In this embodiment, a silicon oxide film containing nitrogen is formed in 100 nm thick as the insulating film 3002. In addition, the insulating film 3002 may be oxidized or nitrided by conducting high-density plasma treatment to the insulating film 3002.

High-density plasma is generated by using a microwave at, for example, 2.45 GHz. Specifically, high-density plasma with electron density of $10^{11}$ to $10^{13}/cm^3$, electron temperature of 2 eV or less, and ion energy of 5 eV or less is used. As for high-density plasma of which low electron temperature is a feature as described above, active species have low kinetic energy. Therefore, a film with less plasma damage and fewer defects compared with a conventional plasma treatment can be formed. In plasma generation, a microwave excitation plasma process apparatus using a radial slot antenna can be used. The distance between the substrate 3000 and the antenna for generating the microwave is set to 20 to 80 mm (preferably 20 to 60 mm).

Next, a peeling layer 3004 is formed (FIG. 30A). In this embodiment, tungsten is formed in 30 nm thick by a plasma CVD method. The peeling layer 3004 can be formed of a metal film, a stacked-layer structure of a metal film and a metal oxide film, or the like. The metal film is fanned in a single-layer or stacked-layer structure of a film of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), or iridium (Ir), or a film formed of an alloy material or a compound material containing the above element as its main component. These materials can be formed by a known method (a sputtering method or a CVD method such as a plasma CVD method).

For example, in the case of forming the peeling layer 3004 in a stacked layer of a metal film and a metal oxide film, each of the metal film and the metal oxide film can be formed by a sputtering method or a plasma CVD method. As another method, after forming the above metal film, oxide of the metal can be formed over the surface of the metal film by or heat treatment or plasma treatment under an oxygen atmosphere. As plasma treatment, high-density plasma treatment may be conducted. In addition, metal nitride, metal nitride containing oxygen, or metal oxide containing nitrogen may be used instead of a metal oxide film. In the case of forming metal nitride, plasma treatment or heat treatment may be conducted to the metal film under a nitrogen atmosphere. In the case of forming metal nitride containing oxygen or metal oxide containing nitrogen, plasma treatment or heat treatment may be conducted to the metal film under atmosphere containing nitrogen and oxygen. The kind of a film to be formed is different according to a flow ratio of a gas which is to be used.

When the peeling layer 3004 is formed, oxide, nitride, or nitride oxide is formed on its surface. These compounds can be peeled easily in short time because the reaction speed with an etching gas, especially chlorine trifluoride ($ClF_3$) is high. That is to say, the peeling is possible when any one of the metal, the metal oxide, the metal nitride, or the metal nitride oxide is removed by an etching gas.

When the oxide, the nitride, or the nitride oxide is fowled on the surface of the peeling layer 3004, the chemical condition may change. For example, in the case where an oxide film containing tungsten (W) is formed, the valence of a tungsten oxide ($WOx(x=2$ to $3)$) changes As a result, the oxide film is in such a state that the oxide film is easily peeled by physical means. In the combination of the chemical means and physical means, the oxide film can be removed more easily in short time.

Although the peeling layer 3004 is formed over the whole surface of the insulating film 3002 in this embodiment, the peeling layer 3004 may be provided directly for the substrate 3000. In the case of providing directly on the substrate 3000, the peeling layer 3004 may be provided over the whole surface of the substrate 3000 or may be provided in an arbitrary position of the substrate 3000 by photolithography.

After forming the peeling layer 3004, an insulating film 3006 serving as a base film is formed. A silicon oxide is formed in 200 nm thick by a sputtering method in this embodiment.

Next, a semiconductor film 3008 is formed. The semiconductor film 3008 may be an amorphous semiconductor film, a microcrystal semiconductor film, or a crystalline semiconductor film. The material of the semiconductor film is not limited in particular; however, silicon or silicon germanium (SiGe) is preferably used. In this embodiment, an amorphous silicon film is formed to have a film thickness of 25 nm or more to 200 nm or less (preferably, 30 nm or more to 80 nm or less). After forming the semiconductor film 3008, a step of removing hydrogen contained in the semiconductor film 3008 may be conducted. Specifically, the semiconductor film 3008 may be heated at 500° C. for one hour.

Next, the semiconductor film 3008 is crystallized by emitting a laser beam 3009 to the semiconductor film 3008 using a laser irradiation apparatus. In this embodiment, a Nd:YVO4 laser providing 100 W at a second harmonic wave is used. The laser beam is condensed by using an optical system, formed in a linear shape, and emitted at the scanning speed of approximately 10 to several hundred cm/sec.

As for the laser, a continuous oscillation laser beam (CW laser beam) can be used. As a kind of the laser beam which can be used here, a laser beam oscillated from one or more kinds of, an alexandrite laser, a Ti: sapphire laser, or laser using a medium in which one or more kinds of Nd, Yb, Cr, Ti, Ho, Er, Tin, or Ta is added as a dopant to YAG, $YVO_4$, forsterite ($Mg_2SiO_4$), $YAlO_3$, or $GdVO_4$, each of which is a single crystal, or YAG, $Y_2O_3$, $YVO_4$, $YAlO_3$, or $GdVO_4$, each of which is a poly crystal (ceramic) can be used. A crystal with a large grain size can be obtained by emitting a laser beam having a fundamental wave of such lasers and a second to fourth harmonic wave of the fundamental wave.

In the case of using ceramic (poly crystal) as the medium of the laser, the medium can be formed to have any shape for a short time and at low cost. In the case of using a single crystal, a columnar medium with a diameter of several millimeters and with a length of several tens of millimeters is used; however, in the case of using ceramic, a medium which is larger can be formed.

The concentration of the dopant such as Nd or Yb in the medium, which contributes directly to light emission cannot be changed drastically in either the single crystal or the poly crystal; therefore, the enhancement of outputting laser by increasing the concentration has limitations to some extent. However, in case of ceramic, the concentration of the medium can be heightened compared with the single crystal; therefore, the significant enhancement of output can be expected.

Moreover, in the case of ceramic, a medium having an arbitrary shape can be easily formed. A medium using ceramic can be formed more largely than a medium of a single crystal; therefore, an optical path can be made to be longer than the case of using a medium of a single crystal. When the optical path is long, light is amplified greatly to allow the oscillation with high output power. Here, in the case of using a medium having a parallelepiped shape or a rectangular parallelepiped shape, the oscillated light can be made to go straight inside the medium or to zigzags as if reflecting inside the medium. The optical path in the latter is longer than the former; therefore, the oscillation can be conducted with higher output power. Since a laser beam emitted from the medium of such a shape has a rectangular cross-sectional shape at the emission, the laser beam is advantageous in transforming into a linear shape compared with a circular beam. By transforming the thus emitted laser beam using an optical system, a linear beam with a length of 1 mm or less in its short side and a length of several millimeters to several meters in its long side can be obtained easily. Moreover, by irradiating the medium with excitation light uniformly, the linear beam is made to have uniform energy distribution in the long-side direction.

The crystallization can be conducted more effectively when the laser crystallization method of this embodiment is combined with a crystallization method using a metal element which induces the crystallization such as nickel (Ni), germanium (Ge), iron (Fe), palladium (Pd), tin (Sn), lead (Pb), cobalt (Co), platinum (Pt), copper (Cu), or gold (Au).

Figure 30C:
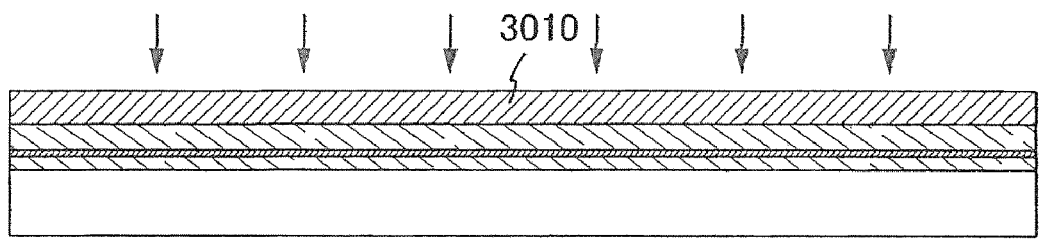

A crystalline semiconductor film 3010 formed by laser irradiation is doped with an impurity element imparting P-type conductivity. Here, boron (B) is added as the impurity element (FIG. 30C).

Figure 30D:
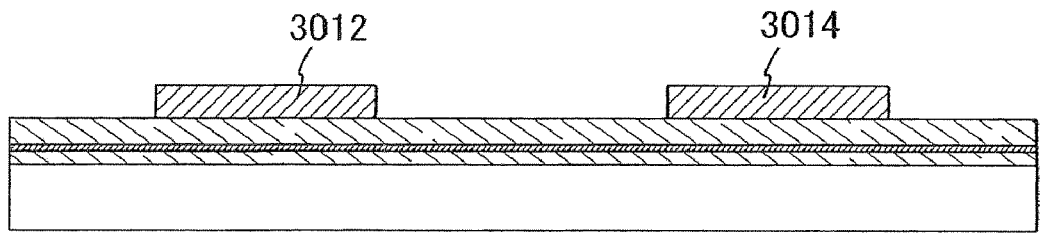

Next, the crystalline semiconductor film 3010 is etched selectively, thereby forming a first semiconductor film 3012 and a second semiconductor film 3014 (FIG. 30D).

Figure 31A:
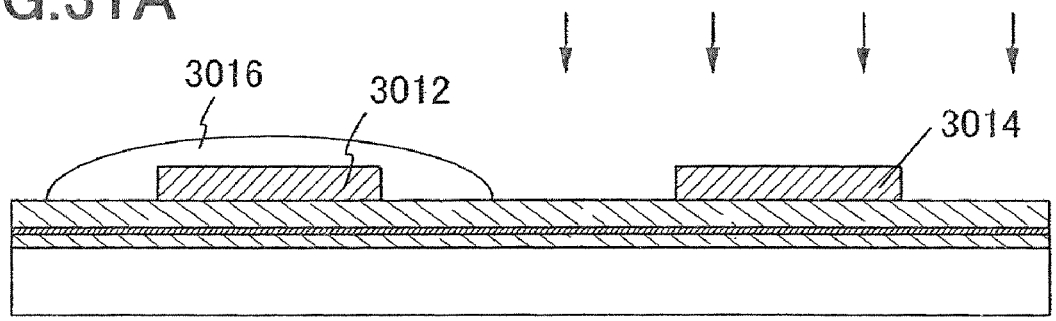
FIGS. 31A to 31D are explanatory view of a method for manufacturing a thin film integrated circuit manufactured using the invention.

Next, after a resist mask 3016 is formed so as to cover the first semiconductor film 3012, the second semiconductor film 3014 is doped with an impurity element imparting P-type conductivity (FIG. 31A). In this embodiment, boron (B) is added as the impurity element.

Figure 31B:
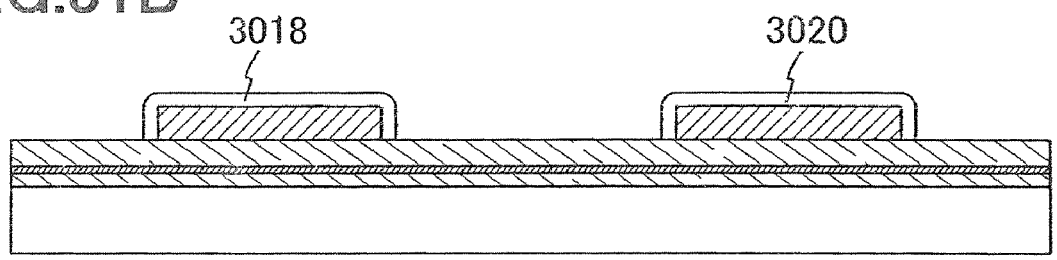

Next, the resist mask 3016 is removed, and the first semiconductor film 3012 and the second semiconductor film 3014 are oxidized or nitrided by plasma treatment so that first insulating films 3018 and 3020 (an oxide film or a nitride film) are formed on the surfaces of the first semiconductor film 3012 and the second semiconductor film 3014 (FIG. 31B). In this embodiment, the plasma treatment is conducted in an atmosphere containing oxygen to oxidize the first semiconductor film 3012 and the second semiconductor film 3014, thereby forming silicon oxide (SiOx) as the first insulating film 3018. In the case of forming silicon nitride as the first insulating films 3018 and 3020, plasma treatment may be conducted in a nitrogen atmosphere.

Generally, since a silicon oxide film or a silicon oxide film containing nitrogen formed by a CVD method or a sputtering method contains a defect inside the film, the film quality is not high enough. Therefore, an insulating film, which is denser than the insulating film formed by a CVD method, a sputtering method, or the like can be fanned over the first semiconductor film 3012 and the second semiconductor film 3014 by conducting plasma treatment in an oxygen atmosphere to oxidize the surfaces of the first semiconductor film 3012 and the second semiconductor film 3014.

When a conductive film is provided above the first semiconductor film 3012 and the second semiconductor film 3014 via the insulating film formed by a CVD method, a sputtering method, or the like, there is a risk that the coverage defect may occur due to the break by the step or the like of the insulating film at the edge portions of the first semiconductor film 3012 and the second semiconductor film 3014, which results in that the semiconductor film and the conductive film short out, for example. However, when the surfaces of the first semiconductor film 3012 and the second semiconductor film 3014 are oxidized or nitrided by plasma treatment in advance, the coverage defect of the insulating film at the edge portions of the first semiconductor film 3012 and the second semiconductor film 3014 can be suppressed.

Subsequently, a second insulating film 3022 is formed so as to cover the first insulating film 3018 and 3020. The second insulating film 3022 is formed from silicon nitride (SiNx) or silicon nitride containing oxygen. Here, a silicon nitride film is formed in 4 to 20 nm thick as the insulating film 3022 (FIG. 31C).

Figure 31C:
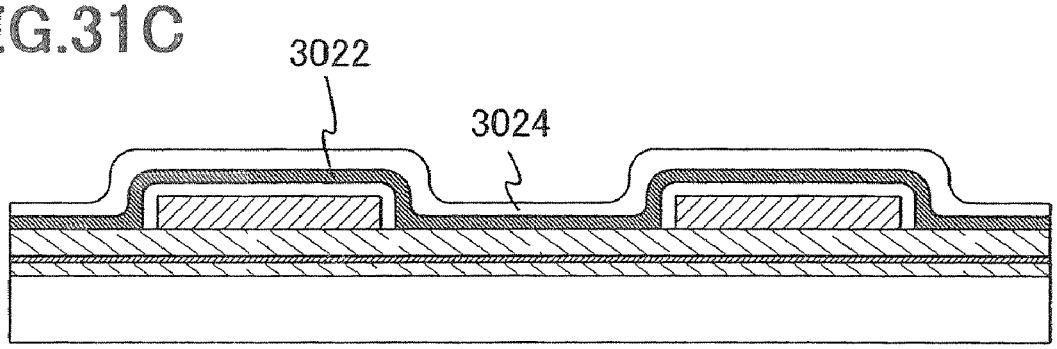

Next, the surface of the second insulating film 3022 is oxidized by plasma treatment in an oxygen atmosphere to form a third insulating film 3024 (FIG. 31C). The plasma treatment can be conducted under the condition described above. Here, a silicon oxide film or a silicon oxide film containing nitrogen is formed in 2 to 10 nm thick as the third insulating film 3024 on the surface of the second insulating film 3022 by the plasma treatment.

Figure 31D:
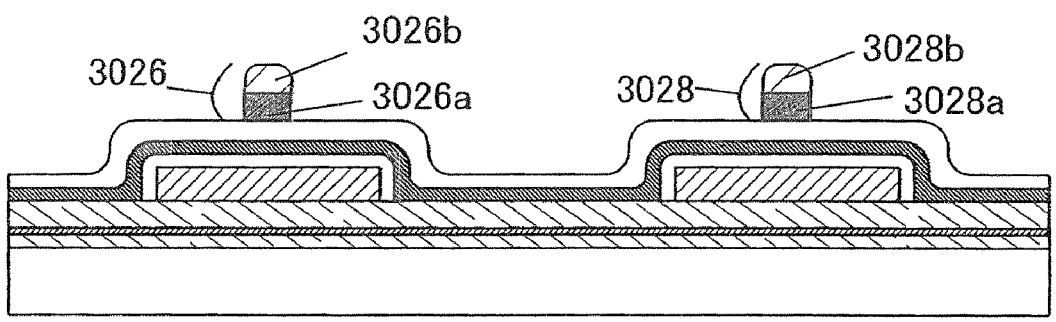

Next, conductive films 3026 and 3028 serving as gate electrodes are formed above the first semiconductor film 3012 and the second semiconductor film 3014 (FIG. 31D). In this embodiment, the conductive films 3026 and 3028 are formed to have a stacked-layer structure of first conductive films 3026a and 3028a and second conductive films 3026b and 3028b. Here, the first conductive films 3026a and 3028a are formed from tantalum nitride and the second conductive films 3026b and 3028b are formed from tungsten. The conductive film which can be used for the gate electrode may have a single-layer structure. The material for the conductive film is not limited to the above materials, but alloy containing one or a plurality of elements selected from tantalum (Ta), tungsten (W), titanium (Ti), molybdenum (Mo), aluminum (Al), copper (Cu), chromium (Cr), and niobium (Nb), or a compound containing these elements can be used. Further, a semiconductor material typified by polycrystalline silicon doped with an impurity element such as phosphorus can also be used.

Next, an impurity element imparting p-type conductivity is introduced into the first semiconductor film 3012 using the conductive film 3026 as a mask, and an impurity element imparting n-type conductivity is introduced into the second semiconductor film 3014 using the conductive film 3028 as a mask. With this step, a source region and a drain region are formed. After that, an insulating film 3030 is formed so as to cover the conductive films 3026 and 3028 (FIG. 32A).

Figure 32A:
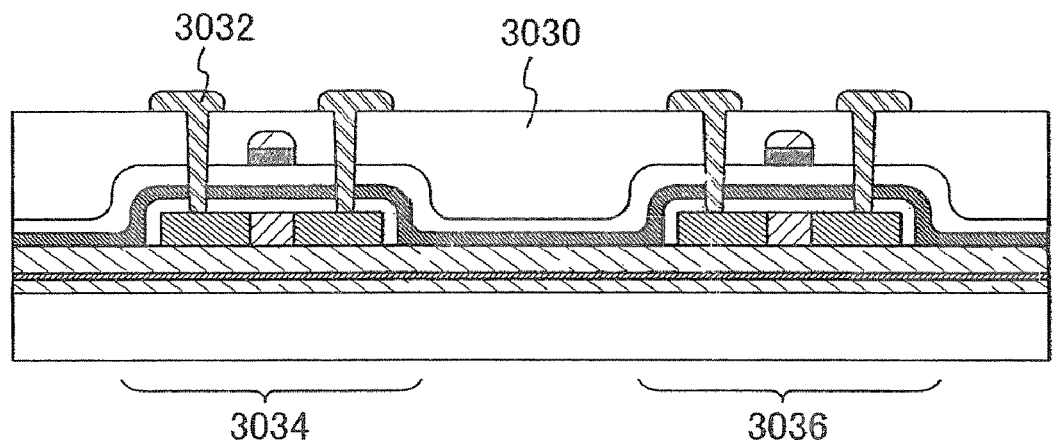
FIGS. 32A and 32B are explanatory view of a method for manufacturing a thin film integrated circuit manufactured using the invention.

A conductive film 3032 is formed over the insulating film 3030 so as to be connected electrically with the source or drain region of the first semiconductor film 3012, whereby a p-type thin film transistor 3034 using the first semiconductor film 3012 as a channel-forming region and an n-type thin film transistor 3036 using the second semiconductor film 3014 as a channel-forming region are provided (FIG. 32A). Although this embodiment shows an example of manufacturing a top-gate (staggered) TFT, the present invention is also applicable in the case of manufacturing a bottom-gate (reversely-staggered) TFT or the like.

Figure 35A:
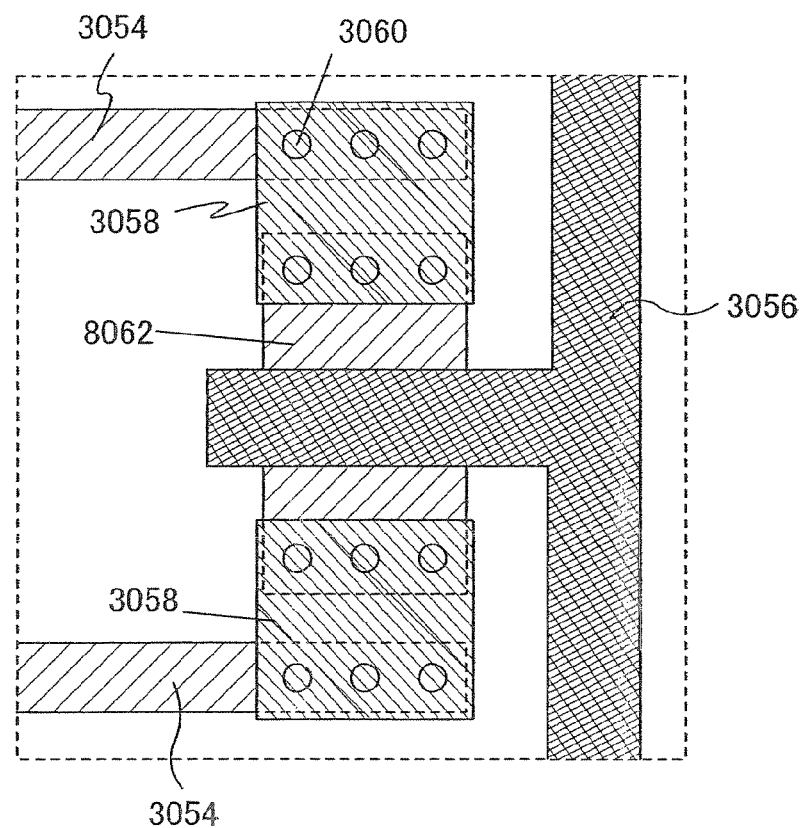
FIGS. 35A and 35B are explanatory view of a method for manufacturing a thin film integrated circuit manufactured using the invention.
Figure 35B:
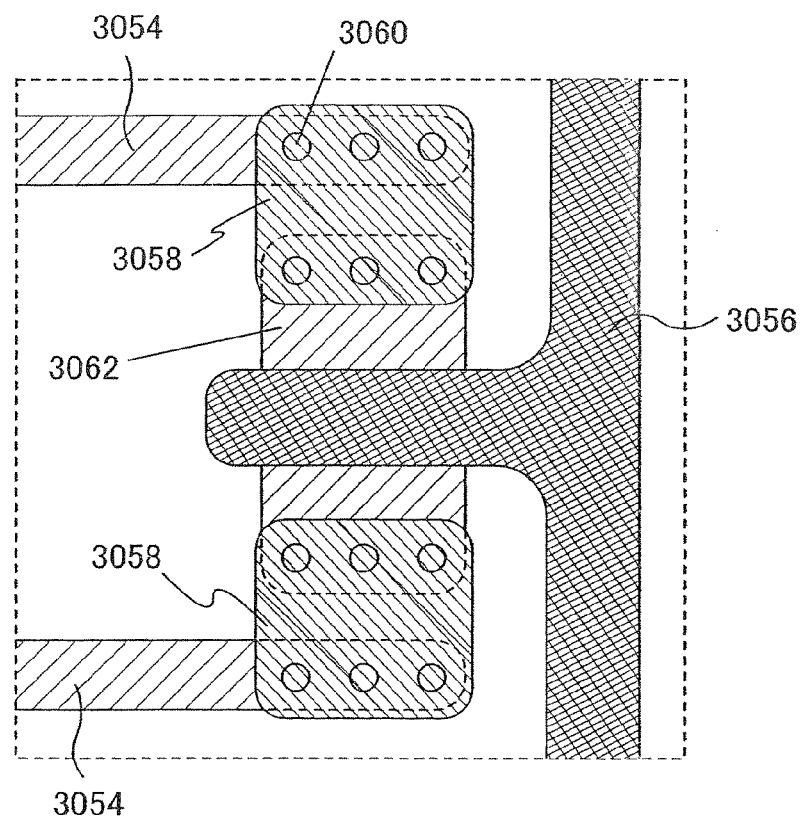

Here, it is preferable that the first semiconductor film 3012, the second semiconductor film 3014, and the conductive film 3032 (that is, a wiring) formed at the same time as these semiconductor films have round edge portions when viewed from above the substrate 3000. FIGS. 35A and 35B schematically show the state where the edges of the wiring and the like are rounded.

FIG. 35A shows a conventional forming method by which a first wiring 3054, a second wiring 3056, a third wiring 3058, and a contact hole 3060 are formed. In order to form the edge portions of these wirings, a method of forming a film which is to be a material of the wiring and forming the film into a desired pattern by etching treatment. However, it is not easy to form a minute and complicated wiring having accuracy by the micrometer or less. In the case of forming such a minute wiring, the distance between the wirings is extremely short; therefore, the generation of dust in an edge portion of the wiring tends to cause a defect.

FIG. 19B shows a state that the edges of the first wiring 3054, the second wiring 3056, the third wiring 3058, and a semiconductor film 3062 are formed to be rounded and a contact hole 3060 is formed. When the edge portions are rounded as shown in FIG. 35B, it is possible to suppress that the dust generated at the formation of the wiring is left at the edge portions of the wiring. Therefore, the defect of semiconductor devices due to the dust can be decreased, thereby increasing the yield.

Figure 32B:
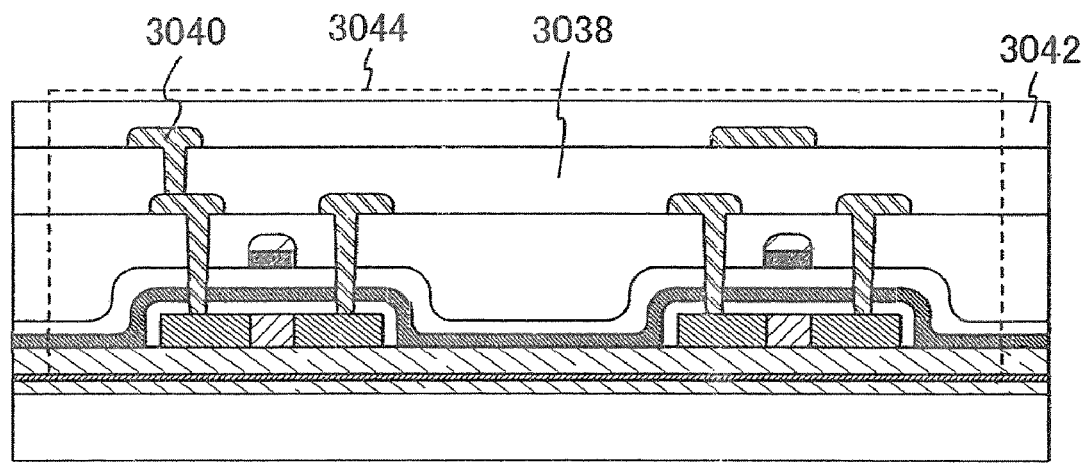

Next, an insulating film 3038 is formed so as to cover the conductive film 3032, and a conductive film 3040 serving as an antenna is fainted over this insulating film 3038, and further, an insulating film 3042 is formed to cover the conductive film 3040 (FIG. 32B). It is to be noted that the conductive film 3030 and the like (a region surrounded by a dotted line) provided above the thin film transistors 3034 and 3036 are generically referred to as an element group 3044.

Each of the insulating films 3030, 3038, and 3042 may have either a single-layer or multilayer structure and may use either the same material or different materials. As the material, (1) an insulating film containing oxygen or nitrogen such as silicon oxide (SiOx), silicon nitride (SiNx), a silicon oxide film containing nitrogen, or a silicon nitride film containing oxygen; (2) a film containing carbon such as DLC (diamond-like carbon); (3) an organic material such as epoxy, polyimide, polyamide, polyvinylphenol, benzocyclobutene, or acrylic or a siloxane-based material; or the like can be used.

Since the materials given in the above (3) can be formed by a spin-coating method, a droplet discharge method, a printing method, or the like, the planarization can be conducted effectively and the process time can be shortened. Moreover, the insulating films 3030, 3038, and 3042 can be oxidized or nitrided by plasma treatment.

The conductive film 3040 can be fainted from a conductive material containing one or a plurality of elements selected from copper (Cu), aluminum (Al), silver (Ag), gold (Au), chromium (Cr), molybdenum (Mo), titanium (Ti), tantalum (Ta), tungsten (W), nickel (Ni), carbon (C), or a metal compound containing the above metal element.

Next, an opening portion 3046 is formed in a region other than the element group 3044 by a laser irradiation method or the like so as to expose the peeling layer 3004. Etchant is introduced from this opening portion 3046 to remove the peeling layer 3004 (FIG. 33A). The peeling layer 3004 may be removed completely or may be partially left. When the peeling layer 3004 is left, the thin film transistors 3034 and 3036 can be held over the substrate 3000 even after removing the peeling layer 3004 by the etchant, and moreover, the transistors can be treated easily in a later step. The etchant is, for example, gas or liquid which contains halogen or halogen fluoride such as chlorine trifluoride. For example, $CF_4$, $SF_6$, $NF_3$, $F_2$, or the like can be used.

Next, a first sheet material 3048 having adhesiveness is adhered to the insulating film 3042, thereby peeling the element group 3044 from the substrate 3000 (FIG. 33B).

The purpose of adhering the first sheet material 3048 is to hold the mechanical strength of the element group 3044 to be peeled in a later step. For this reason, the thickness of the first sheet material 3048 is preferably 50 μm or more. A flexible film having a sticking agent at least on one surface thereof can be used for the first sheet material 3048. As an example of the first sheet material 3048, a material having polyester as a base and having a sticking agent on an adhesive surface can be used. The sticking agent may be, for example, a resin material containing an acrylic resin or the like or a material containing a synthetic rubber material.

Next, the element group 3044 which is peeled is sealed with a flexible film. Here, the element group 3044 is pasted to a second sheet material 3050 and the element group 3044 is sealed by further using a third sheet material 3052 (FIGS. 34A and 34B).

The second sheet material 3050 and the third sheet material 3052 can be a flexible film, such as a film of polypropylene, polyester, vinyl, polyvinyl fluoride, or vinyl chloride, paper, a multilayer film of a base film (polyester, polyamide, an inorganic deposition film, paper, or the like) and an adhesive synthetic resin film (an acrylic-based synthetic resin, an epoxy-based synthetic resin, or the like) or the like. Heat treatment and pressurizing treatment are conducted to an object to be treated by thermocompressing the object to be treated. At the heat treatment and pressurizing treatment, an adhesive layer provided on an outermost surface of the film or a layer provided on the outermost surface (not the adhesive layer) are melted by heat treatment and adhered by pressurization. In the case of sealing the device formation layer with the first sheet material 3048 and the second sheet material 3050, the first sheet material 3048 may also be formed with the same material.

According to the above steps, a semiconductor device which has a storage element and which can exchange data in a non-contact way can be obtained. The semiconductor device shown in this embodiment has flexibility. When the element group 3044 is pasted to a flexible substrate, a semiconductor device is provided which is thin, lightweight, and difficult to be damaged even when the device is dropped. Moreover, when an inexpensive flexible substrate is used, a semiconductor device can be provided at low cost. Furthermore, the device can be pasted even to an object having a curved surface or a deformed shape. By reusing the substrate 3000, a semiconductor device can be manufactured at low cost.

Although a peeling layer is peeled by a chemical method in this embodiment, there is another method for peeling a substrate and a thin film integrated element. For example, the following method can be used: laser is emitted from a rear face of the first substrate, namely from a side where a thin film integrated element is not formed, by using poly-silicon for the peeling layer, whereby the first substrate is separated by releasing hydrogen included in the poly-silicon and generating an air gap. Further, a method for peeling separately using a physical means can be used.

In addition, a method for thinning the substrate 3000 by polishing by a CMP method or the like with an insulating film 3042 side fixed at a stage of completing the element group 3044 can be used. By using this method, a substrate to be adhered after peeling is not required, and peeling and adhering can be omitted. As a result, a semiconductor element which is formed is not bended in a peeling step. Therefore, damage that the semiconductor element is received can be prevented.

This embodiment can be appropriately combined with another embodiment.

Embodiment 8

A result of detecting the boundary between a large grain size region and a poorly crystalline region actually by using the present invention is explained.

In the same manner as in another embodiment, as a sample used in this embodiment, a base film and a semiconductor film are formed over a glass substrate and laser irradiation is conducted. White light is emitted from a glass substrate side of this sample, and the image of light transmitted to the semiconductor film is confirmed with a transmission microscope to take photo with a CCD camera.

FIG. 36A is an image at this time, and image processing is not conducted. FIG. 36B is a gray-scale image of FIG. 36A. The term "gray-scale" indicates a processing for expressing an image by only contrast from white to black without color information of the image. In the case of FIG. 36A to which image processing is not conducted and FIG. 36B which is only converted to gray tone, it is confirmed that the boundary between the large grain size region and the poorly crystalline region is difficult to be recognized.

FIG. 36C is an image that sobel processing is conducted to the image of FIG. 36A in a longitudinal direction. FIG. 36D is an image that the image of FIG. 36A is averaged (integrated), median processing is conducted, then sobel processing is conducted in a perpendicular direction, and then binarizing is conducted.

The term "sobel" indicates a processing for enhancing an edge with less contrast. The term "averaging (integrating) processing" indicates a processing for averaging (integrating) concentration values of pixels (generally nine pixels) including a center pixel and the periphery of the center pixel. By conducting the averaging processing, influence of noise components can be reduced; therefore, the measurement of the position of an edge or the like can be stabilized. The term "median processing" indicates a processing for detecting the concentration values of nine pixels including a center pixel and the periphery of the center pixel, whereby the median of the detected concentration values is set to be a concentration value of the center pixel. This processing has a feature that noise components can be removed without blurring an image. The term "binarizing processing" indicates a processing for obtaining the brightness of respective pixel, thereby outputting white in the case where the brightness is higher than a predetermined value (threshold value) and outputting black in the case where the brightness is lower than a predetermined value (threshold value).

By conducting sobel processing as in FIG. 36C, the boundary between a poorly crystalline region and a large grain size region can be enhanced. Although this state is sufficient, detection accuracy of an edge can be more improved by conducting further processing for enhancing a boundary portion and removing noise derived from the grain boundary of a crystal grain which is formed in a region irradiated with a laser beam. As shown in FIG. 36D, by conducting averaging processing or median processing, only boundary between a poorly crystalline region and a large gain size region can be enhanced and unnecessary information such as crystal grain boundary can be removed.

As described above, a poorly crystalline region and a large grain size region can be distinguished from each other easily by conducting image processing to an obtained light.

Embodiment 9

In this embodiment, a light source which is used in the case of detecting a large grain size region and a poorly crystalline region and a lightning method are explained.

To accomplish stable image processing, it is required to obtain an image with high contrast which is most suitable for the content of inspection. Therefore, it is important to select a light source of light which is to be emitted to an object to be irradiated. Although a blue light is used in Embodiment Mode and laser is used in Embodiment 1, an 1 FD (light emitting diode) can be given as one example of the other light source which can be used for the present invention. The advantages of using an LED are described hereinafter.

First, the lifetime of an LED is said to be approximately thirty thousand hours, which is extremely longer than the lifetime of other devices such as a fluorescent light or a halogen lamp. In addition, the lifetime of an LED depends on light emitting time; therefore, the lifetime can be further extended by controlling lighting time. Hence, costs or time generated by exchanging a light source or the like can be drastically reduced. Second, deterioration due to repetition of lighting and lighting out like a fluorescent light or a halogen lamp is not occurred in an LED. Third, the device itself of an LED is extremely smaller than a fluorescent light or a halogen lamp; therefore, various lighting methods or lighting areas can be accomplished by changing a mounting method. Fourth, the device itself of an LED is a light emitting element; therefore, light emitting mechanism or a lighting circuit is not required, an LED is superior in impact resistance, and the number of failure and breakdown is extremely small. Fifth, an LED is a device which changes electricity to light directly; therefore, an LED has more favorable energy efficiency than other device.

Figure 4:
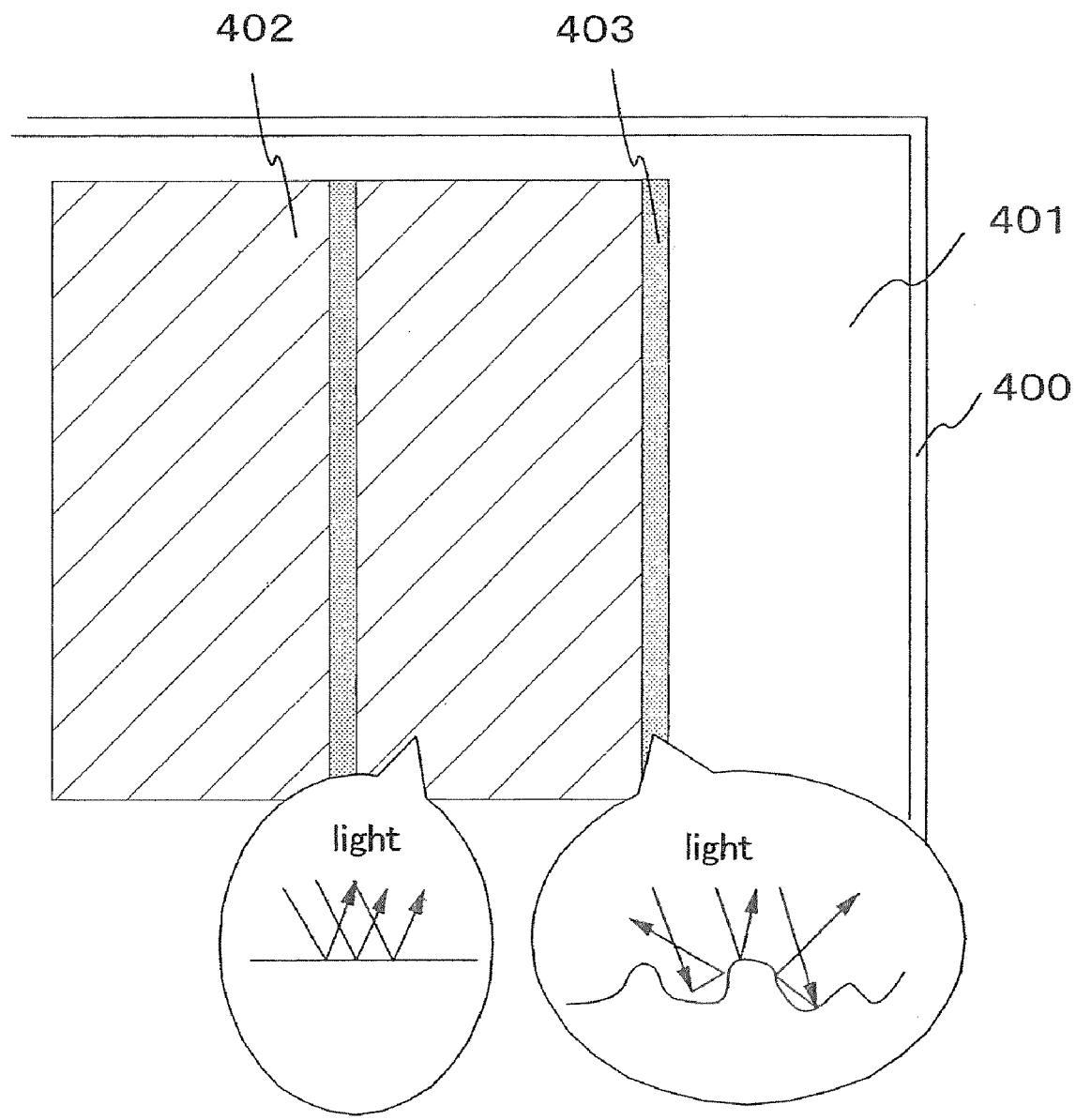
FIG. 4 is an explanatory view of scattering and reflection of light in a large grain size region and a poorly crystalline region.

As for a semiconductor film after laser beam irradiation, a surface state is different depending on crystal condition of the semiconductor film as shown in FIG. 4. When lighting is conducted, a specular component is strengthened in a portion without a depression/projection, namely a large grain size region, and alternatively, a diffuse reflection component is strengthened in a portion with a depression/projection, namely poorly crystalline region. By utilizing the difference of a surface state, a large grain size region and a poorly crystalline region can be distinguished more easily and precisely.

Figure 37A:
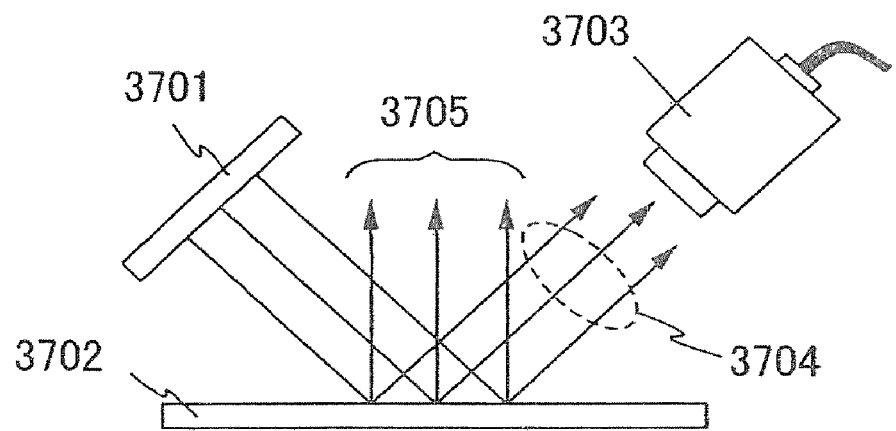
FIGS. 37A and 37B are explanatory views of an example of a method for illuminating a semiconductor film.
Figure 37B:
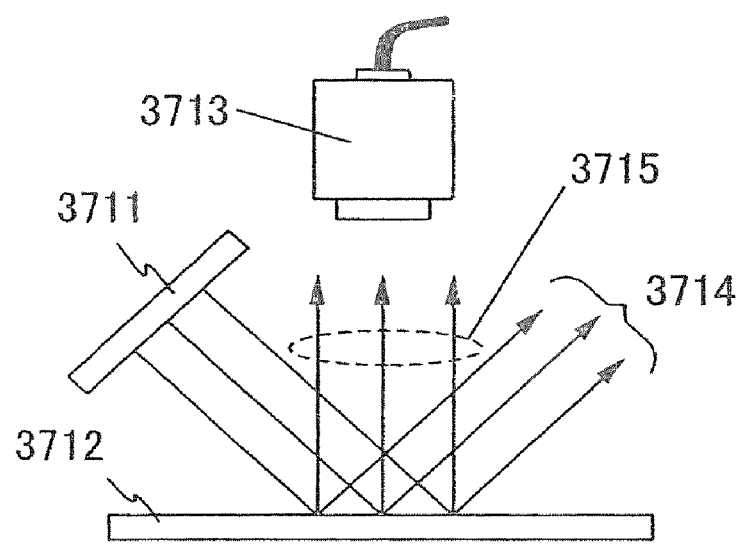

FIGS. 37A and 37B show one example of a lighting example using an LED. In FIGS. 37A and 37B, light with the same brightness is emitted at the same angle to a semiconductor film to which laser beam irradiation is conducted. In FIG. 37A, light is emitted from an area light 3701 that an LED is arranged in a planar shape to a semiconductor film 3702. At this time, light from the area light 3701 is set so that a photo detector 3703 is not directly received. In addition, the photo detector 3703 is arranged so that only a specular reflection light 3704 by the semiconductor film 3702 is received and a diffuse reflection light 3705 is not received among light reflected by the semiconductor film 3702. Thereafter, the specular reflection light 3704 is measured. By using this method, light reflected by a large grain size region with less depression/projection is much received; therefore, an image in which a portion of the large grain size region is bright and a portion of the poorly crystalline region is dark can be obtained.

in FIG. 37B, light is emitted from an area light 3711 that an LED is arranged in a planar shape to a semiconductor film 3712 in the same manner as in FIG. 37A. A photo detector 3713 is arranged so that so that only a diffuse reflection light 3715 by the semiconductor film 3712 is received and a specular reflection light 3714 is not received among light reflected by the semiconductor film 3702, then the diffuse reflection light 3715 is measured. By using this method, light reflected by a poorly crystalline region with more depression/projection is much received; therefore, an image in which a portion of the poorly crystalline region is bright and a portion of the large grain size region is dark can be obtained. By this lighting method, a reflected light of a portion with a depression/projection; therefore, gloss in the surface hardly has an impact on the method.

By conducting image processing given in Embodiment 8 to an image obtained by using these methods, the boundary between a large grain size region and a poorly crystalline region can be detected more precisely.

Here, an example which is more specific is shown hereinafter.

Figure 38A:
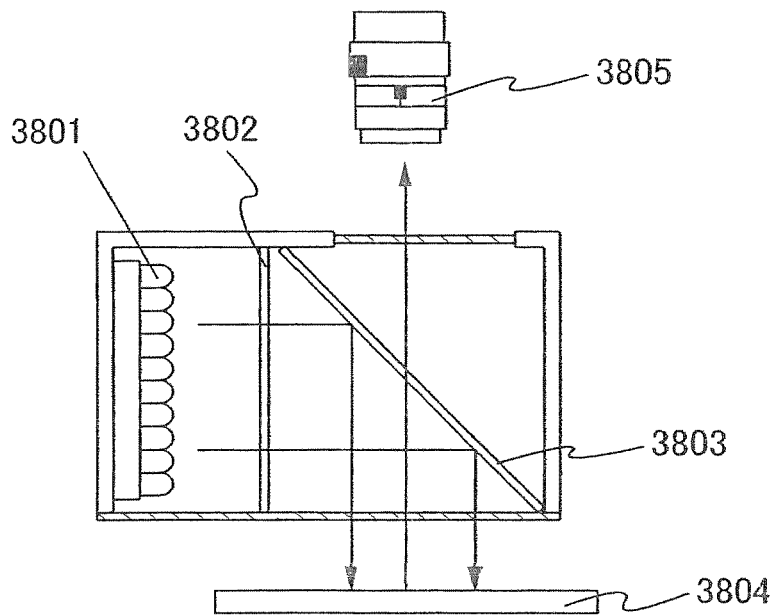
FIGS. 38A to 38C are explanatory views of an example of a method for illuminating a semiconductor film.

FIG. 38A is an example of receiving specular reflection light. Light emitted from an area light 3801 that an LED is arranged in a planar shape passes through a diffuser 3802 such as a fly eye lens to be uniform light. Light reflected by a portion of a large grain size region with a plain surface enters into the same axis with respect to a camera 3805. On the other hand, light reflected by a poorly crystalline region with a depression/projection surface is diffused; therefore, the light does not reach to the camera 3805. Hence, the poorly crystalline region can be extracted darkly and an image with high contrast can be obtained. By conducting further image processing to this image, the large grain size region and the poorly crystalline region can be detected more precisely.

Further, an example of receiving a diffuse reflection light is explained. In a lighting device 1810 shown in FIG. 18B, LEDs 1811 are arranged with high density, and accordingly, lighting from 360-degree can be conducted. By using such a lighting device, uniform light without shade can be emitted to a semiconductor film.

A large grain size region and a poorly crystalline region are detected by using this lighting device. In FIG. 38C, the same reference numeral as in FIG. 38B denotes the same part. Light emitted from an LED 3811 in a lighting device 3810 is emitted uniformly to a semiconductor film 3812. This light is reflected by the semiconductor film 3812. Among the reflected light, light diffused by a poorly crystalline region is detected by a photo detector 3813. The photo detector 3813 is gradually and comparatively moved from one edge of the semiconductor film 3812 in a direction perpendicular to a scanning direction of a beam spot to a direction 3814 perpendicular to the scanning direction of the beam spot. Then, light reflected by the semiconductor film 3812 is received by the photo detector 3813, and then data of received light is outputted to an information processor 3815 such as a computer. In the information processor 3815, mapping of data of the received light is conducted.

Next, image processing is conducted by the information processor 3815 so that a large grain size region and a poorly crystalline region can be distinguished to each other. Although a large grain size region and a poorly crystalline region can be distinguished to each other only by using an LED as a light source, a large grain size region and a poorly crystalline region can be distinguished to each other more precisely by conducting image processing shown in Embodiment 8.

This embodiment can be freely combined with embodiment mode and another embodiment.

Embodiment 10

Various electronic devices can be completed by using a TFT manufactured by using the present invention. A specific example will be explained.

Variation in characteristics among TFTs can be reduced by using the invention since a circuit pattern can be formed only on a large grain size region in a laser irradiation region. Further, a process can be simplified and a manufacturing cost can be lowered since an alignment which determines a light-exposure position of a light source for light-exposure is not required. Therefore, an electronic device with favorable quality and without variation in performance can be manufactured at low cost by using a TFT manufactured by using the invention.

Figure 21A:
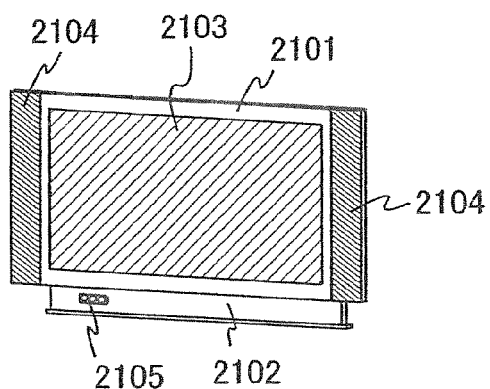
FIGS. 21A to 21F are explanatory views showing an outline of a display device manufactured by using the invention.

FIG. 21A shows a display device which includes a chassis 2101, a support 2102, a display portion 2103, a speaker portion 2104, a video input terminal 2105, and the like. This display device is manufactured by using a TFT formed by a manufacturing method shown in another embodiment mode for a driving IC, the display portion 2103, or the like. A display device indicates a liquid crystal display device, a light emitting display device, and the like, and specifically, includes all kinds of display devices for displaying information, for example, a display device for a computer, for a television receiving, or for an advertisement display.

Figure 21B:
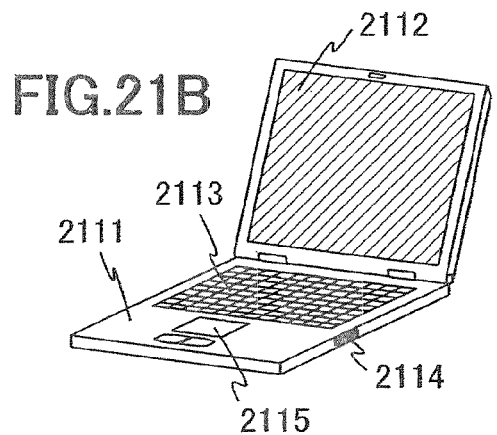

FIG. 21B shows a computer which includes a chassis 2111, a display portion 2112, a keyboard 2113, an external connection port 2114, a pointing mouse 2115, and the like. A TFT formed by using the invention can be applied to not only a pixel portion of the display portion 2112 but also a semiconductor device such as a driving IC for display, a CPU inside a main body, a memory, or the like.

Figure 21C:
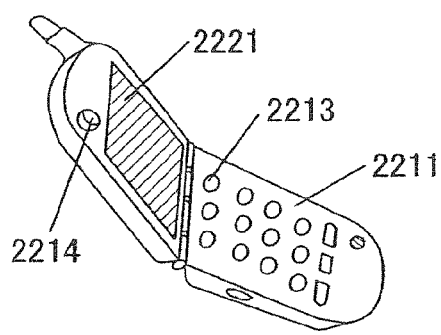

FIG. 21C shows a mobile phone which is one of the representative examples of a mobile terminal. The mobile phone includes a chassis 2121, a display portion 2122, an operation key 2123, and the like. A TFT formed by using the invention can be applied to not only a pixel portion of the display portion 2112 or a sensor portion 2124 but also a driving IC for display, a memory, a speech processing circuit, and the like. The sensor portion 2124 has an optical sensor element, and power consumption of the mobile phone can be lowered by controlling the brightness of the display portion 2122 corresponding to the illumination intensity obtained by the sensor portion 2124 and suppressing the lighting control of the operation keys 2123 corresponding to the illumination intensity obtained by the sensor portion 2124.

Semiconductor materials formed by using the invention can be used for electronic devices such as PDA (Personal Digital Assistants), digital cameras, small gaming machines, and the like as well as the mobile phone. For example, the semiconductor materials can be used for forming functional circuits such as CPUs, memories, and sensors, or can be applied to pixel portions of these electronic devices or driving ICs for display.

Figure 21D:
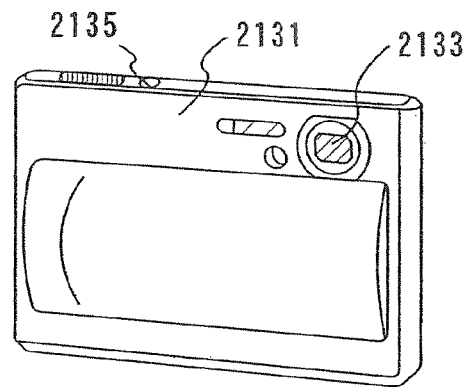
Figure 21E:
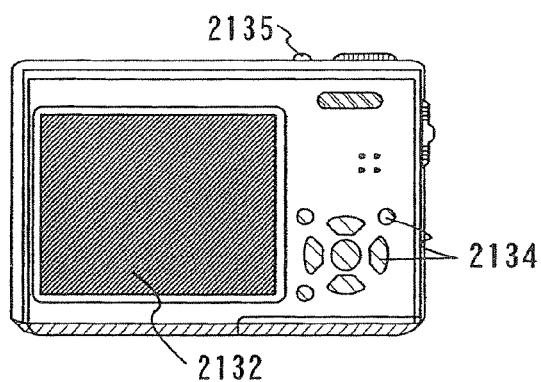

FIGS. 21D and 21E show a digital camera and FIG. 21E shows a view of a reverse side of FIG. 21D. The digital camera includes a chassis 2131, a display portion 2132, a lens 2133, an operation key 2134, a shutter 2135, and the like. A TFT formed by using the invention can be used for a pixel portion of the display portion 2132, a driving IC for driving the display portion 2132, a memory, or the like.

Figure 21F:
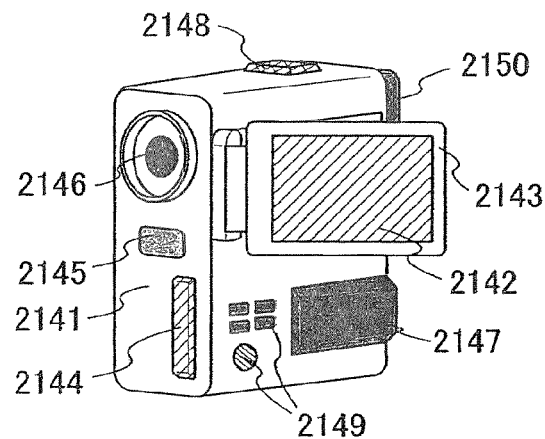

FIG. 21F shows a digital video camera. The digital video camera includes a main body 2141, a display portion 2142, a chassis 2143, an external connection port 2144, a remote control receive section 2145, an image receiving portion 2146, a battery 2147, an audio input portion 2148, an operation key 2149, an eye piece portion 2150, and the like. A TFT formed by using the invention can be used for a digital input process device, a memory, a pixel portion of the display portion 2242, a driving IC for controlling the display portion 2242, or the like.

A TFT manufactured by the present invention can be used for a thin film integrated circuit or a contactless thin film integrated circuit device (also referred to as a wireless IC tag or an RFID (Radio Frequency Identification)). By employing the manufacturing method shown in another Embodiment, the thin film integrated circuit and the contactless thin film integrated circuit can be used as a tag or a memory.

Figure 22A:
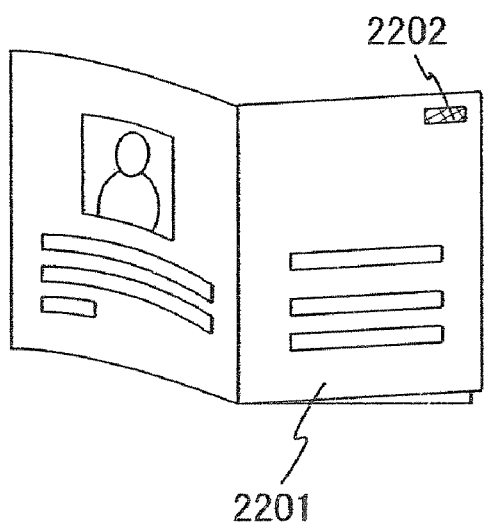
FIGS. 22A and 22B are explanatory views showing an outline of a display device manufactured by using the invention.

FIG. 22A shows a passport 2201 with a wireless IC tag 2202 attached thereto. Alternatively, the wireless IC tag 2202 may be embedded in the passport 2201. Similarly, the wireless IC tag can be attached or embedded in a driver's license, a credit card, a banknote, a coin, a certificate, a merchandise coupon, a ticket, a traveler's check (T/C), a health insurance card, a resident card, a family register, and the like. In this case, only the information saying this is the real one is inputted in the wireless IC tag and an access authority is set so that the information cannot be read and written illegally. This can be achieved by using the TFT formed by using the invention. By using the tag in this way, it is possible to distinguish the forged one and the real one.

Figure 22B:
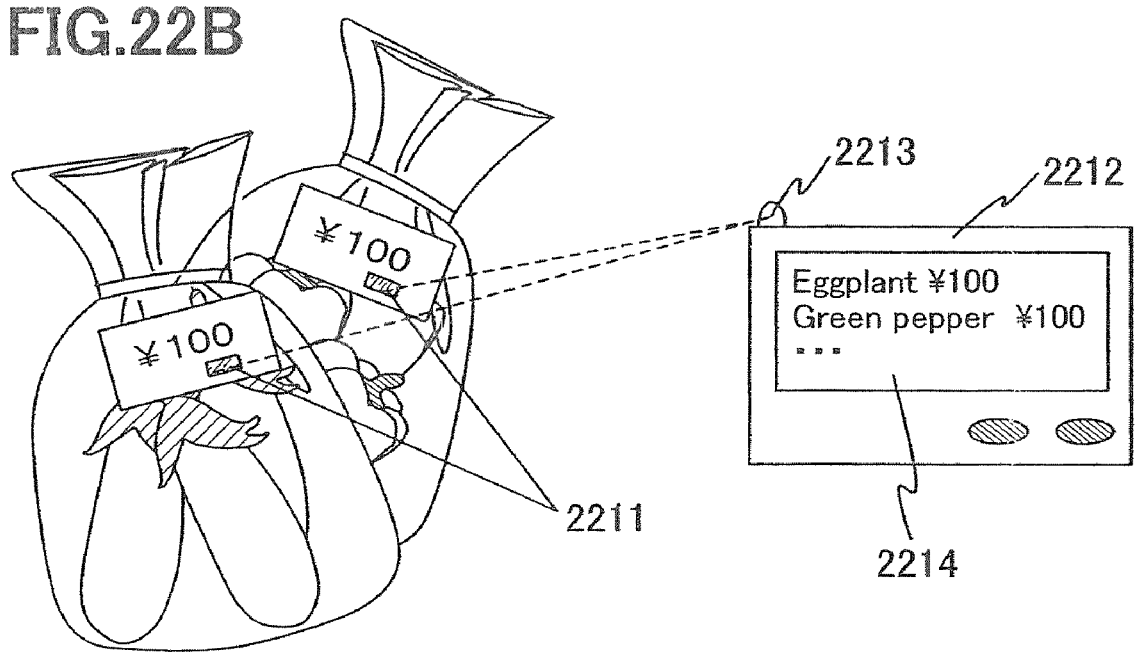

Besides, the wireless IC tag can be used as a memory. FIG. 22B shows an example of using a wireless IC tag 2211 for a label to be attached to a package of vegetables. Alternatively, the wireless IC tag may be attached directly to the package or embedded in the package. In the wireless IC tag 2211, a production area, a producer, a manufacturing date, and a process at a production stage such as a process method, a distribution process of the product, a price, quantity, an intended purpose, a shape, weight, an expiration date, each kind of authentication information, and the like can be recorded. Information from the wireless IC tag 2211 is received by an antenna portion 2213 of a wireless reader 2212 and read out, and displayed in a display portion 2214 of the reader 2212. Thus, wholesalers, retailers, and consumers can know the information easily. Moreover, access authority can be set for each of producers, traders, and consumers. Those who do not have the access authority cannot read, write, rewrite, and erase the data in the wireless IC tag.

The wireless IC tag can be used in the following way. At the settlement, the information that the settlement has been made is written in the wireless IC tag, and the wireless IC tag is checked by a checking means provided at an exit whether or not the information that the settlement has been made is written in the wireless IC tag. If the IC tag is brought out from the store without making the settlement, the alarm rings. With this method, forgetting of the settlement and shoplifting can be prevented.

In consideration of protecting customer's privacy, the following method is also possible. At the settlement at a cash register, any of the followings is conducted; (1) data inputted in the wireless IC tag is locked by pin numbers or the like, (2) data itself inputted in the wireless IC tag are encrypted, (3) data inputted in the wireless IC tag is erased, and (4) data inputted in the wireless IC tag are destroyed. This can be achieved by using the memory shown in another Embodiment. Then, a checking means is provided at an exit, and whether any one of (1) to (4) has been conducted or whether the data in the wireless IC tag are not processed is checked so that whether the settlement has been made or not is checked. In this way, whether the settlement has been made or not can be checked in the store, and reading out the information in the wireless IC tag against the owner's will outside the store can be prevented.

Several methods are given to destroy data inputted in the wireless IC tag in (4). For example, (a) only data are destroyed by writing one or both of "0 (off)" and "1 (on)" in at least a part of electronic data in the wireless IC tag, and (b) current is flowed excessively in the wireless IC tag to physically destroy a part of a wiring in a semiconductor element in the wireless IC tag.

Since manufacturing cost of these wireless IC tags mentioned above is higher than that of conventionally used barcodes, the cost reduction is necessary. According to the invention, a process can be simplified and a manufacturing cost can be lowered since a marker which determines a light-exposure position of a light source for light-exposure is not required. Further, any wireless IC tag with favorable quality and without variation in performance can be manufactured since light-exposure can be conducted without fail to a large grain size region in a laser irradiation region.

As thus described, the semiconductor device manufactured by the invention can be applied to a wide range, and the semiconductor device manufactured by the invention can be applied to electronic appliances of every field.

This embodiment can be combined with an embodiment mode and another embodiment.

This application is based on Japanese Patent Application serial No. 2004-375080 field in Japan Patent Office on Dec. 24, 2004, the contents of which are hereby incorporated by reference.

What is claimed is:

1. A light-exposure apparatus comprising:
a first light source for emitting a light to an irradiated surface having a plurality of regions which are different in scattering intensities of the light;
a sensor for receiving the light reflected on the irradiated surface;
means for obtaining scattering intensities with the reflected light and detecting the plurality of regions from the scattering intensities; and
a second light source for conducting photolithography including a light-exposure in accordance with a position of an arbitrary region among the plurality of regions.

2. A light-exposure apparatus comprising:
a first light source for emitting a light to an irradiated surface having a plurality of regions which are different in scattering intensities of the light;
a sensor for receiving a light reflected on the irradiated surface;
means for detecting the plurality of regions with the reflected light; and
a second light source for conducting photolithography including a light-exposure in accordance with a position of an arbitrary region among the plurality of regions.

3. A light-exposure apparatus comprising:
a first light source for emitting a light to an irradiated surface;
a sensor for receiving the light reflected on the irradiated surface;
an information processor for detecting the irradiated surface with a contrast of scattering intensities of the reflected light; and
a second light source for conducting photolithography including a light-exposure on a part of the irradiated surface.

4. A light-exposure apparatus according to any one of claims 1 to 3,
wherein the light is a blue light or a light having a wavelength which is shorter than a wavelength of the blue light.

5. A light-exposure apparatus according to any one of claims 1 to 3,
wherein the light is a blue light, a laser having a shorter wavelength than the blue light, or a light emitted from a light emitting diode.

6. A light-exposure apparatus according to any one of claims 1 to 3,
wherein the first light source, the sensor, and the second light source are moved as one unit.

7. A light-exposure apparatus according to any one of claims 1 to 3,
wherein the sensor includes any of photo detectors of a CCD, a photodiode, a phototransistor, a photo IC, a photomultiplier, or a CMOS sensor.

8. A light-exposure apparatus according to any one of claims 1 to 3,
wherein the sensor includes a plurality of photo detectors arranged in a plain shape.

9. A light-exposure apparatus according to any one of claims 1 to 3,
wherein the first light source has means for emitting light in a predetermined period, and
wherein the sensor has means for detecting the reflected light which is synchronized with the predetermined period.

10. A light-exposure apparatus according to any one of claims 1 to 3,
wherein means for conducting binarization, means for conducting detection of edge with concentration difference, means for conducting sobel processing, means for conducting averaging processing, or means for conducting median processing to data of the reflected light is included.

* * * * *

UNITED STATES PATENT AND TRADEMARK OFFICE
CERTIFICATE OF CORRECTION

PATENT NO.         : 8,398,725 B2
APPLICATION NO.    : 12/757063
DATED              : March 19, 2013
INVENTOR(S)        : Koichiro Tanaka et al.

It is certified that error appears in the above-identified patent and that said Letters Patent is hereby corrected as shown below:

In the Specification

Column 11, line 16, "mount" should be -- amount --;

Column 12, line 42, "p-channel" should be -- p-channel TFT --;

Column 12, line 51, "tuned" should be -- formed --;

Column 13, line 25, "0.01 to 45" should be -- 0.01 to 4.5 --;

Column 13, line 33, "1064 mu" should be -- 1064 nm --;

Column 14, line 29, "farmed" should be -- formed --;

Column 16, line 7, "Mts." should be -- TFTs. --;

Column 16, line 30, "fixated" should be -- formed --;

Column 16, line 44, "TH." should be -- TFT. --;

Column 17, line 39, "sip al" should be -- signal --;

Column 18, line 10, "fowled" should be -- formed --;

Column 19, line 11, "fowled" should be -- formed --;

Column 21, line 17, "fanned" should be -- formed --;

Column 21, line 32, "fanned" should be -- formed --;

Column 22, line 37, "knitted" should be -- formed --;

Column 23, line 14, "n-channel Pl." should be -- n-channel TFT. --;

Column 24, line 24, "fanned" should be -- formed --;

Column 27, line 2, "When this is" should be -- When this TFT is --;

Column 27, line 23, "air, hi" should be -- air. In --;

Column 28, line 64, "Ruined." should be -- formed. --;

Column 29, line 28, "fanned" should be -- formed --;

Column 30, line 9, "foaming" should be -- forming --;

Signed and Sealed this
Third Day of December, 2013

Margaret A. Focarino
*Commissioner for Patents of the United States Patent and Trademark Office*

CERTIFICATE OF CORRECTION (continued)
U.S. Pat. No. 8,398,725 B2

Figure 38B:
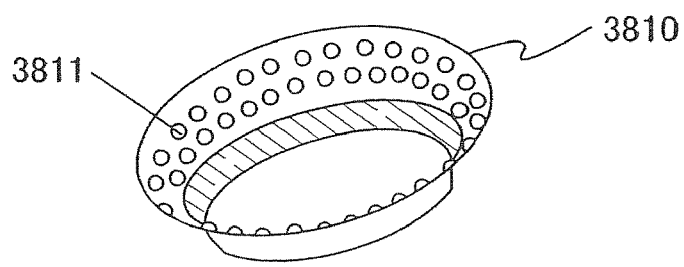
Figure 38C:
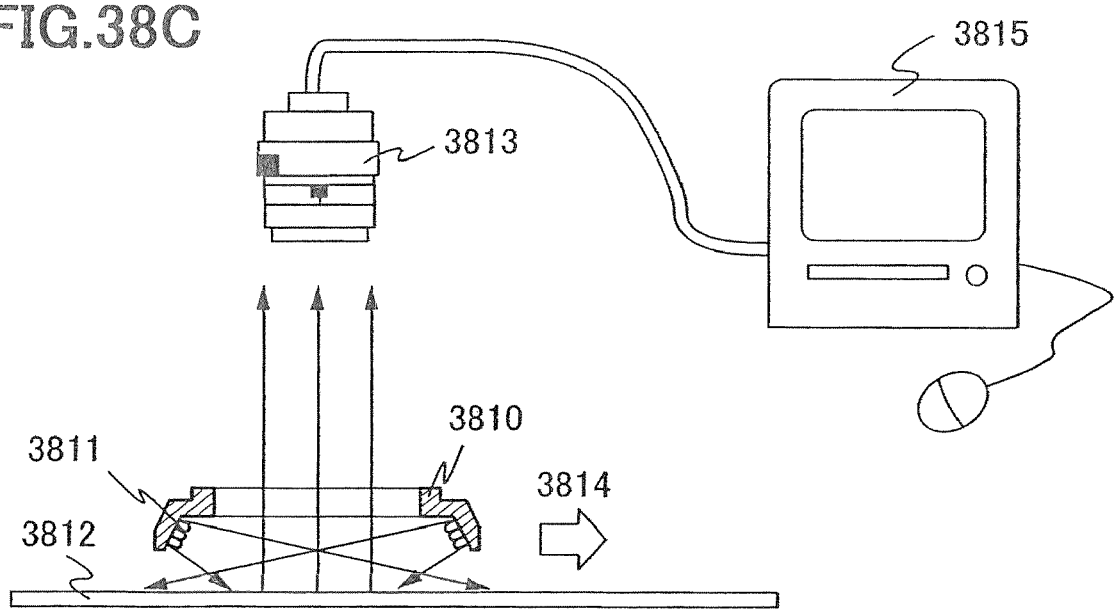

Column 32, line 18, "framing" should be -- forming --;

Column 33, line 36, "fowled" should be -- formed --;

Column 35, lines 58-59, "substraft," should be -- substrate, --;

Column 35, line 67, "fowled" should be -- formed --;

Column 36, line 40, "fanned" should be -- formed --;

Column 37, line 8, "fowled" should be -- formed --;

Column 37, line 52, "Tin," should be -- Tm, --;

Column 38, line 66, "fanned" should be -- formed --;

Column 40, line 33, "fainted" should be -- formed --;

Column 40, line 55, "fainted" should be -- formed --;

Column 43, line 1, "gain" should be -- grain --;

Column 43, line 18, "1 FD" should be -- LED --;

Column 44, line 4, "in" should be -- In --;

Column 44, line 40, "1810" should be -- 3810 --;

Column 44, line 40, "FIG. 18B," should be -- FIG. 38B, --;

Column 44, line 41, "LEDs 1811" should be -- LEDs 3811 --.